US006534898B1

(12) United States Patent
Takeuchi et al.

(10) Patent No.: US 6,534,898 B1
(45) Date of Patent: Mar. 18, 2003

(54) PIEZOELECTRIC/ELECTROSTRICTIVE DEVICE HAVING MUTUALLY OPPOSING THIN PLATE SECTION

(75) Inventors: Yukihisa Takeuchi, Nishikano-gun; Tsutomu Nanataki, Toyoake; Koji Ikeda, Kounan; Koji Kimura, Nagoya; Kazuyoshi Shibata, Mizunami, all of (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 09/671,669

(22) Filed: Sep. 27, 2000

Related U.S. Application Data

(63) Continuation of application No. 09/524,042, filed on Mar. 13, 2000.
(60) Provisional application No. 60/210,246, filed on Jun. 8, 2000.

(30) Foreign Application Priority Data

| Oct. 1, 1999 | (JP) | 11-281522 |
| Oct. 28, 1999 | (JP) | 11-307844 |
| Nov. 16, 1999 | (JP) | 11-326195 |
| Dec. 27, 1999 | (JP) | 11-371967 |
| Jan. 21, 2000 | (JP) | 2000-013576 |
| Jan. 24, 2000 | (JP) | 2000-015123 |
| Mar. 1, 2000 | (JP) | 2000-056434 |
| Jun. 6, 2000 | (JP) | 2000-169584 |

(51) Int. Cl.$^7$ ............................................. H01L 41/08
(52) U.S. Cl. ........................ 310/321; 310/328; 310/330; 310/348
(58) Field of Search ............................. 310/328, 330, 310/324, 348, 321

(56) References Cited

U.S. PATENT DOCUMENTS

| 4,612,440 A | 9/1986 | Brunée et al. ............... 250/281 |
| 4,805,057 A | 2/1989 | Ogawa et al. ............... 360/109 |
| 5,166,571 A | * 11/1992 | Konno et al. ............... 310/333 |
| 5,691,594 A | * 11/1997 | Takeuchi et al. ............ 310/330 |
| 5,745,319 A | 4/1998 | Takekado et al. ........ 360/78.05 |
| 5,912,524 A | * 6/1999 | Ohnishi et al. ............. 310/321 |
| 6,018,212 A | * 1/2000 | Kikuchi et al. ............. 310/321 |
| 6,046,531 A | * 4/2000 | Kikuchi et al. ............. 310/367 |
| 6,049,158 A | 4/2000 | Takeuchi et al. |
| 6,109,104 A | 8/2000 | Fukuda et al. ........... 73/504.13 |
| 6,140,739 A | 10/2000 | Arai et al. ................... 310/321 |
| 6,186,003 B1 | * 2/2001 | Kikuchi et al. .......... 73/504.12 |
| 6,246,552 B1 | 6/2001 | Soeno et al. ............. 360/294.4 |

FOREIGN PATENT DOCUMENTS

| EP | 1 017 116 A2 | 7/2000 |
| EP | 1 089 351 A2 | 4/2001 |
| EP | 1 089 352 A2 | 4/2001 |
| EP | 1 089 356 A2 | 4/2001 |
| JP | 63-64640 | 3/1988 |
| JP | 10-136665 | 5/1998 |
| JP | 1 089 358 A2 | 4/2001 |
| WO | 01/26166 A1 | 4/2001 |
| WO | 01/26169 A1 | 4/2001 |

OTHER PUBLICATIONS

Yoshikazu Soeno, et al., "Piezoelectric Piggy–Back Microactuator for Hard Disk Drive," IEEE Transactions on Magnetics, vol. 35, No. 2, Mar. 1999, pp 983–987.
S. Koganezawa, et al., "Dual–Stage Actuator System for Magnetic Disk Drives Using a Shear Mode Piezoelectric Microactuator," IEEE Transactions on Magnetics, vol. 35, No. 2, Mar. 1999, pp 998–992.

* cited by examiner

Primary Examiner—Brian Sircus
Assistant Examiner—Michael C. Zarroli
(74) Attorney, Agent, or Firm—Burr & Brown

(57) ABSTRACT

A piezoelectric/electrostrictive device including a pair of mutually opposing thin plate sections and a fixation section for supporting the thin plate sections. A piezoelectric/electrostrictive element is arranged on each of the pair of thin plate sections. Movable sections, having mutually opposing end surfaces, are formed proximate the ends of the thin plate sections. A distance between the end surfaces is not less than a length of the movable sections.

12 Claims, 41 Drawing Sheets

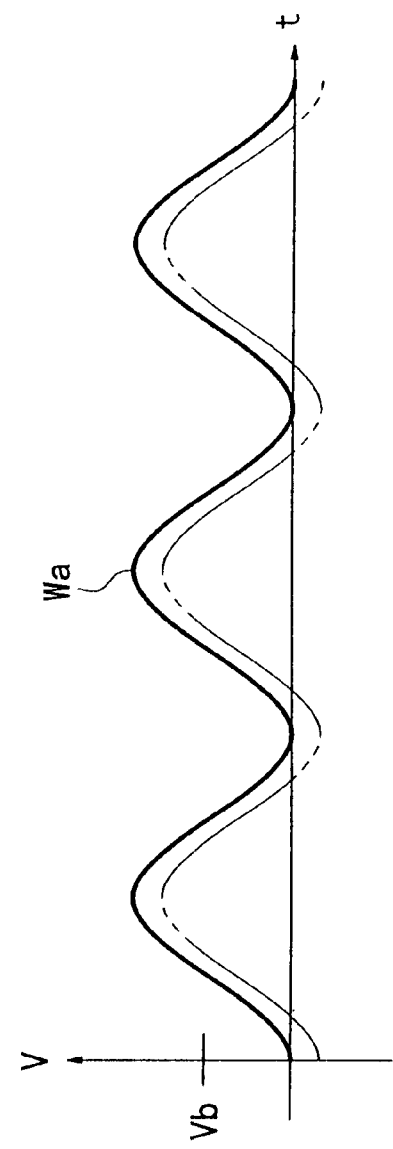
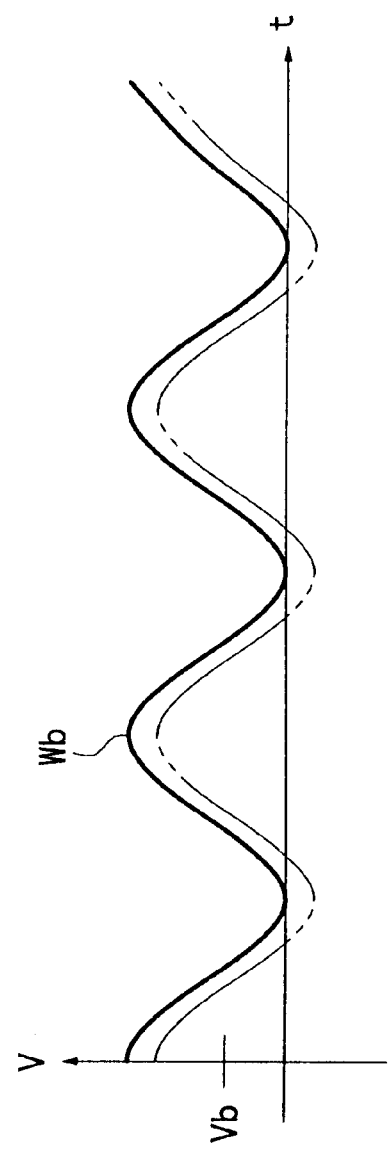
FIG. 9A
FIG. 9B

FIG. 41 - Prior Art
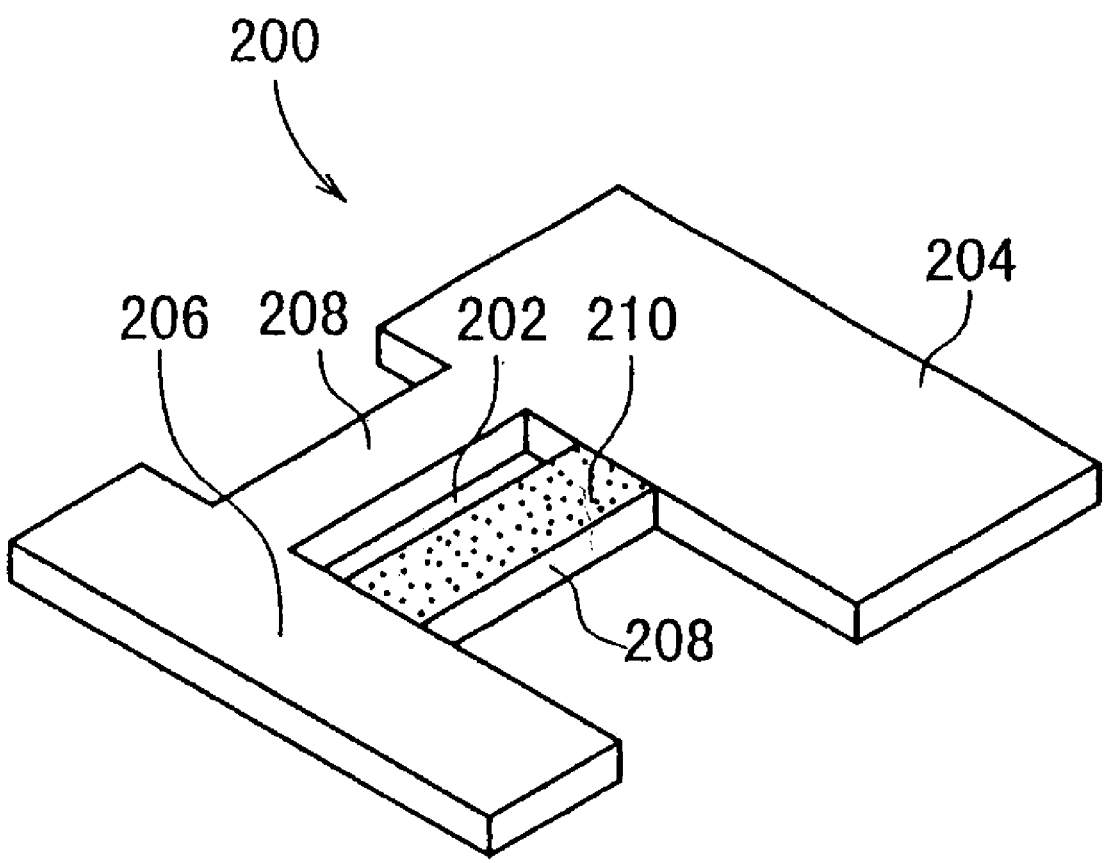

PIEZOELECTRIC/ELECTROSTRICTIVE DEVICE HAVING MUTUALLY OPPOSING THIN PLATE SECTION

CROSS REFERENCE TO RELATED APPLICATIONS

This application is a continuation of Ser. No. 09/524,042 filed Mar. 13, 2000, and claims benefit of provisional application Ser. No. 60/210,246 filed Jun. 8, 2000.

BACKGROUND OF THE INVENTION

1. Field of the Invention

The present invention relates to a piezoelectric/electrostrictive device which is provided with a movable section to be operated on the basis of a displacement action of a piezoelectric/electrostrictive element, or a piezoelectric/electrostrictive device which is capable of detecting displacement of a movable section by the aid of a piezoelectric/electrostrictive element, and a method for producing the same. In particular, the present invention relates to a piezoelectric/electrostrictive device which is excellent in strength, shock resistance, and moisture resistance and which makes it possible to efficiently operate a movable section to a great extent, and a method for producing the same.

2. Description of the Related Art

Recently, a displacement element, which makes it possible to adjust optical path length and position on the order of submicrons, is required, for example, in the fields of optics, magnetic recording, and precision machining. Development is advanced for the displacement element based on the use of the displacement brought about by the inverse piezoelectric effect or the electrostrictive effect caused when a voltage is applied to a piezoelectric/electrostrictive material (for example, a ferroelectric material).

As shown in FIG. 41, for example, those hitherto disclosed as such a displacement element include a piezoelectric actuator comprising a fixation section 204, a movable section 206, and a beam section 208 for supporting them which are formed in an integrated manner with a hole 202 provided through a plate-shaped member 200 composed of a piezoelectric/electrostrictive material and with an electrode layer 210 provided on the beam section 208 (see, for example, Japanese Laid-Open Patent Publication No. 10-136665).

The piezoelectric actuator is operated such that when a voltage is applied to the electrode layer 210, the beam section 208 makes expansion and contraction in a direction along a line obtained by connecting the fixation section 204 and the movable section 206 in accordance with the inverse piezoelectric effect or the electrostrictive effect. Therefore, the movable section 206 can perform circular arc-shaped displacement or rotational displacement in the plane of the plate-shaped member 200.

On the other hand, Japanese Laid-Open Patent Publication No. 63-64640 discloses a technique in relation. to an actuator based on the use of a bimorph. In this technique, electrodes for the bimorph are provided in a divided manner. The actuator is driven due to the selection of the divided electrodes, and thus the highly accurate positioning is performed at a high speed. This patent document (especially in FIG. 4) discloses a structure in which, for example, two bimorphs are used in an opposed manner.

However, the piezoelectric actuator described above involves such a problem that the amount of operation of the movable section 206 is small, because the displacement in the direction of expansion and contraction of the piezoelectric/electrostrictive material (i.e., in the in-plane direction of the plate-shaped member 200) is transmitted to the movable section 206.

All of the parts of the piezoelectric actuator are made of the piezoelectric/electrostrictive material which is a fragile material having a relatively heavy weight. Therefore, the following problems arise. That is, the mechanical strength is low, and the piezoelectric actuator is inferior in handling performance, shock resistance, and moisture resistance. Further, the piezoelectric actuator itself is heavy, and its operation tends to be affected by harmful vibrations (for example, residual vibration and noise vibration during high speed operation).

In order to solve the problems described above, it has been suggested that the hole 202 is filled with a filler material having flexibility. However, it is clear that the amount of displacement, which is brought about by the inverse piezoelectric effect or the electrostrictive effect, is decreased even when the filler material is used.

Further, the actuator described in Japanese Laid-Open Patent Publication No. 63-64640 has such a structure that the bimorph itself is composed of two piezoelectric elements which are laminated with each other, and the bimorph is stuck to a fixation member or a mediating member. Therefore, the stress tends to remain, resulting from, for example, the curing and the shrinkage of an adhesive and the heating treatment required for the sticking and the lamination. It is feared that the displacement action is disturbed by the internal residual stress, and it is impossible to realize the displacement and the resonance frequency as designed. Especially, when the actuator is small in size, the influence of the adhesive is increased.

Accordingly, a method is conceived in order to exclude the influence of the adhesive required to effect the sticking, in which the actuator is composed of, for example, an integrated sintered product made of ceramics to give a structure in which no adhesive is used. However, also in this case, it is inevitably feared that the internal residual stress arises due to the difference in behavior of thermal shrinkage between respective members during the sintering.

Further, when the actuator is small, a problem is involved such that the fixation property of the actuator and the attachment property of the actuator to another part are deficient.

SUMMARY OF THE INVENTION

The present invention has been made taking the foregoing problems into consideration, an object of which is to provide a piezoelectric/electrostrictive device and a method for producing the same which make it possible to obtain a displacement element that is scarcely affected by harmful vibration and capable of high speed response with high mechanical strength while being excellent in handling performance, shock resistance, and moisture resistance. This makes it possible to realize a light weight of the device, especially light weight in a movable section or a fixation section, and improve the handling performance of the device and the attachment performance for parts to be attached to the movable section or the fixation performance of the device, so that the movable section may be greatly displaced at a relatively low voltage. It is possible to achieve a high speed in the displacement action of the device, especially of the movable section (realization of a high resonance frequency), as well as a sensor element which makes it possible to accurately detect vibration of the movable section.

According to the present invention, there is provided a piezoelectric/electrostrictive device comprising a pair of mutually opposing thin plate sections and a fixation section for supporting the thin plate sections; movable sections provided at forward end portions of the pair of thin plate sections; and one or more piezoelectric/electrostrictive elements arranged on at least one thin plate section of the pair of thin plate sections; wherein any one of the movable sections and the fixation section has mutually opposing end surfaces; and a distance between the end surfaces is not less than a length of the movable section.

The movable section, the fixation section, and the thin plate section may be made of ceramics or metal. Alternatively, each of the components may be made of a ceramic material, or each of them may be made of a metal material. Further, each of the components may be constructed to have a hybrid structure obtained by combining those produced from materials of ceramics and metal.

It is also preferable that any one of the movable section and the fixation section is provided with a cutoff section; and a part of the cutoff section constitutes the mutually opposing end surfaces. It is also preferable that the thin plate section, the movable section, and the fixation section are composed of a ceramic substrate integrated into one unit by co-firing a ceramic green laminate and cutting off unnecessary portions. It is also preferable that the piezoelectric/electrostrictive element has a film-shaped configuration, and it is integrated with the ceramic substrate by means of sintering.

In this arrangement, the piezoelectric/electrostrictive element may have a piezoelectric/electrostrictive layer and a pair of electrodes formed on the piezoelectric/electrostrictive layer. It is also preferable that the piezoelectric/electrostrictive element has a piezoelectric/electrostrictive layer and a pair of electrodes formed on both sides of the piezoelectric/electrostrictive layer, and one electrode of the pair of electrodes is formed on at least the thin plate section. In this arrangement, the vibration caused by the piezoelectric/electrostrictive element can be efficiently transmitted via the thin plate section to the movable section or the fixation section. Thus, it is possible to improve the response performance. Especially, it is preferable that the piezoelectric/electrostrictive element is constructed in a stacked form comprising a plurality of units each including the piezoelectric/electrostrictive layer and the pair of electrodes.

When the arrangement as described above is adopted, the generated force of the piezoelectric/electrostrictive element is increased, and thus it is possible to obtain large displacement. Further, it is possible to obtain a high resonance frequency owing to the increase in rigidity of the device itself, making it easy to achieve the high speed of the displacement action.

It is also preferable that a gap is formed between the mutually opposing end surfaces. It is also preferable that a member which is the same as a constitutive member of any one of the movable section and the fixation section, or a plurality of members which are different therefrom are interposed between the mutually opposing end surfaces, the same member or the different members including, for example, glass, cement, and organic resin, preferably organic resin such as those based on epoxy, acrylic, polyimide, phenol, silicone, terpene, xylene, styrene, melamine, methacrylic, and rubber, or mixture or copolymer thereof. Especially, in view of, for example, the joining performance, the handling performance, and the hardness, it is preferable to allow organic resin or the like based on epoxy, acrylic, and methacrylic to intervene. In order to further enhance the hardness, it is also preferable to mix a filler such as an inorganic material.

Especially, it is possible to effectively realize a light weight of the movable section or the fixation section by forming the gap between the mutually opposing end surfaces, allowing the member lighter than the constitutive member of the movable section or the fixation section to intervene between the mutually opposing end surfaces, or joining the end surfaces with small one of the members described above. Accordingly, it is possible to increase the resonance frequency without decreasing the amount of displacement of the movable section or the fixation section.

When the gap is formed between the mutually opposing end surfaces, a part of the movable section or the fixation section including one end surface and another part of the movable section or the fixation section including the other end surface are more flexible, resulting in strong resistance to the deformation. Therefore, it is possible to obtain excellent handling performance of the piezoelectric/electrostrictive device.

Further, the distance between the end surfaces is not less than the length of the movable section. Therefore, the attachment area can be increased, when another part is attached to the movable section. Thus, it is possible to improve the attachment performance for the part. It is now assumed that the part is secured, for example, with an adhesive or the like. The part can be held by being interposed on the both sides. Thus, it is possible to reliably secure the part.

When the part is held by being interposed on the both sides, the height of the part and the height of the movable section are not simply added. Accordingly, it is possible to maintain the height of the whole including the part to be low. Further, the length of the movable section can be made smaller than the distance on the side of the end surface. Therefore, the physical property of an adhesive or the like for sticking or bonding the part effectively makes the action. Thus, it is possible to increase the displacement.

On the other hand, when the fixation section has the mutually opposing end surfaces, it is possible to strongly fix the piezoelectric/electrostrictive device according to this invention to a predetermined fixation portion. Thus, it is possible to improve the reliability.

As described above, according to the present invention, it is possible to obtain the displacement element which is scarcely affected by harmful vibration and capable of high speed response with high mechanical strength while being excellent in handling performance, shock resistance, and moisture resistance, making it possible to realize a light weight of the device, especially a light weight of the movable section or the fixation section, and improve the handling performance of the device as well as the attachment performance for parts to be attached to the movable section, the miniaturization, and the fixation performance of the device, so that the movable section may be greatly displaced, and it is possible to achieve a high speed of the displacement action of the movable section (realization of a high resonance frequency), as well as the sensor element which makes it possible to accurately detect vibration of the movable section.

In the production of the piezoelectric/electrostrictive device, for example, when the piezoelectric/electrostrictive element is formed on a ceramic laminate (obtained by laminating ceramic green sheets followed by sintering into one unit), for example, by means of the lamination or the integrated sintering based on the use of the film formation method as described later on, the internal residual stress is generated at a portion to be formed into the piezoelectric/electrostrictive element and/or the thin plate section. Especially, when the piezoelectric/electrostrictive element is formed on the ceramic laminate by means of the integrated sintering, the internal residual stress tends to be generated at the portion to be converted into the piezoelectric/electrostrictive element and/or the thin plate section, due to the shrinkage and the difference in coefficient of thermal expansion of the constitutive members caused during the sintering.

If the piezoelectric/electrostrictive device is produced and used starting from this state, the movable section does not exhibit the desired displacement in some cases, even when a predetermined electric field is applied to the piezoelectric/electrostrictive layer for constructing the piezoelectric/electrostrictive element, because of the following reason. That is, the material characteristic of the piezoelectric/electrostrictive layer and the displacement action of the movable section are inhibited by the internal residual stress generated in the piezoelectric/electrostrictive element and/or the thin plate section.

In the present invention, the mutually opposing end surfaces are provided on any one of the movable section and the fixation section. Therefore, the distance between the end surfaces is, for example, shortened by the internal residual stress generated in the piezoelectric/electrostrictive element and/or the thin plate section. That is, the internal residual stress, which has been generated in the piezoelectric/electrostrictive element and/or the thin plate section, is released by the movement of the end surfaces.

Further, in the present invention, the distance between the end surfaces is made to be wide. Therefore, even when the distance between the end surfaces is narrowed due to the internal residual stress, it is possible to give a margin sufficient to attach another part between the end surfaces.

As described above, in the present invention, the displacement action of the movable section is not inhibited by the internal residual stress. It is possible to obtain the displacement action of the movable section as approximately designed and expected. Additionally, the release of the internal residual stress also makes it possible to improve the mechanical strength of the device.

When a hole is formed by both inner walls of the pair of thin plate sections, inner walls of the movable sections, inner walls of the plurality of members, and an inner wall of the fixation section, it is also preferable that the hole is filled with a gel material. In this arrangement, although the displacement action of the movable section is usually restricted due to the presence of the filler material, the invention described above intends to reduce the weight as a result of the formation of the end surfaces on the movable section or the fixation section, and increase the displacement amount of the movable section. Therefore, the restriction of the displacement action of the movable section by the filler material is counteracted, and it is possible to realize the effect owing to the presence of the filler material, i.e., the realization of the high resonance frequency and the maintenance of the rigidity.

According to another aspect of the present invention, there is provided a method for producing a piezoelectric/electrostrictive device comprising a pair of mutually opposing thin plate sections and a fixation section for supporting the thin plate sections; movable sections provided at forward end portions of the pair of thin plate sections; and one or more piezoelectric/electrostrictive elements arranged on at least one thin plate section of the pair of thin plate sections; the method comprising a step of forming the movable sections or the fixation section having mutually opposing end surfaces wherein a distance between the end surfaces is not less than a length of the movable section, by cutting off a predetermined part of any one of a portion to be formed into the movable sections or a portion to be formed into the fixation section after producing at least the piezoelectric/electrostrictive element on the thin plate section.

As a result, there is provided the movable section or the fixation section which has the mutually opposing end surfaces. Accordingly, the internal residual stress, which has been generated in the piezoelectric/electrostrictive element and/or the thin plate section during the production, is released, for example, by shortening the distance between the end surfaces. Therefore, the displacement action of the movable section is not inhibited by the internal residual stress.

The phrase "after producing the piezoelectric/electrostrictive element" referred to herein indicates a state in which at least the piezoelectric/electrostrictive layer is formed. As for the electrode to be formed after the formation of the piezoelectric/electrostrictive layer, the electrode may be formed after performing the cutoff to form the movable section or the fixation section having the mutually opposing end surfaces.

The provision of the movable section or the fixation section having the mutually opposing end surfaces realizes the light weight of the movable section or the fixation section. Therefore, the piezoelectric/electrostrictive device, which makes it possible to increase the resonance frequency, can be efficiently produced with ease without decreasing the amount of displacement of the movable section. Thus, it is possible to realize the mass production of the high performance piezoelectric/electrostrictive device.

Further, the movable section or the fixation section is bent more flexibly, and it is strongly resistant to deformation. Therefore, the piezoelectric/electrostrictive device is excellent in handling performance. Owing to the presence of the mutually opposing end surfaces and the wide distance between the end surfaces, when another part is attached to the movable section, it is possible to provide a large attachment area therefor. Thus, it is possible to improve the attachment performance for the part. When a part is interposed and bonded, it is possible to improve the displacement.

According to still another aspect of the present invention, there is provided a method for producing a piezoelectric/electrostrictive device comprising a pair of mutually opposing thin plate sections and a fixation section for supporting the thin plate sections; movable sections provided at forward end portions of the pair of thin plate sections; and one or more piezoelectric/electrostrictive elements arranged on at least one thin plate section of the pair of thin plate sections; the method comprising a step of producing a ceramic laminate by integrally sintering a ceramic green laminate including at least a ceramic green sheet having a window and ceramic green sheets to be formed into the thin plate sections thereafter to produce the ceramic laminate; a step of forming the piezoelectric/electrostrictive element on an outer surface of a portion of the ceramic laminate to be formed into the thin plate section; and a cutoff step of forming the movable sections or the fixation section having at least mutually opposing end surfaces wherein a distance between the end surfaces is not less than a length of the movable section, by means of at least one time of cutoff treatment for the ceramic laminate formed with the piezoelectric/electrostrictive element.

Accordingly, in the production of the piezoelectric/electrostrictive device, especially when the piezoelectric/electrostrictive element is formed on the ceramic laminate by means of the sintering, the internal residual stress, which is generated in the piezoelectric/electrostrictive element and/or the thin plate section, can be effectively released. Therefore, when the piezoelectric/electrostrictive device is produced by using the ceramic green sheet-laminating method, it is possible to realize the light weight of the device, especially the light weight of the movable section or the fixation section, and improve the handling performance of the device, the attachment performance for parts to be attached to the movable section, and the fixation performance of the device. Thus, it is possible to allow the movable section to make large displacement.

It is also preferable that in the step of producing the ceramic laminate, the ceramic laminate is produced by integrally sintering a ceramic green laminate including a plurality of ceramic green sheets each having a window for forming the movable section or the fixation section having at least the mutually opposing end surfaces, and the ceramic green sheets to be formed into the thin plate sections thereafter to produce the ceramic laminate; and in the cutoff step, the movable section or the fixation section, which has at least the mutually opposing end surfaces and in which the distance between the end surfaces is not less than the length of the movable section, is formed by means of the cutoff treatment for the ceramic laminate formed with the piezoelectric/electrostrictive element.

It is also preferable that in the step of producing the ceramic laminate, the ceramic laminate is produced by integrally sintering a ceramic green laminate including a plurality of ceramic green sheets each having a window for forming a portion to be formed into the movable section or a portion to be formed into the fixation section having at least the mutually opposing end surfaces partially connected to one another, and the ceramic green sheets to be formed into the thin plate sections thereafter to produce the ceramic laminate. In the cutoff step, the portion to be formed into the movable section or the portion to be formed into the fixation section having at least the mutually opposing end surfaces partially connected to one another is formed by means of the cutoff treatment for the ceramic laminate formed with the piezoelectric/electrostrictive element, and the movable section or the fixation section, which has the mutually opposing end surfaces and in which the distance between the end surfaces is not less than the length of the movable section, is formed by cutting off the connecting portion.

It is also preferable that the production method further comprises a step of allowing a plurality of members different from a constitutive member of the movable section or the fixation section to intervene between the mutually opposing end surfaces. In this case, organic resin may be used as at least one member of the plurality of members.

Therefore, the piezoelectric/electrostrictive device and the method for producing the same according to the present invention can make the use of the active device including, for example, various transducers, various actuators, frequency region functional parts (filters), transformers, vibrators, resonators, oscillators, and discriminators for the communication and the power generation, as well as the sensor element for various sensors including, for example, ultrasonic sensors, acceleration sensors, angular velocity sensors, shock sensors, and mass sensors. Especially, the piezoelectric/electrostrictive device and the method for producing the same according to the present invention can be preferably utilized for various actuators to be used for the mechanism for adjusting the displacement and the positioning and for adjusting the angle for various precision parts such as those of optical instruments and precision mechanical equipments.

The above and other objects, features, and advantages of the present invention will become more apparent from the following description when taken in conjunction with the accompanying drawings in which a preferred embodiment of the present invention is shown by way of illustrative example.

BRIEF DESCRIPTION OF THE DRAWINGS

FIG. 9A shows a waveform illustrating a voltage waveform to be applied to the first piezoelectric/electrostrictive element;

FIG. 9B shows a waveform illustrating a voltage waveform to be applied to the second piezoelectric/electrostrictive element;

FIG. 41 shows an arrangement of a piezoelectric/electrostrictive device concerning an illustrative conventional technique.

DESCRIPTION OF THE PREFERRED EMBODIMENTS

Explanation will be made below with reference to FIGS. 1 to 40 for illustrative embodiments of the piezoelectric/electrostrictive device and the production method for the same according to the present invention.

It is noted that the piezoelectric/electrostrictive device resides in a concept which includes the element for mutually converting the electric energy and the mechanical energy by the aid of the piezoelectric/electrostrictive element. Therefore, the piezoelectric/electrostrictive device is most preferably used as the active element such as various actuators and vibrators, especially as the displacement element based on the use of the displacement brought about by the inverse piezoelectric effect and the electrostrictive effect. Additionally, the piezoelectric/electrostrictive device is also preferably used as the passive element such as acceleration sensor elements and shock sensor elements.

Figure 1:
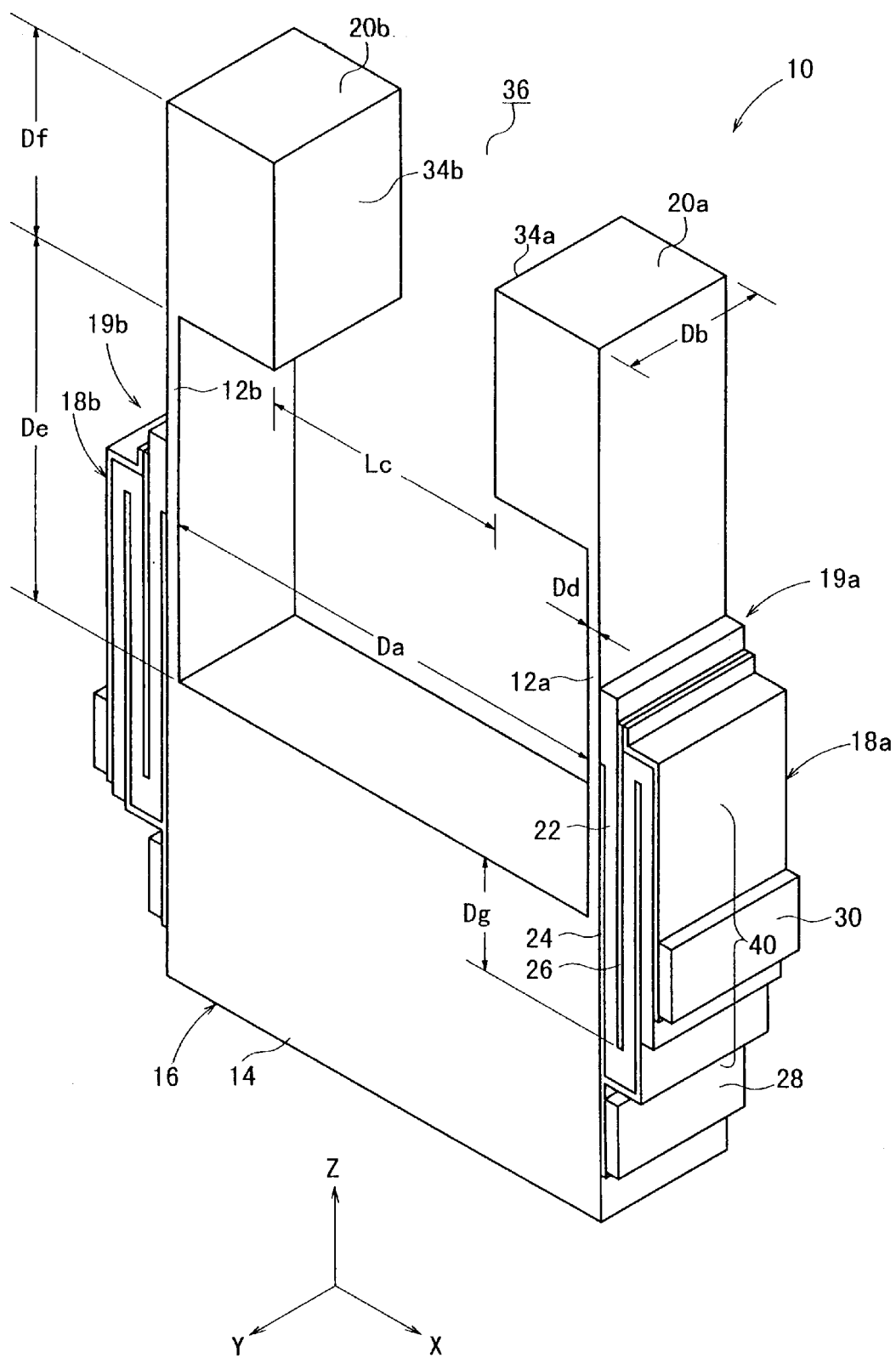
FIG. 1 shows a perspective view illustrating an arrangement of a piezoelectric/electrostrictive device according to an embodiment of the present invention.

As shown in FIG. 1, the piezoelectric/electrostrictive device 10 according to this embodiment is provided with a substrate 16 which comprises, in an integrated manner, a pair of mutually opposing thin plate sections 12a, 12b, and a fixation section 14 for supporting the thin plate sections 12a, 12b. The piezoelectric/electrostrictive device 10 comprises piezoelectric/electrostrictive elements 18a, 18b which are formed at respective parts of the pair of thin plate sections 12a, 12b.

In other words, the piezoelectric/electrostrictive device 10 is constructed such that the pair of thin plate sections 12a, 12b are displaced in accordance with the driving of the piezoelectric/electrostrictive element or elements 18a and/or 18b, or the displacement of the thin plate sections 12a, 12b is detected by the piezoelectric/electrostrictive element or elements 18a and/or 18b. Therefore, in the embodiment shown in FIG. 1, actuator sections 19a, 19b are constructed by the thin plate sections 12a, 12b and the piezoelectric/electrostrictive elements 18a, 18b.

Further, respective forward end portions of the pair of thin plate sections 12a, 12b are thick-walled toward the inside. The thick-walled portions function as movable sections 20a, $20b$ which are displaced in accordance with the displacement action of the thin plate sections $12a$, $12b$. The forward end portions of the pair of thin plate sections $12a$, $12b$ will be hereinafter referred to as "movable sections $20a$, $20b$".

Those usable as the substrate 16 include a structure comprising ceramics or metal as a whole, and a hybrid structure obtained by combining products produced with materials of ceramics and metal.

Those adoptable for the substrate 16 include, for example, a structure in which respective parts are bonded to one another with an adhesive such as organic resin or glass or the like, a ceramic integrated structure which is obtained by sintering and integrating a ceramic green laminate into one unit, and a metal integrated structure integrated, for example, by brazing, soldering, eutectic bonding, or welding into one unit. Preferably, it is desirable to construct the substrate 16 with a ceramic laminate integrated into one unit by sintering a ceramic green laminate.

The time-dependent change of state scarcely occurs in the integrated product of ceramic, because no adhesive exists at joined portions between the respective parts. Therefore, the reliability of the joined portion is high, giving a structure which is advantageous to ensure the rigidity. Additionally, the integrated product of ceramic can be produced with ease by means of the method for laminating ceramic green sheets as described later on.

The piezoelectric/electrostrictive elements $18a$, $18b$ are prepared as separate members as described later on, and the prepared piezoelectric/electrostrictive elements $18a$, $18b$ are stuck to the substrate 16 with an adhesive such as organic resin or glass or by means of, for example, brazing, soldering, or eutectic bonding. Alternatively, the piezoelectric/electrostrictive elements $18a$, $18b$ are directly formed on the substrate 16 by using the film formation method not by using the sticking method described above.

The piezoelectric/electrostrictive element $18a$, $18b$ comprises a piezoelectric/electrostrictive layer 22, and a pair of electrodes 24, 26 which are formed on both sides of the piezoelectric/electrostrictive layer 22. The first electrode 24 of the pair of electrodes 24, 26 is formed at least on the pair of thin plate sections $12a$, $12b$.

In the embodiment of the present invention, explanation will be made principally for a case in which each of the piezoelectric/electrostrictive layer 22 and the pair of electrodes 24, 26 has a multilayered structure, the first electrode 24 and the second electrode 26 are alternately stacked with each other to give a substantially comb-shaped cross section, and thus the piezoelectric/electrostrictive element $18a$, $18b$ is provided, which has a multiple stage structure at a portion at which the first electrodes 24 and the second electrodes 26 are overlapped with each other with the piezoelectric/electrostrictive layer 22 interposed therebetween. However, there is no limitation to the multilayered structure. A single-layered structure may be available. In this embodiment, the number of the multiple layers is not specifically limited. However, it is preferable to use not more than ten layers, and more preferably not more than five layers.

FIG. 1 is illustrative of a case in which the piezoelectric/electrostrictive layer 22 has a three-layered structure, the first electrode 24 is formed to have a comb-shaped configuration to be located at the lower surface of the first layer (side surface of the thin plate section $12a$, $12b$) and at the upper surface of the second layer, and the second electrode 26 is formed to have a comb-shaped configuration to be located at the upper surface of the first layer and at the upper surface of the third layer. In the case of this arrangement, the number of terminals 28, 30 can be decreased by mutually connecting the first electrodes 24 and the second electrodes 26 respectively to be common. Therefore, the increase in size, which would be otherwise caused by the multilayered structure of the piezoelectric/electrostrictive element $18a$, $18b$, can be suppressed.

The voltage is applied to the pair of electrodes 24, 26 via terminals (pads) 28, 30 of the respective electrodes 24, 26 formed on the both side surfaces (element formation surfaces) of the fixation section 14 respectively. The respective terminals 28, 30 are positioned as follows. That is, the terminal 28 corresponding to the first electrode 24 is formed at the position deviated toward the rearward end of the fixation section 14. The terminal 30 corresponding to the second electrode 26 disposed on the side of the external space is formed at the position deviated toward the inner wall of the fixation section 14.

In this embodiment, the piezoelectric/electrostrictive device 10 can be individually fixed by utilizing the surfaces respectively different from the surfaces on which the terminals 28, 30 are arranged. As a result, it is possible to obtain the high reliability for both of the fixation of the piezoelectric/electrostrictive device 10 and the electric connection between the circuit and the terminals 28, 30. In this arrangement, the electric connection between the terminals 28, 30 and the circuit is made, for example, by means of the flexible printed circuit (also referred to as FPC), the flexible flat cable (also referred to as FFC), and the wire bonding.

When the piezoelectric/electrostrictive element $18a$, $18b$ having the multilayered structure is used as described above, then the driving force of the actuator section $19a$, $19b$ is increased, and thus it is possible to contemplate the large displacement. Further, the rigidity of the piezoelectric/electrostrictive device 10 itself is increased, and thus it is possible to realize the high resonance frequency, making it easy to achieve the realization of a high speed of the displacement action.

When the number of stages is increased, it is possible to increase the driving force of the actuator sections $19a$, $19b$. However, the electric power consumption is also increased in accordance therewith. Therefore, when the device is practically produced and used, for example, it is preferable that the number of stages is appropriately determined depending on the way of use and the state of use. In the case of the piezoelectric/electrostrictive device 10 according to this embodiment, even when the driving force of the actuator section $19a$, $19b$ is increased by using the piezoelectric/electrostrictive element $18a$, $18b$, the width of the thin plate section $12a$, $12b$ (distance in the Y axis direction) is basically unchanged. Therefore, the device is extremely preferred to make application, for example, to the actuator for the purpose of the ringing control and the positioning of the magnetic head for the hard disk to be used in an extremely narrow gap.

Figure 2:
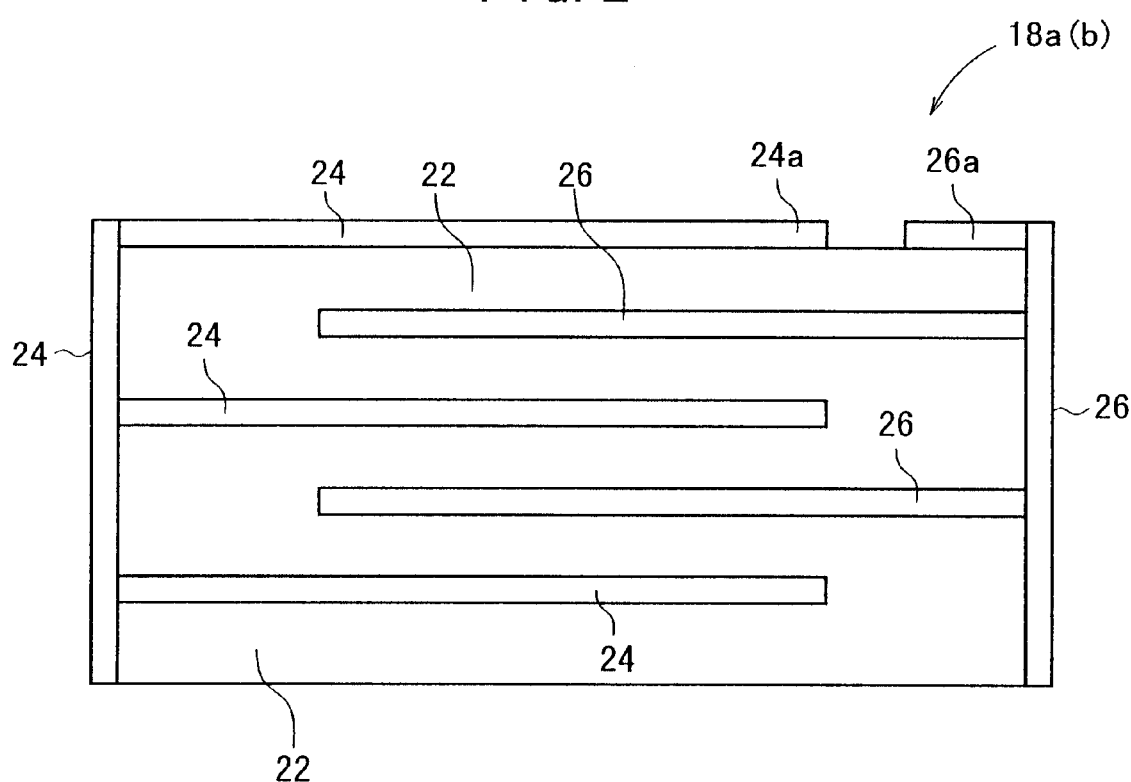
FIG. 2 shows a magnified view illustrating a first modified embodiment of the piezoelectric/electrostrictive element.

Another example of the piezoelectric/electrostrictive element $18a$, $18b$ is preferably shown in FIG. 2. That is, the piezoelectric/electrostrictive layer 22 has a five-layered structure. The first electrode 24 is formed to have a comb-shaped configuration to be located at the upper surface of the first layer, the upper surface of the third layer, and the upper surface of the fifth layer. The second electrode 26 is formed to have a comb-shaped configuration to be located at the upper surface of the second layer and the upper surface of the fourth layer.

Figure 3:
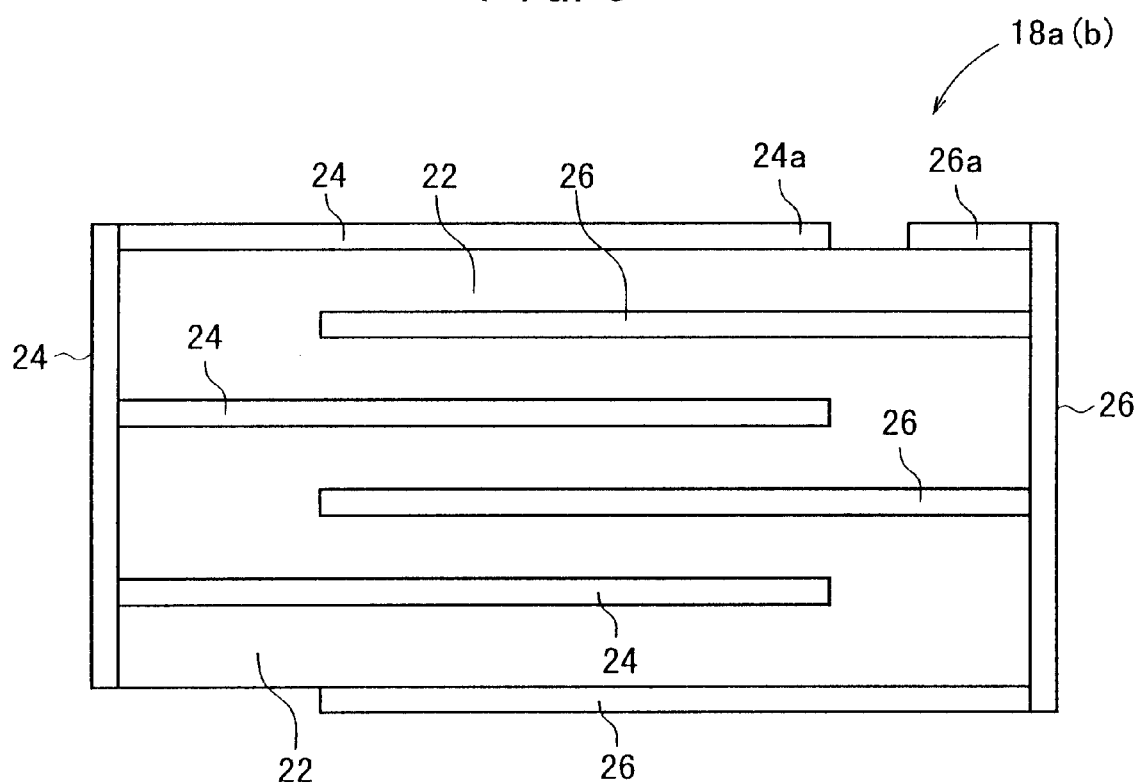
FIG. 3 shows a magnified view illustrating a second modified embodiment of the piezoelectric/electrostrictive element.

Still another example is also available as shown in FIG. 3. That is, the piezoelectric/electrostrictive layer 22 is allowed to have a five-layered structure as well. The first electrode 24 is formed to have a comb-shaped configuration to be located at the upper surface of the first layer, the upper surface of the third layer, and the upper surface of the fifth layer. The second electrode 26 is formed to have a comb-shaped configuration to be located at the lower surface of the first layer, the upper surface of the second layer, and the upper surface of the fourth layer.

The voltage is applied to the pair of electrodes 24, 26 via ends (hereinafter referred to as "terminal sections 24a, 26a) of the respective electrodes 24, 26 formed on the fifth layer of the piezoelectric/electrostrictive layer 22. The respective terminal sections 24a, 26a are formed and separated from each other in such a degree that they can be electrically insulated from each other.

Figure 4:
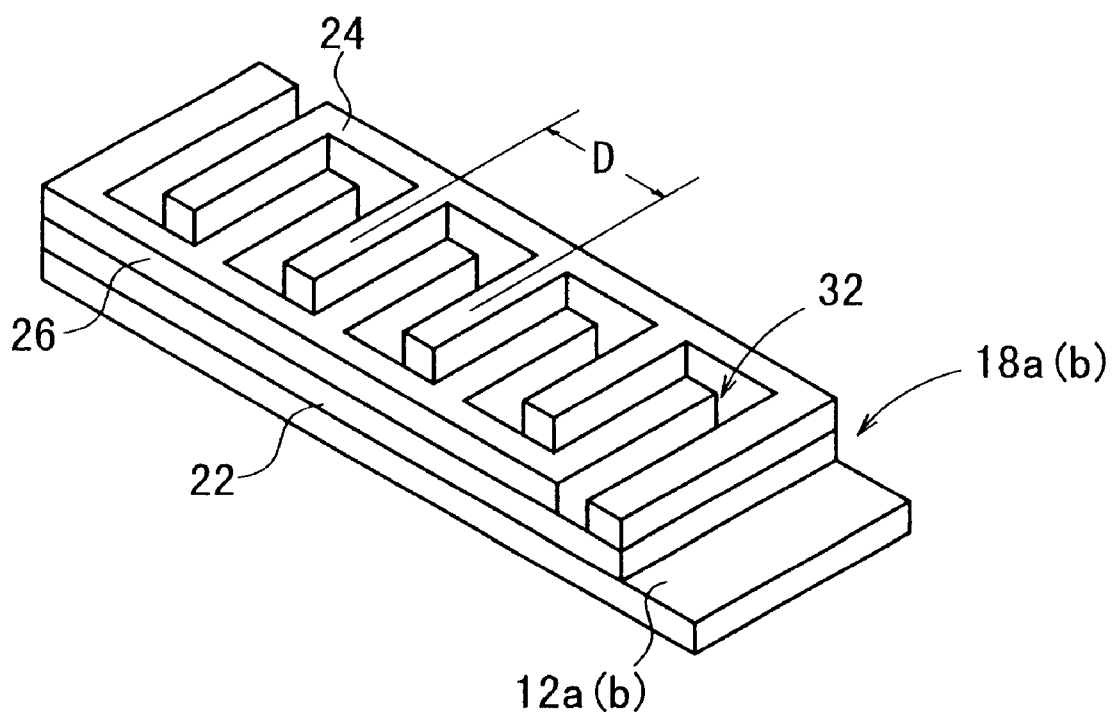
FIG. 4 shows a perspective view illustrating, with partial omission, a third modified embodiment of the piezoelectric/electrostrictive element.

The piezoelectric/electrostrictive element 18a, 18b described above is illustrative of the case of the construction of the so-called sandwich structure in which the piezoelectric/electrostrictive layer 22 is allowed to intervene between the pair of electrodes 24, 26. Alternatively, as shown in FIG. 4, a pair of comb-shaped electrodes 24, 26 may be formed on the first principal surface of the piezoelectric/electrostrictive layer 22 formed on at least the side surface of the thin plate section 12a, 12b. Further alternatively, as shown in FIG. 5, a pair of comb-shaped electrodes 24, 26 are formed and embedded in the piezoelectric/electrostrictive layer 22 formed on at least the side surface of the thin plate section 12a, 12b.

The structure shown in FIG. 4 is advantageous in that it is possible to suppress the electric power consumption to be low. The structure shown in FIG. 5 makes it possible to effectively utilize the inverse piezoelectric effect in the direction of the electric field having large generated force and strain, which is advantageous to cause the large displacement.

Specifically, the piezoelectric/electrostrictive element 18a, 18b shown in FIG. 4 comprises the pair of electrodes 24, 26 having the comb-shaped structure formed on the first principal surface of the piezoelectric/electrostrictive layer 22. In this structure, the first electrode 24 and the second electrode 26 are mutually opposed to one another in an alternate manner with a gap 32 having a constant width interposed therebetween. FIG. 4 is illustrative of the case in which the pair of electrodes 24, 26 are formed on the first principal surface of the piezoelectric/electrostrictive layer 22. Alternatively, the pair of electrodes 24, 26 may be formed between the thin plate section 12a, 12b and the piezoelectric/electrostrictive layer 22. Further alternatively, the pair of comb-shaped electrodes 24, 26 may be formed on the first principal surface of the piezoelectric/electrostrictive layer 22 and between the thin plate section 12a, 12b and the piezoelectric/electrostrictive layer 22 respectively.

Figure 5:
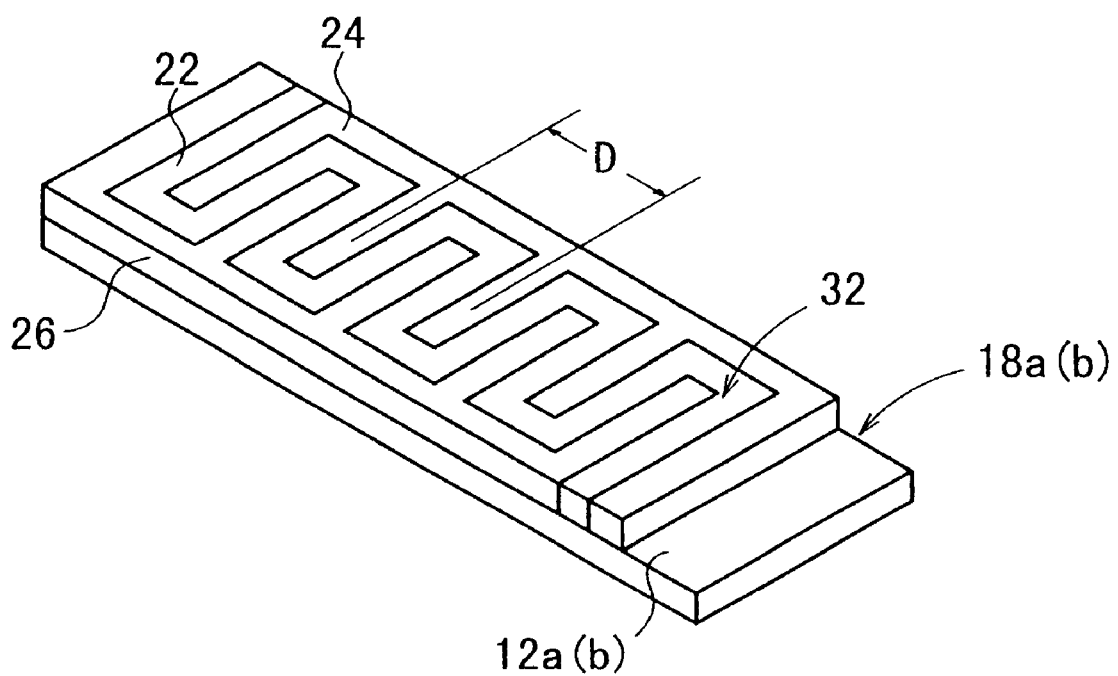
FIG. 5 shows a perspective view illustrating, with partial omission, a fourth modified embodiment of the piezoelectric/electrostrictive element.

On the other hand, in the piezoelectric/electrostrictive element 18a, 18b shown in FIG. 5, the pair of electrodes 24, 26 having the comb-shaped structure are formed so that they are embedded in the piezoelectric/electrostrictive layer 22. In this structure, the first electrode 24 and the second electrode 26 are mutually opposed to one another in an alternate manner with a gap 32 having a constant width interposed therebetween.

The piezoelectric/electrostrictive elements 18a, 18b as shown in FIGS. 4 and 5 can be preferably used for the piezoelectric/electrostrictive device 10 according to the embodiment of the present invention as well. When the pair of comb-shaped electrodes 24, 26 are used as in the piezoelectric/electrostrictive elements 18a, 18b shown in FIGS. 4 and 5, the displacement of the piezoelectric/electrostrictive element 18a, 18b can be increased by decreasing the pitch D of the comb teeth of the respective electrodes 24, 26.

The distance Lc between the mutually opposing end surfaces 34a, 34b of the movable sections 20a, 20b is not less than the length of the movable section 20a, 20b (correctly the length of the movable section 20a, 20b in the Z axis direction) Df. For example, as shown in FIG. 1, a gap (air) 36 may be allowed to intervene between the end surfaces 34a, 34b. Alternatively, as in piezoelectric/electrostrictive devices 10a, 10b according to first and second modified embodiments shown in FIGS. 6 and 7, a plurality of members, which are composed of the same material as that of the constitutive member of the movable section 20a, 20b or which are composed of a material different therefrom, may be allowed to intervene between the end surfaces 34a, 34b. In this arrangement, the mutually opposing end surfaces 34a, 34b of the respective movable sections 20a, 20b function as attachment surfaces 34a, 34b.

Figure 6:
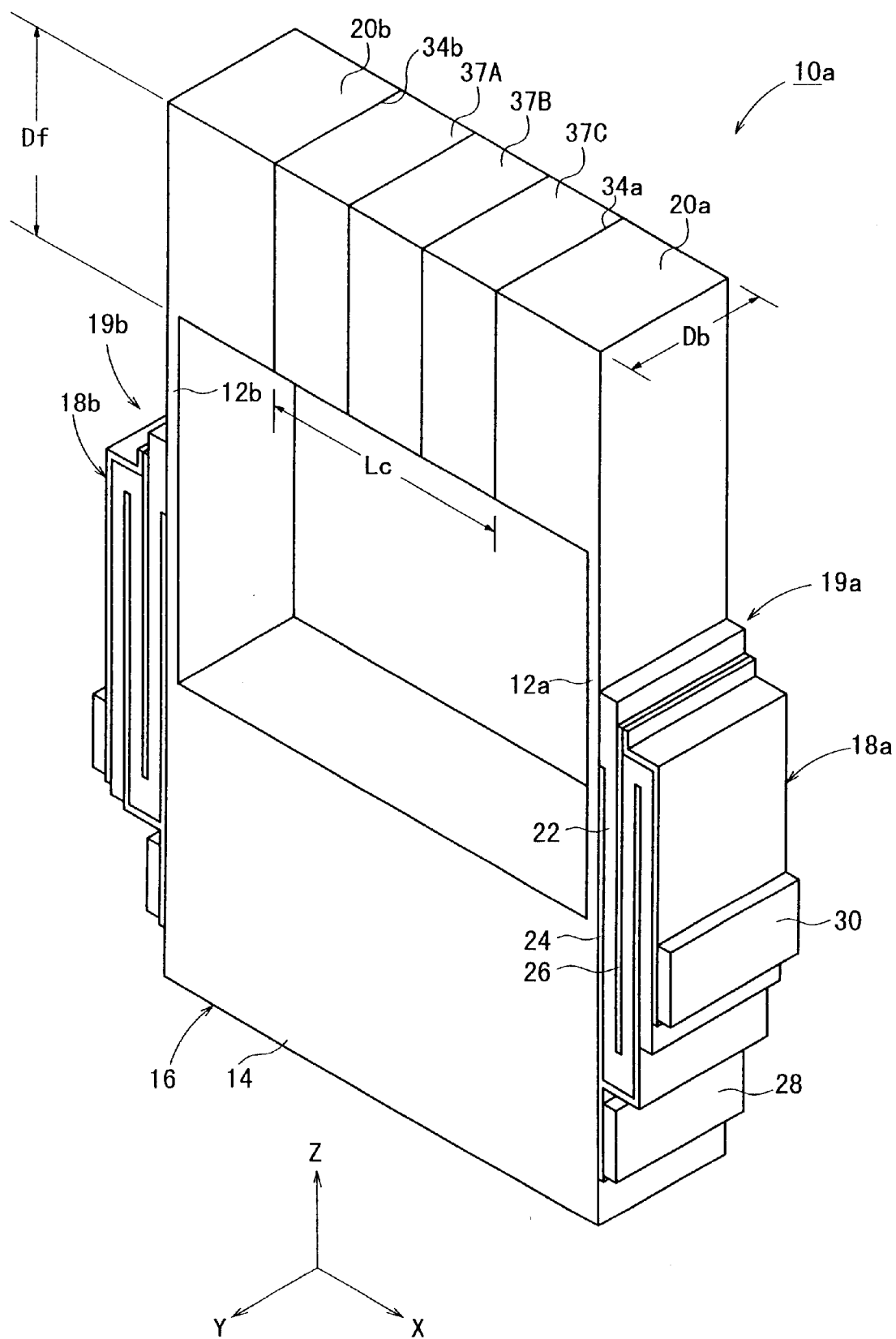
FIG. 6 shows a perspective view illustrating a first modified embodiment of the piezoelectric/electrostrictive device according to the embodiment of the present invention.

The piezoelectric/electrostrictive device 10a according to the first modified embodiment shown in FIG. 6 is illustrative of the following case. That is, the distance Lc between the attachment surfaces 34a, 34b is set to be about 1.5-fold the length Df of the movable section 20a, 20b. Further, three spacer members 37A, 37B, 37C, each of which has a substantially identical thickness, are allowed to intervene between the attachment surfaces 34a, 34b.

Figure 7:
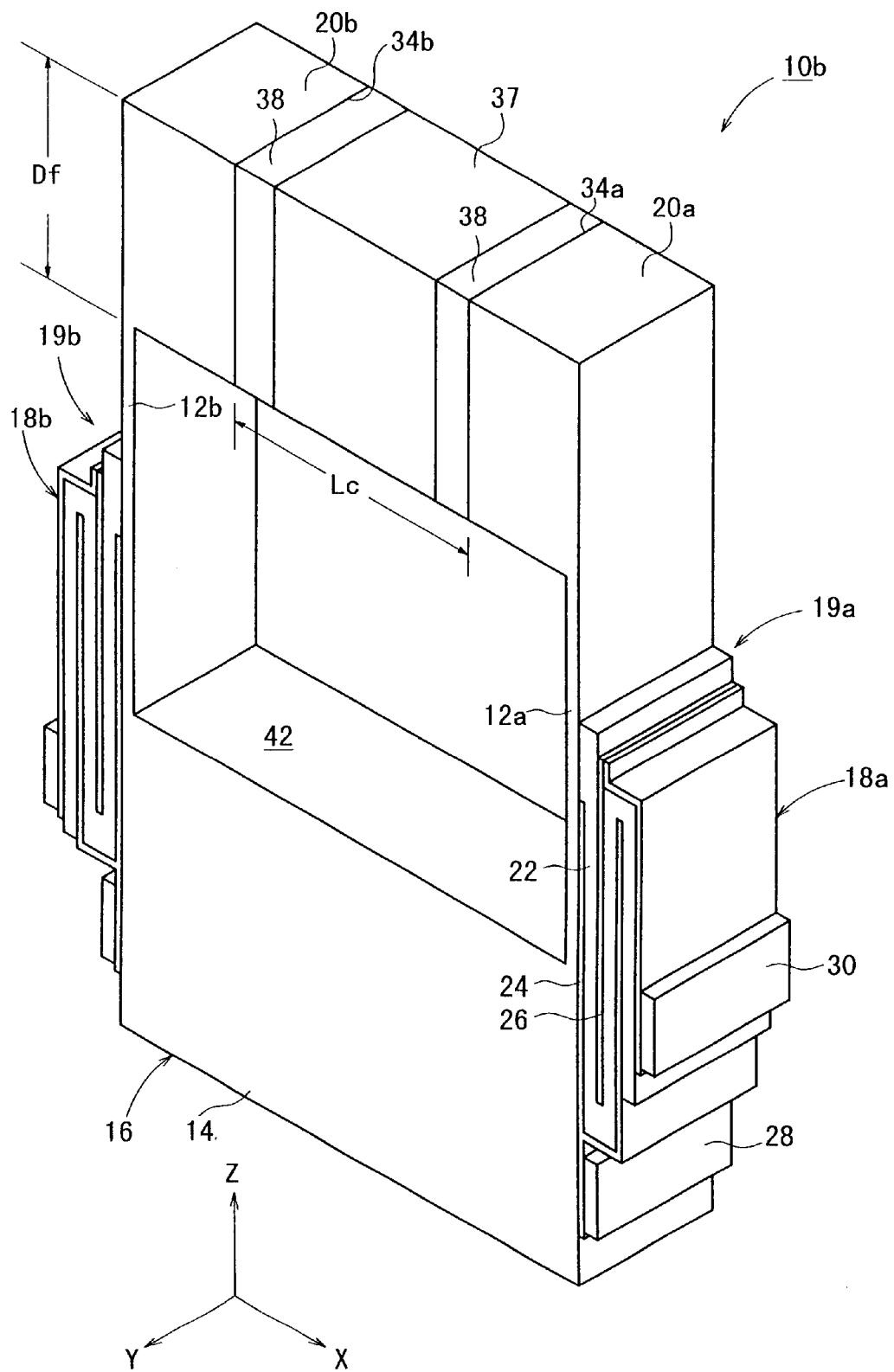
FIG. 7 shows a perspective view illustrating a second modified embodiment of the piezoelectric/electrostrictive device according to the embodiment of the present invention.

The piezoelectric/electrostrictive device 10b according to the second modified embodiment shown in FIG. 7 is illustrative of the following case. That is, the distance Lc between the attachment surfaces 34a, 34b is set to be about 1.5-fold the length Df of the movable section 20a, 20b. Further, one large spacer member 37 is bonded between the attachment surfaces 34a, 34b by the aid of an adhesive 38.

Figure 8:
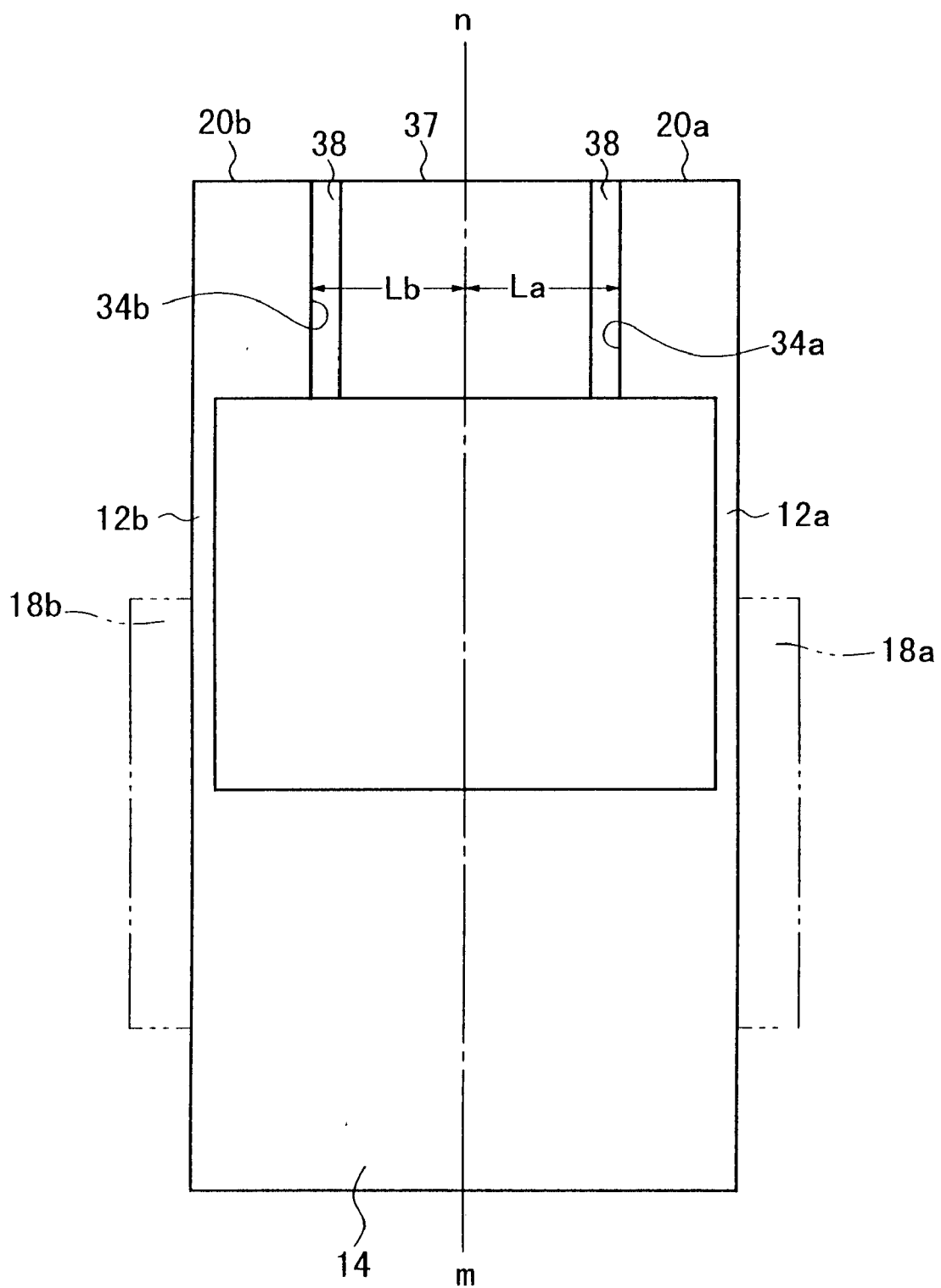
FIG. 8 illustrates a situation in which both of the piezoelectric/electrostrictive elements do not make the displacement action in the piezoelectric/electrostrictive device according to the second modified embodiment.

Further, for example, in the piezoelectric/electrostrictive device 10b according to the second modified embodiment, as shown in FIG. 8, for example, it is preferable that distances La, Lb from the central axis n of the spacer member 37 to the respective end surfaces 34a, 34b are approximately identical to one another.

In the piezoelectric/electrostrictive devices 10a, 10b according to the first and second modified embodiments, each of the three spacer members 37A to 37C (see FIG. 6) and the spacer member 37 (see FIG. 7) has a substantially rectangular parallelepiped-shaped configuration. Each of the side surfaces (surfaces opposed to the movable sections 20a, 20b of the thin plate sections 12a, 12b) is set to have the area which is substantially the same as the area of each of the attachment surfaces 34a, 34b of the movable sections 20a, 20b of the thin plate sections 12a, 12b.

The operation of the piezoelectric/electrostrictive device 10b according to the second modified embodiment will now be explained by way of example. At first, when the two piezoelectric/electrostrictive elements 18a, 18b are in the natural state, namely when both of the piezoelectric/electrostrictive elements 18a, 18b do not make the displacement action, then the major axis m of the piezoelectric/electrostrictive device 10b (major axis of the fixation section 14) is substantially coincident with the central axis n of the spacer member 37 as shown in FIG. 8.

Starting from this state, for example, a sine wave Wa, which has a predetermined bias electric potential Vb, is applied to the pair of electrodes 24, 26 of the first piezoelectric/electrostrictive element 18a as shown in a waveform figure shown in FIG. 9A, while a sine wave Wb, which has a phase different from that of the sine wave Wa by about 180°, is applied to the pair of electrodes 24, 26 of the second piezoelectric/electrostrictive element 18b as shown in FIG. 9B.

Figure 10:
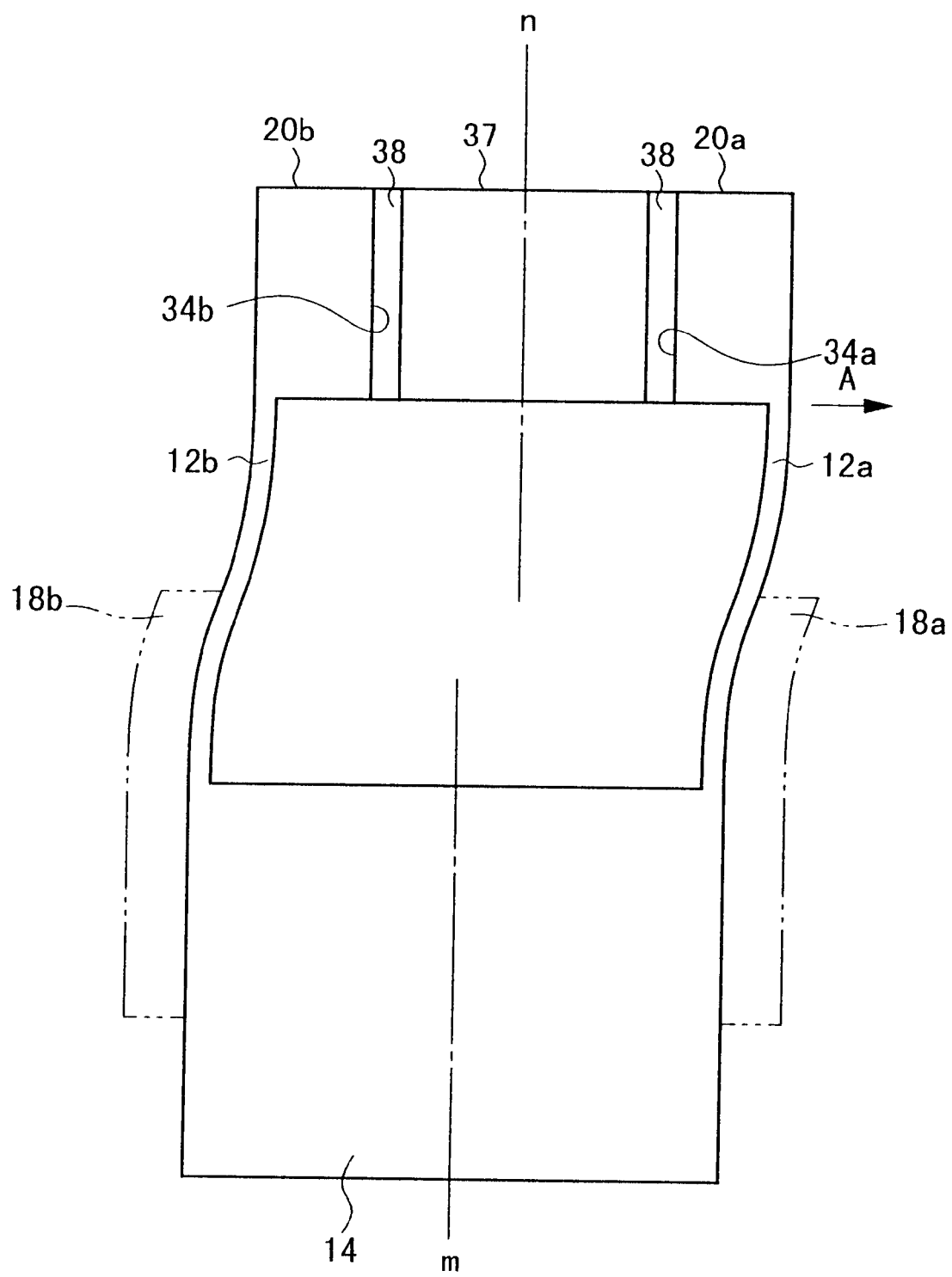
FIG. 10 illustrates a situation in which the piezoelectric/electrostrictive element makes the displacement action in the piezoelectric/electrostrictive device according to the second modified embodiment.

The piezoelectric/electrostrictive layer 22 of the first piezoelectric/electrostrictive element 18a makes the contraction displacement in the direction of the first principal surface at a stage at which, for example, a voltage having a maximum value is applied to the pair of electrodes 24, 26 of the first piezoelectric/electrostrictive element 18a. Accordingly, as shown in FIG. 10, for example, the stress is generated for the first thin plate section 12a to bend the thin plate section 12a, for example, in the rightward direction as shown by the arrow A. Therefore, the first thin plate section 12a is bent in the rightward direction. At this time, a state is given, in which no voltage is applied to the pair of electrodes 24, 26 of the second piezoelectric/electrostrictive element 18b. Therefore, the second thin plate section 12b follows the bending of the first thin plate section 12a, and it is bent in the rightward direction. As a result, the movable sections 20a, 20b and the spacer member 37 are displaced, for example, in the rightward direction with respect to the major axis m of the piezoelectric/electrostrictive device 10b. The displacement amount is changed depending on the maximum value of the voltage applied to each of the piezoelectric/electrostrictive elements 18a, 18b. For example, the larger the maximum value is, the larger the displacement amount is.

Especially, when a material having a high coercive electric field is applied as the constitutive material for the piezoelectric/electrostrictive layer 22, it is also preferable that the bias electric potential is adjusted so that the level of the minimum value is a slightly negative level as depicted by waveforms indicated by dashed lines in FIGS. 9A and 9B. In this case, for example, the stress, which is in the same direction as the bending direction of the first thin plate section 12a, is generated in the second thin plate section 12b by driving the piezoelectric/electrostrictive element (for example, the second piezoelectric/electrostrictive element 18b) to which the negative level is applied. Accordingly, it is possible to further increase the displacement amount of the movable sections 20a, 20b and the spacer member 37. In other words, when the waveforms indicated by the dashed lines in FIGS. 9A and 9B are used, the device is allowed to have such a function that the piezoelectric/electrostrictive element 18b or 18a, to which the negative level is applied, supports the piezoelectric/electrostrictive element 18a or 18b which principally makes the displacement action.

As described above, in the piezoelectric/electrostrictive device 10 according to the embodiment of the present invention, the minute displacement of the piezoelectric/electrostrictive element 18a, 18b is amplified into the large displacement action by utilizing the bending of the thin plate section 12a, 12b, and it is transmitted to the movable sections 20a, 20b. Accordingly, it is possible to greatly displace the movable sections 20a, 20b with respect to the major axis m of the piezoelectric/electrostrictive device 10b.

Especially, in this embodiment, the movable sections 20a, 20b are provided with the mutually opposing attachment surfaces 34a, 34b. In this arrangement, the space between the mutually opposing attachment surfaces 34a, 34b is the gap 36. Alternatively, the member, which is lighter than the constitutive member of the movable sections 20a, 20b, is allowed to intervene between the mutually opposing attachment surfaces 34a, 34b. Thus, it is possible to effectively realize the light weight of the movable sections 20a, 20b. It is possible to increase the resonance frequency without decreasing the displacement amount of the movable sections 20a, 20b.

The frequency herein indicates the frequency of the voltage waveform obtained when the movable sections 20a, 20b are displaced rightwardly and leftwardly by alternately switching the voltage applied to the pair of electrodes 24, 26. The resonance frequency indicates the maximum frequency at which the displacement action of the movable sections 20a, 20b can follow in a predetermined vibration mode.

In the piezoelectric/electrostrictive device 10 according to this embodiment, the movable sections 20a, 20b, the thin plate sections 12a, 12b, and the fixation section 14 are integrated into one unit. It is unnecessary that all of the parts are formed with the piezoelectric/electrostrictive material which is a fragile material having a relatively heavy weight. Therefore, the device has the following advantages. That is, the device has the high mechanical strength, and it is excellent in handling performance, shock resistance, and moisture resistance. Further, the operation of the device is scarcely affected by harmful vibration (for example, noise vibration and remaining vibration during high speed operation).

In this embodiment, when the space between the mutually opposing attachment surfaces 34a, 34b is the gap 36, the movable section 20a including the first attachment surface 34a and the movable section 20b including the second attachment surface 34b are easily bent, and the device is highly resistant to the deformation. Therefore, the piezoelectric/electrostrictive device 10 is excellent in handling performance.

Owing to the presence of the mutually opposing attachment surfaces 34a, 34b, the surface area of the movable sections 20a, 20b is increased. Therefore, when another part is attached to the movable section 20a, 20b, it is possible to increase the attachment area. Thus, it is possible to improve the attachment performance for the part. For example, if it is assumed that the part is secured with an adhesive or the like, the part is bonded by the aid of not only the principal surface of the movable section 20a, 20b (front surface and/or back surface) but also the mutually opposing attachment surfaces 34a, 34b. It is possible to secure the part in a reliable manner.

In this embodiment, the piezoelectric/electrostrictive element 18a, 18b is constructed to have the piezoelectric/electrostrictive layer 22 and the pair of electrodes 24, 26 formed on the both sides of the piezoelectric/electrostrictive layer 22. The first electrode 24 of the pair of electrodes 24, 26 is directly formed on at least the side surface of the thin plate section 12a, 12b. Therefore, the vibration caused by the piezoelectric/electrostrictive element 18a, 18b can be efficiently transmitted to the movable section 20a, 20b via the thin plate section 12a, 12b. Thus, it is possible to improve the response performance.

In this embodiment, as shown in FIG. 1, for example, the portion (substantial driving portion 40), at which the pair of electrodes 24, 26 are overlapped with each other with the piezoelectric/electrostrictive layer 22 interposed therebetween, is continuously formed over the range from the part of the fixation section 14 to the part of the thin plate section 12a, 12b. If the substantial driving portion 40 is formed to further extend over a part of the movable section 20a, 20b, then it is feared that the displacement action of the movable section 20a, 20b is inconsistent with the deformation of the substantial driving portion 40 and the deformation of the thin plate section 12a, 12b, and it is impossible to obtain the large displacement. However, in this embodiment, the substantial driving portion 40 is formed such that it does not range over both of the movable section 20a, 20b and the fixation section 14. Therefore, it is possible to avoid the inconvenience of the restriction of the displacement action of the movable section 20a, 20b, and it is possible to increase the displacement amount of the movable section 20a, 20b.

On the other hand, when the piezoelectric/electrostrictive element 18a, 18b is formed on the part of the movable section 20a, 20b, it is preferable that the substantial driving portion 40 is located over the range from the part of the movable section 20a, 20b to the part of the thin plate section 12a, 12b, because of the following reason. That is, if the substantial driving portion 40 is formed to extend up to a part of the fixation section 14, the displacement action of the movable section 20a, 20b is restricted as described above.

The embodiment described above is illustrative of the case in which the attachment surfaces 34a, 34b are provided for the movable sections 20a, 20b. Alternatively, as in a piezoelectric/electrostrictive device 10c according to a third modified embodiment shown in FIG. 11, end surfaces 34a, 34b may be provided for the fixation section 14. In this case, for example, the movable sections 20a, 20b, which are provided at the forward end portions of the pair of thin plate sections 12a, 12b, have an integrally connected configuration. The mutually opposing end surfaces 34a, 34b are provided for the fixation section 14.

Accordingly, in addition to the effect obtained when the mutually opposing attachment surfaces 34a, 34b are provided for the movable sections 20a, 20b as described above, the piezoelectric/electrostrictive device 10c according to the third modified embodiment can be tightly fixed to a predetermined fixation portion. Thus, it is possible to improve the reliability. The length of the substantial driving portion 40 is preferably 20% to 9% of the length of the thin plate section 12a, 12b, and more preferably 40% to 80% thereof.

Next, explanation will be made for preferred illustrative constructions of the piezoelectric/electrostrictive device 10 according to the embodiment of the present invention.

At first, in order to ensure the displacement action of the movable section 20a, 20b, it is preferable that the distance Dg, by which the substantial driving portion 40 of the piezoelectric/electrostrictive element 18a, 18b is overlapped with the fixation section 14 or the movable section 20a, 20b, is not less than ½ of the thickness Dd of the thin plate section 12a, 12b.

The device is constructed such that the ratio Da/Db between the distance (distance in the X axis direction) Da between the inner walls of the thin plate sections 12a, 12b and the width (distance in the Y axis direction) Db of the thin plate section 12a, 12b is 0.5 to 20. The ratio Da/Db is preferably 1 to 15 and more preferably 1 to 10. The prescribed value of the ratio Da/Db is prescribed on the basis of the discovery that the displacement amount of the movable section 20a, 20b can be increased, and the displacement in the X-Z plane can be dominantly obtained.

On the other hand, it is desirable that the ratio De/Da between the length (distance in the Z axis direction) De of the thin plate section 12a, 12b and the distance Da between the inner walls of the thin plate sections 12a, 12b is preferably 0.5 to 10 and more preferably 0.5 to 5. The prescribed value of the ratio De/Da is prescribed on the basis of the discovery that the displacement amount of the movable sections 20a, 20b with the spacer members (37A to 37C or 37) intervening therebetween can be increased, and the displacement action can be performed at a high resonance frequency (high response speed can be achieved).

Therefore, in order to suppress the flapping displacement in the Y axis direction or the vibration of the piezoelectric/electrostrictive device 10 according to this embodiment and provide the structure in which the high speed response performance is excellent and the large displacement is simultaneously obtained at a relatively low voltage, it is preferable that the ratio Da/Db is 0.5 to 20 and the ratio De/Da is 0.5 to 10, and it is more preferable that the ratio Da/Db is 1 to 10 and the ratio De/Da is 0.5 to 5.

Further, for example, in the case of the piezoelectric/electrostrictive device 10b according to the second embodiment, the hole 42 is formed by the both inner walls of the pair of thin plate sections 12a, 12b, the inner walls of the movable sections 20a, 20b, and the inner wall of the spacer member 37 (and the inner wall of the adhesive 38), and the inner wall of the fixation section 14. It is preferable that the hole 42 is filled with a gel material, for example, silicone gel. Usually, the displacement action of the movable section 20a, 20b is restricted by the presence of such a filler material. However, in the second modified embodiment, it is intended to realize the light weight brought about by the formation of the end surface 34a, 34b for the movable section 20a, 20b and increase the displacement amount of the movable section 20a, 20b. Therefore, the restriction of the displacement action of the movable section 20a, 20b due to the filler material is counteracted. Accordingly, it is possible to realize the effect owing to the presence of the filler material, namely the realization of the high resonance frequency and the maintenance of the rigidity.

It is preferable that the length (distance in the Z axis direction) Df of the movable section 20a, 20b is short, because of the following reason. That is, it is possible to realize the light weight and increase the resonance frequency by shortening the length. Further, when an article is interposed, it is possible to improve the displacement. However, in order to ensure the rigidity of the movable section 20a, 20b in the X axis direction and obtain its reliable displacement, it is desirable that the ratio Df/Dd with respect to the thickness Dd of the thin plate section 12a, 12b is not less than 2 and preferably not less than 5.

The actual size of each component is determined considering, for example, the joining area for attaching the part to the movable section 20a, 20b, the joining area for attaching the fixation section 14 to another member, the joining area for attaching the electrode terminal or the like, and the strength, the durability, the necessary displacement amount, the resonance frequency, and the driving voltage of the entire piezoelectric/electrostrictive device 10.

Specifically, for example, the distance Da between the inner walls of the thin plate sections 12a, 12b is preferably 100 μm to 2000 μm and more preferably 200 μm to 1600 μm. The width Db of the thin plate section 12a, 12b is preferably 50 μm to 2000 μm and more preferably 100 μm to 500 μm. The thickness Dd of the thin plate section 12a, 12b is preferably 2 μm to 100 μm and more preferably 10 μm to 80 μm, while it satisfies Db>Dd in relation to the width Db of the thin plate section 12a, 12b, in order to make it possible to effectively suppress the flapping displacement which is the displacement component in the Y axis direction.

The length De of the thin plate section 12a, 12b is preferably 200 μm to 3000 μm and more preferably 300 μm to 2000 μm. The length Df of the movable section 20a, 20b is preferably 50 μm to 2000 μm, more preferably 100 μm to 1000 μm, and especially preferably 200 μm to 600 μm.

The arrangement as described above exhibits such an extremely excellent effect that the displacement in the Y axis direction does not exceeds 10% with respect to the displacement in the X axis direction, while the device can be driven at a low voltage by appropriately making adjustment within the range of the size ratio and the actual size, and it is possible to suppress the displacement component in the Y axis direction to be not more than 5%. In other words, the movable section 20a, 20b is displaced in one axis direction, i.e., substantially in the X axis direction. Further, the high speed response is excellent, and it is possible to obtain the large displacement at a relatively low voltage.

In the piezoelectric/electrostrictive device 10, the shape of the device is not the plate-shaped configuration (the thickness in the direction perpendicular to the displacement direction is small) unlike conventional one. Each of the movable section 20a, 20b and the fixation section 14 has the rectangular parallelepiped-shaped configuration (the thickness in the direction perpendicular to the displacement direction is large). The pair of thin plate sections 12a, 12b are provided so that the side surface of the movable section 20a, 20b is continuous to the side surface of the fixation section 14. Therefore, it is possible to selectively increase the rigidity of piezoelectric/electrostrictive device 10 in the Y axis direction.

That is, in the piezoelectric/electrostrictive device 10, it is possible to selectively generate only the operation of the movable section 20a, 20b in the plane (XZ plane). It is possible to suppress the operation of the movable section 20a, 20b in the YZ plane (operation in the so-called flapping direction).

Next, explanation will be made for the respective constitutive components of the piezoelectric/electrostrictive device 10 according to this embodiment.

As described above, the movable section 20a, 20b is the portion which is operated on the basis of the driving amount of the thin plate section 12a, 12b, and a variety of members are attached thereto depending on the purpose of use of the piezoelectric/electrostrictive device 10. For example, when the piezoelectric/electrostrictive device 10 is used as a displacement element, a shield plate for an optical shutter or the like is attached thereto. Especially, when the piezoelectric/electrostrictive device 10 is used for the mechanism for positioning a magnetic head of a hard disk drive or for suppressing the ringing, a member required to be positioned is attached thereto, including, for example, the magnetic head, a slider provided with the magnetic head, and a suspension provided with the slider.

As described above, the fixation section 14 is the portion for supporting the thin plate sections 12a, 12b and the movable section 20a, 20b. For example, when the fixation section 14 is utilized to position the magnetic head of the hard disk drive, the entire piezoelectric/electrostrictive device 10 is fixed by supporting and securing the fixation section 14, for example, to a carriage arm attached to VCM (voice coil motor) or a fixation plate or a suspension attached to the carriage arm. As shown in FIG. 1, the terminals 28, 30 for driving the piezoelectric/electrostrictive elements 18a, 18b and other members are arranged on the fixation section 14 in some cases.

The material for constructing the movable section 20a, 20b and the fixation section 14 is not specifically limited provided that it has rigidity. However, it is possible to preferably use ceramics to which the ceramic green sheet-laminating method is applicable as described later on. Specifically, the material includes, for example, materials containing a major component of zirconia represented by fully stabilized zirconia and partially stabilized zirconia, alumina, magnesia, silicon nitride, aluminum nitride, and titanium oxide, as well as materials containing a major component of a mixture of them. However, in view of the high mechanical strength and the high toughness, it is preferable to use a material containing a major component of zirconia, especially fully stabilized zirconia and a material containing a major component of partially stabilized zirconia. The metal material is not limited provided that it has rigidity. However, the metal material includes, for example, stainless steel and nickel.

As described above, the thin plate section 12a, 12b is the portion which is driven in accordance with the displacement of the piezoelectric/electrostrictive element 18a, 18b. The thin plate section 12a, 12b is the thin plate-shaped member having flexibility, and it functions to amplify the expansion and contracting displacement of the piezoelectric/electrostrictive element 18a, 18b arranged on the surface as the bending displacement and transmit the displacement to the movable section 20a, 20b. Therefore, it is enough that the shape or the material of the thin plate section 12a, 12b provides the flexibility with the mechanical strength of such a degree that it is not broken by the bending displacement. It is possible to make appropriate selection considering the response performance and the operability of the movable section 26a, 20b.

It is preferable that the thickness Dd of the thin plate section 12a, 12b is preferably about 2 µm to 100 µm. It is preferable that the combined thickness of the thin plate section 12a, 12b and the piezoelectric/electrostrictive element 18a, 18b is 7 µm to 500 µm. It is preferable that the thickness of the electrode 24, 26 is 0.1 µm to 50 µm, and the thickness of the piezoelectric/electrostrictive layer 22 is 3 µm to 300 µm.

Ceramics, which is similarly used for the movable section 20a, 20b and the fixation section 14, can be preferably used as the material for constructing the thin plate section 12a, 12b. A material containing a major component of zirconia, especially fully stabilized zirconia and a material containing a major component of partially stabilized zirconia are most preferably used, because the mechanical strength is large even in the case of a thin wall thickness, the toughness is high, and the reactivity with the piezoelectric/electrostrictive layer and the electrode material is small.

When the thin plate section 12a, 12b is made of a metal material, it is enough that the metal material has flexibility and the metal material is capable of bending displacement as described above. However, preferably, it is desirable that the thin plate section 12a, 12b is made of an iron-based material such as various stainless steel materials and various spring steel materials. Alternatively, it is desirable that the thin plate section 12a, 12b is made of a non-ferrous material such as beryllium copper, phosphor bronze, nickel, and nickel-iron alloy.

Those which are fully stabilized or partially stabilized as follows are preferably used as fully stabilized zirconia or partially stabilized zirconia as described above. That is, the compound to be used for fully stabilizing or partially stabilizing zirconia includes yttrium oxide, ytterbium oxide, cerium oxide, calcium oxide, and magnesium oxide. When at least one compound of them is added and contained, the objective zirconia can be stabilized. Alternatively, the objective zirconia can be stabilized as well, not only by adding one type of the compound but also by adding a combination of the compounds.

The amount of addition of each of the compounds is desirably as follows. That is, yttrium oxide or ytterbium oxide is added by 1 to 30 mole %, preferably 1.5 to 10 mole %. Cerium oxide is added by 6 to 50 mole %, preferably 8 to 20 mole %. Calcium oxide or magnesium oxide is added by 5 to 40 mole %, preferably 5 to 20 mole %. Especially, it is preferable to use yttrium oxide as a stabilizer. In this case, yttrium oxide is desirably added by 1.5 to 10 mole %, more preferably 2 to 4 mole %. For example, alumina, silica, or transition metal oxide may be added as an additive of sintering aid or the like in a range of 0.05 to 20% by weight. However, when the sintering integration based on the film formation method is adopted as a technique for forming the piezoelectric/electrostrictive element 18a, 18b, it is also preferable to add, for example, alumina, magnesia, and transition metal oxide as an additive.

In order to obtain the mechanical strength and the stable crystal phase, it is desirable that the average crystal grain size of zirconia is 0.05 to 3 µm, preferably 0.05 to 1 µm. As described above, ceramics can be used for the thin plate section 12a, 12b in the same manner as in the movable section 20a, 20b and the fixation section 14. Preferably, it is advantageous to construct the thin plate sections 12a, 12b with a substantially identical material in view of the reliability of the joined portion and the strength of the piezoelectric/electrostrictive device 10, in order to reduce any complicated procedure of the production.

The piezoelectric/electrostrictive element 18a, 18b has at least the piezoelectric/electrostrictive layer 22 and the pair of electrodes 24, 26 for applying the electric field to the piezoelectric/electrostrictive layer 22. It is possible to use, for example, piezoelectric/electrostrictive elements of the unimorph type and the bimorph type. However, those of the unimorph type combined with the thin plate section 12a, 12b are suitable for the piezoelectric/electrostrictive device 10 as described above, because they are excellent in stability of the generated displacement amount and they are advantageous to realize the light weight.

As shown in FIG. 1, the piezoelectric/electrostrictive element 18a, 18b is preferably formed on the side surface side of the thin plate section 12a, 12b in view of the fact that the thin plate section 12a, 12b can be driven to a greater extent.

Piezoelectric ceramics is preferably used for the piezoelectric/electrostrictive layer 22. However, it is also possible to use electrostrictive ceramics, ferroelectric ceramics, or anti-ferroelectric ceramics. However, when the piezoelectric/electrostrictive device 10 is used, for example, to position the magnetic head of the hard disk drive, it is important to provide the linearity concerning the displacement amount of the movable section 20a, 20b and the driving voltage or the output voltage. Therefore, it is preferable to use a material having small strain hysteresis. It is preferable to use a material having a coercive electric field of not more than 10 kV/mm.

Specified materials include ceramics containing, for example, lead zirconate, lead titanate, lead magnesium niobate, lead nickel niobate, lead zinc niobate, lead manganese niobate, lead antimony stannate, lead manganese tungstate, lead cobalt niobate, barium titanate, sodium bismuth titanate, potassium sodium niobate, and strontium bismuth tantalate singly or in mixture.

Especially, a material containing a major component of lead zirconate, lead titanate, and lead magnesium niobate, or a material containing a major component of sodium bismuth titanate is preferably used, in order to obtain the product having a stable composition with a high electromechanical coupling factor and a piezoelectric constant and with small reactivity with the thin plate sections 12a, 12b (ceramics) during the sintering of the piezoelectric/electrostrictive layer 22.

It is also preferable to use ceramics obtained by adding, to the material described above, for example, oxides of lanthanum, calcium, strontium, molybdenum, tungsten, barium, niobium, zinc, nickel, manganese, cerium, cadmium, chromium, cobalt, antimony, iron, yttrium, tantalum, lithium, bismuth, and stannum singly or in mixture.

For example, when lanthanum and/or strontium is contained in the major components of lead zirconate, lead titanate, and lead magnesium niobate, an advantage is obtained in some cases, for example, in such a way that the coercive electric field and the piezoelectric characteristic can be adjusted.

It is desirable to avoid the addition of a material such as silica which tends to form glass, because of the following reason. That is, the material such as silica tends to react with the piezoelectric/electrostrictive material during the heat treatment for the piezoelectric/electrostrictive layer 22. As a result, the composition is varied, and the piezoelectric characteristic is deteriorated.

On the other hand, it is preferable that the pair of electrodes 24, 26 of the piezoelectric/electrostrictive element 18a, 18b are made of metal which is solid at room temperature and which is excellent in electrical conductivity. For example, it is possible to use elemental substance or alloy of, for example, aluminum, titanium, chromium, iron, cobalt, nickel, copper, zinc, niobium, molybdenum, ruthenium, palladium, rhodium, silver, stannum, tantalum, tungsten, iridium, platinum, gold, and lead. It is also preferable to use a cermet material obtained by dispersing, in the metal described above, the same material as that of the piezoelectric/electrostrictive layer 22 or the thin plate section 12a, 12b.

The material for the electrodes 24, 26 of the piezoelectric/electrostrictive element 18a, 18b is selected and determined depending on the method for forming the piezoelectric/electrostrictive layer 22. For example, when the piezoelectric/electrostrictive layer 22 is formed by sintering on the first electrode 24 after the first electrode 24 is formed on the thin plate section 12a, 12b, it is necessary for the first electrode 24 to use high melting point metal such as platinum, palladium, platinum-palladium alloy, and silver-palladium alloy which does not change at the sintering temperature for the piezoelectric/electrostrictive layer 22. However, the electrode formation can be performed at a low temperature for the second electrode 26 which is formed on the piezoelectric/electrostrictive layer 22 after forming the piezoelectric/electrostrictive layer 22. Therefore, it is possible for the second electrode 26 to use low melting point metal such as aluminum, gold, and silver.

The thickness of the electrode 24, 26 also serves as a factor to considerably decrease the displacement of the piezoelectric/electrostrictive element 18a, 18b. Therefore, it is preferable, especially for the electrode formed after the sintering of the piezoelectric/electrostrictive layer 22, to use organic metal paste capable of obtaining a dense and thinner film after the sintering, for example, a material such as gold resinate paste, platinum resinate paste, and silver resinate paste.

The embodiment described above is illustrative of the case in which the thickness of the movable section 20a, 20b formed integrally at the forward end portion of the thin plate section 12a, 12b is thicker than the thickness Dd of the thin plate section 12a, 12b. Alternatively, as in a piezoelectric/electrostrictive device 10d according to a fourth modified embodiment shown in FIG. 12, it is also preferable that the thickness of the movable section 20a, 20b is approximately the same as the thickness Dd of the thin plate section 12a, 12b. Accordingly, when a part or an article is attached to the movable section 20a, 20b, the part having a size corresponding to the distance between the thin plate sections 12a, 12b can be attached between the movable section 20a, 20b so that the part is interposed thereby. In this case, an adhesive area for attaching the part (for example, the adhesive 38 shown in FIG. 7) corresponds to the movable section 20a, 20b.

The piezoelectric/electrostrictive device 10 can be preferably utilized for various sensors including, for example, ultrasonic sensors, acceleration sensors, angular velocity sensors, and mass sensors. A further advantage is obtained such that the sensitivity of the sensor can be adjusted with ease by appropriately adjusting the size of the object to be attached between the end surfaces 34a, 34b or between the thin plate sections 12a, 12b.

Next, piezoelectric/electrostrictive devices 10e to 10g according to fifth to seventh embodiments will be explained as more preferred embodiments of the present invention with reference to FIGS. 13 to 15.

Figure 13:
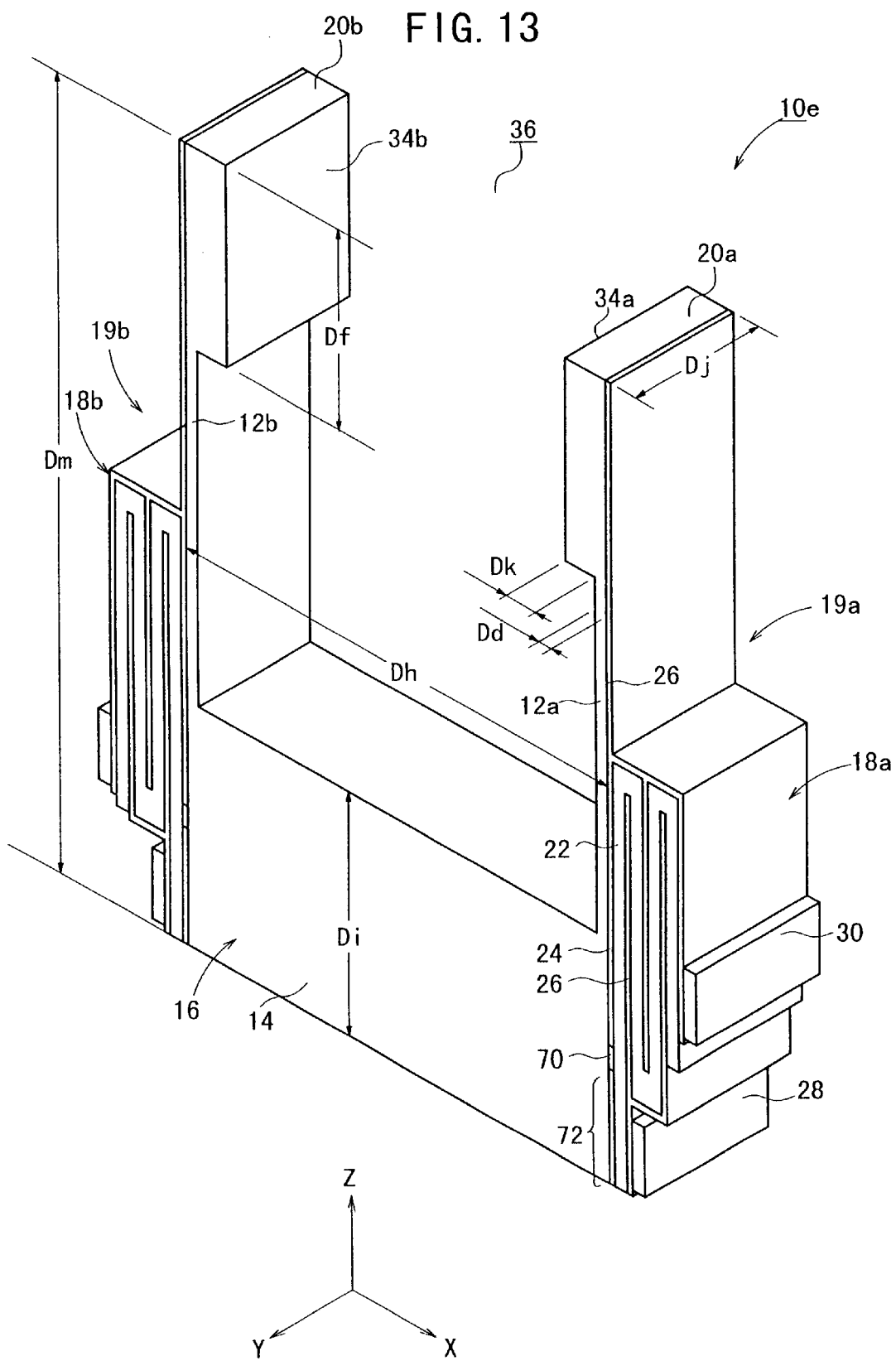
FIG. 13 shows a perspective view illustrating a fifth modified embodiment of the piezoelectric/electrostrictive device.

At first, as shown in FIG. 13, the piezoelectric/electrostrictive device 10e according to the fifth modified embodiment is constructed in approximately the same manner as the piezoelectric/electrostrictive device 10 explained above. However, for example, the arrangement of the piezoelectric/electrostrictive element 18a, 18b differs in the following points.

That is, the piezoelectric/electrostrictive element 18a, 18b comprises the piezoelectric/electrostrictive layer 22 which has a four-layered structure. The first electrode 24 is formed to have a comb-shaped configuration to be located at the upper surface of the first layer and the upper surface of the third layer. The second electrode 26 is formed to have a comb-shaped configuration to be located at the lower surface of the first layer, the upper surface of the second layer, and the upper surface of the fourth layer.

Especially, the second electrode 26, which is located at the lower surface of the first layer, is formed substantially continuously ranging over the respective side surfaces of the thin plate section 12a, 12b, the movable section 20a, 20b, and the fixation section 14. Further, a part of the second electrode 26 is separated at the side surface of the fixation section 14 to form a slit 70.

The slit 70 is provided taking the following facts into consideration. That is, (1) the actuator is not driven at the rearward end portion 72 of the piezoelectric/electrostrictive element 18a, 18b (portion ranging from the end of the slit 70 at the rearward end side to the rearward end of the fixation section 14), (2) any short circuit is scarcely formed at the end of the first terminal 28, and (3) the electrode material is arranged on the lower surface of the piezoelectric/electrostrictive layer 22 at the rearward end portion of the piezoelectric/electrostrictive element 18a, 18b.

If the provision of the slit 70 is inversely unfavorable, it is not necessarily indispensable to provide the slit 70. The slit 70 may be omitted.

In this embodiment, FIG. 13 is illustrative of the following case. That is, the thickness Dd of the thin plate section 12a, 12b is 0.05 mm. The distance Dh from the side surface of the first thin plate section 12a to the second thin plate section 12b is 1.3 mm. The length Di of the fixation section 14 (length of the fixation section 14 in the axial direction of the piezoelectric/electrostrictive device 10f) is 0.4 mm. The length Df of the movable section 20a, 20b is 0.3 mm. The width Dj of the movable section 20a, 20b is 0.25 mm. The protruding amount Dk of the movable section 20a, 20b is 0.05 mm. The entire length Dm of the piezoelectric/electrostrictive device 10f (distance from the forward end of the movable section 20a, 20b to the rearward end of the fixation section 14) is 1.9 mm. The minimum distance between the end surfaces 34a, 34b (corresponding to the distance Lc shown in FIG. 1) is 1.04 mm.

The dimension of each of the components is regulated within a range of ±10% with respect to each of the dimensions described above. In this embodiment, when the movable sections 20a, 20b are connected to one another with a spacer member 37 composed of the same material as that of the constitutive member as shown in FIG. 7 between the end surfaces 34a, 34b, it is possible to obtain the piezoelectric/electrostrictive device having a resonance frequency of 45±10 kHz and a displacement of not less than 0.5 µm (30 Vpp).

FIG. 13 is illustrative of the case in which the respective end surfaces of the piezoelectric/electrostrictive layer 22 having the four-layered structure are aligned. However, it is preferable that the end surfaces of the piezoelectric/electrostrictive layer 22 are disposed so that upper layers are gradually directed inwardly to provide steps.

Figure 14:
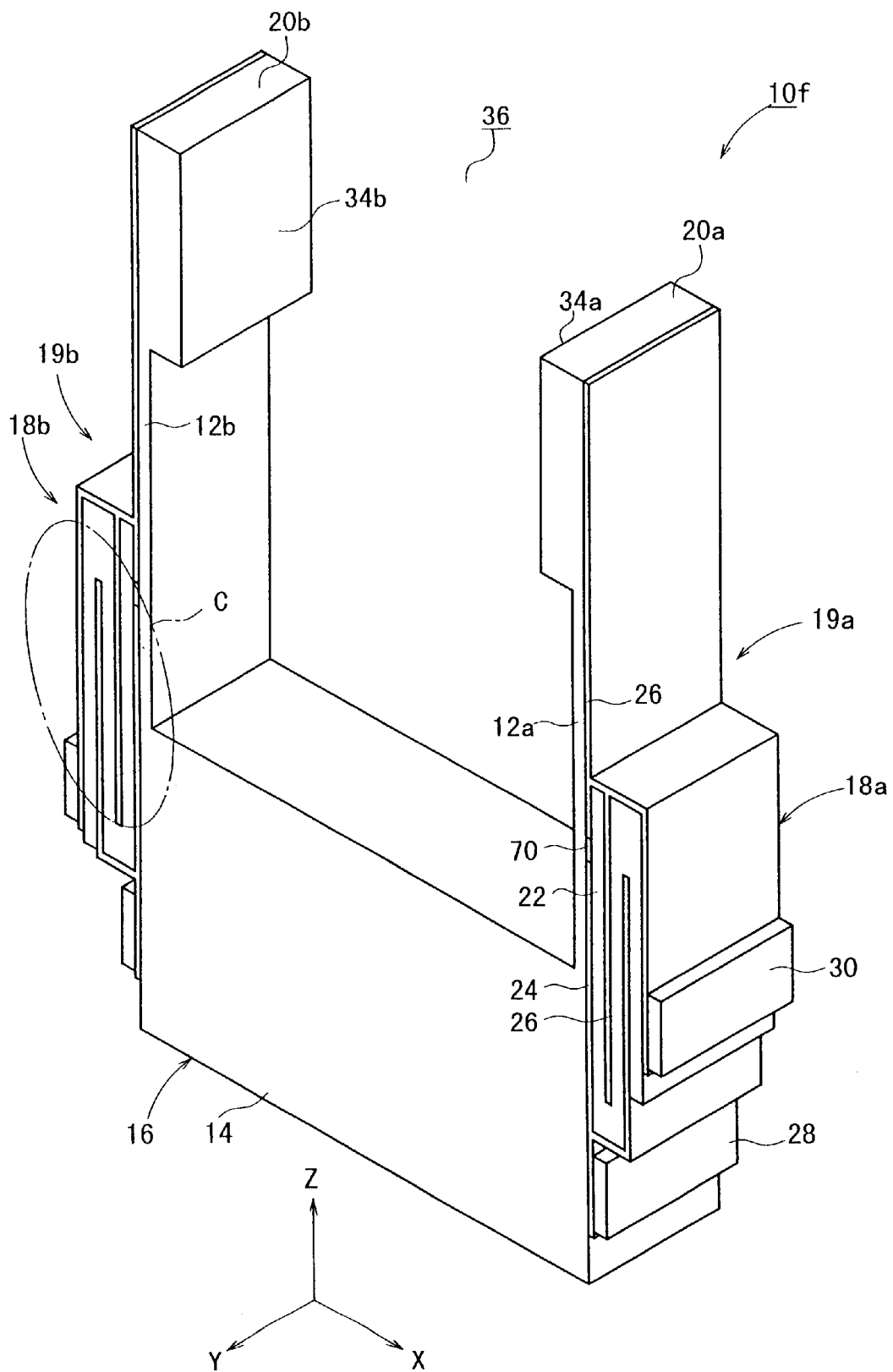
FIG. 14 shows a perspective view illustrating a sixth modified embodiment of the piezoelectric/electrostrictive device.

Next, as shown in FIG. 14, the piezoelectric/electrostrictive device 10f according to the sixth modified embodiment is constructed in approximately the same manner as the piezoelectric/electrostrictive device 10e according to the fifth modified embodiment. However, the arrangement of the piezoelectric/electrostrictive element 18a, 18b differs in the following points.

That is, the piezoelectric/electrostrictive element 18a, 18b comprises the piezoelectric/electrostrictive layer 22 which has a three-layered structure. The first electrode 24 is formed to have a comb-shaped configuration to be located at a part of the lower surface of the first layer and the upper surface of the second layer. The second electrode 26 is formed to have a comb-shaped configuration to be located at a part of the lower surface of the first layer, the upper surface of the first layer, and the upper surface of the third layer.

It is preferred that the first electrode 24 and the second electrode 26, which are located at the lower surface of the first layer, are separated from each other at a part of the thin plate section 12a, 12b by the aid of a slit 70. The second electrode, which is located at the lower surface of the first layer, is formed continuously over a range from the slit 70 to the upper end of the movable section 20a, 20b. The first electrode 24, which is located at the lower surface of the first layer, is formed continuously over a range from the slit 70 to the rearward end of the fixation section 14.

Figure 15:
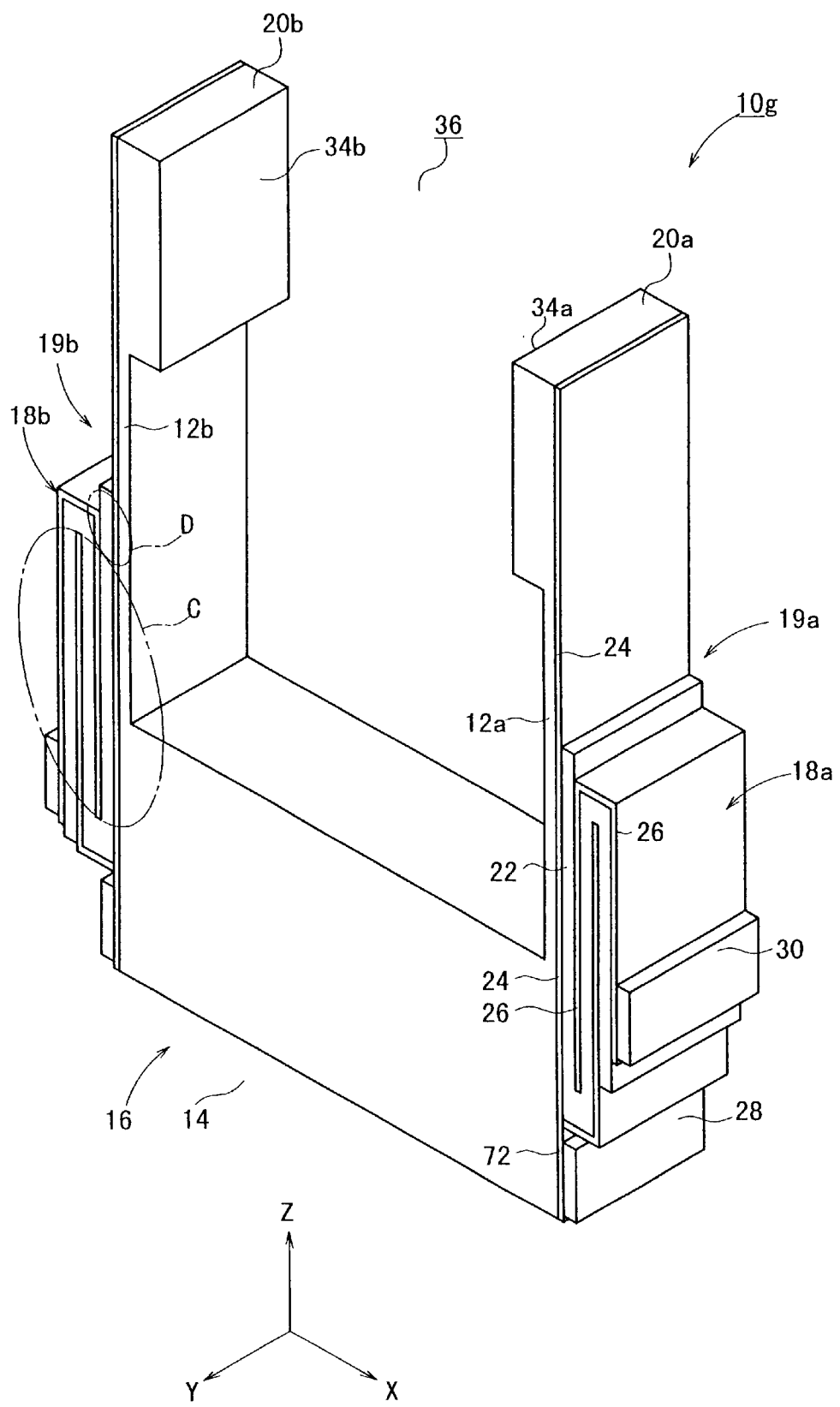
FIG. 15 shows a perspective view illustrating a seventh modified embodiment of the piezoelectric/electrostrictive device.

Next, as shown in FIG. 15, the piezoelectric/electrostrictive device 10g according to the seventh modified embodiment is constructed in approximately the same manner as the piezoelectric/electrostrictive device 10f according to the sixth modified embodiment. However, the formation pattern of the pair of electrodes 24, 26 differs in the following points.

That is, the first electrode 24 is formed to have a comb-shaped configuration to be located at the lower surface of the first layer and the upper surface of the second layer of the piezoelectric/electrostrictive layer 22. The second electrode 26 is formed to have a comb-shaped configuration to be located at the upper surface of the first layer and the upper surface of the third layer of the piezoelectric/electrostrictive layer 22.

Especially, the first electrode 24, which is located at the lower surface of the first layer, is formed continuously over the respective side surfaces of the thin plate section 12a, 12b, the movable section 20a, 20b, and the fixation section 14.

The difference from the piezoelectric/electrostrictive device 10f according to the sixth modified embodiment will now be explained. As shown in FIG. 14, in the piezoelectric/electrostrictive device 10f according to the sixth modified embodiment, both of the first electrode 24 and the second electrode 26 are formed on the thin plate section 12a. Therefore, the electrodes 24, 26, which have the mutually opposite polarities, are located at the both ends of the piezoelectric/electrostrictive element 18, 18b (the end corresponding to the forward end of the movable section 20a, 20b and the end corresponding to the rearward end of the fixation section 14).

On the other hand, as shown in FIG. 15, in the piezoelectric/electrostrictive device 10g according to the seventh modified embodiment, only the first electrode 24 is formed on the thin plate section 12a, 12b. Therefore, the electrodes 24, which have the mutually identical polarity, are located at the both ends of the piezoelectric/electrostrictive element 18a, 18b. The feature of the polarity at the end as described above is utilized by appropriately making combination with a circuit for which the piezoelectric/electrostrictive device 10g is utilized.

The substantial driving portion of the piezoelectric/electrostrictive element 18a, 18b is the portion at which the pair of electrodes 24, 26 are overlapped with each other. In the piezoelectric/electrostrictive device 10f according to the sixth modified embodiment, as shown in FIG. 14, the substantial driving portion is the portion at which the electrodes 24, 26 formed at the respective layers of the piezoelectric/electrostrictive layer 22 are overlapped with each other, which resides in one part corresponding to the portion indicated by the range C.

On the other hand, the substantial driving portion of the piezoelectric/electrostrictive device 10g according to the seventh modified embodiment resides in two parts, i.e., the portion (portion indicated by the range C) at which the electrodes 24, 26 formed at the respective layers of the piezoelectric/electrostrictive layer 22 are overlapped with each other, and the portion (portion indicated by the range D) which is disposed at the position deviated toward the movable section 20a, 20b with respect to the end of the first electrode 24 formed at the upper surface of the second layer of the piezoelectric/electrostrictive layer 22 and at which the pair of electrodes 24, 26 are overlapped with each other with the first layer of the piezoelectric/electrostrictive layer 22 intervening therebetween. The piezoelectric/electrostrictive device 10g according to the seventh modified embodiment is characterized in that the portion indicated by the range D also serves as the driving source.

Next, explanation will be made with reference to FIGS. 16 to 40 for several methods for producing the piezoelectric/electrostrictive device 10 according to the embodiment of the present invention.

Ceramics is preferably used for the constitutive material for each of the members of the piezoelectric/electrostrictive device 10 according to the embodiment of the present invention. It is preferable that the constitutive elements of the piezoelectric/electrostrictive device 10 concerning the substrate 16 except for the piezoelectric/electrostrictive elements 18a, 18b, i.e., the thin plate sections 12a, 12b, the fixation section 14, and the movable sections 20a, 20b are produced by using the ceramic green sheet-laminating method. On the other hand, it is preferable that the piezoelectric/electrostrictive elements 18a, 18b as well as the respective terminals 28, 30 are produced by using the film formation method, for example, for the thin film and the thick film.

According to the ceramic green sheet-laminating method in which the respective members of the substrate 16 of the piezoelectric/electrostrictive device 10 can be formed in an integrated manner, the time-dependent change of state scarcely occurs at the joined portions of the respective members. Therefore, this method provides the high reliability of the joined portion, and it is advantageous to ensure the rigidity.

In the piezoelectric/electrostrictive device 10 according to this embodiment, the boundary portion (joined portion) between the thin plate section 12a, 12b and the fixation section 14 and the boundary portion (joined portion) between the thin plate section 12a, 12b and the movable section 20a, 20b function as supporting points for expressing the displacement. Therefore, the reliability of the joined portion is an important point which dominates the characteristic of the piezoelectric/electrostrictive device 10.

The production methods described below are excellent in reproducibility and formability. Therefore, it is possible to obtain the piezoelectric/electrostrictive device 10 having a predetermined shape within a short period of time with good reproducibility.

A first production method for the piezoelectric/electrostrictive device 10 according to the embodiment of the present invention will be specifically explained below. The following definitions are now made. The laminate, which is obtained by laminating the ceramic green sheets, is defined to be the ceramic green laminate 58 (see, for example, FIG. 17). The integrated matter, which is obtained by sintering the ceramic green laminate 58, is defined to be the ceramic laminate 60 (see, for example, FIG. 18). The integrated matter comprising the movable sections 20a, 20b, the thin plate sections 12a, 12b, and the fixation section 14, which is obtained by cutting off unnecessary portions from the ceramic laminate 60, is defined to be the ceramic substrate 16C (see FIG. 19).

In the first production method, the ceramic laminate 60 is finally cut into chip units in a form in which a plurality of piezoelectric/electrostrictive devices 10 are arranged in the vertical direction and in the lateral direction respectively on an identical substrate to produce a large number of piezoelectric/electrostrictive devices 10 in accordance with identical steps. However, in order to simplify the explanation, description will be made principally for the case in which one individual of piezoelectric/electrostrictive device 10 is produced.

At first, for example, a binder, a solvent, a dispersing agent, and a plasticizer are added and mixed with a ceramic powder such as zirconia to prepare a slurry. The slurry is subjected to a degassing treatment, and then a ceramic green sheet having a predetermined thickness is prepared in accordance with, for example, the reverse roll coater method and the doctor blade method.

Figure 16:
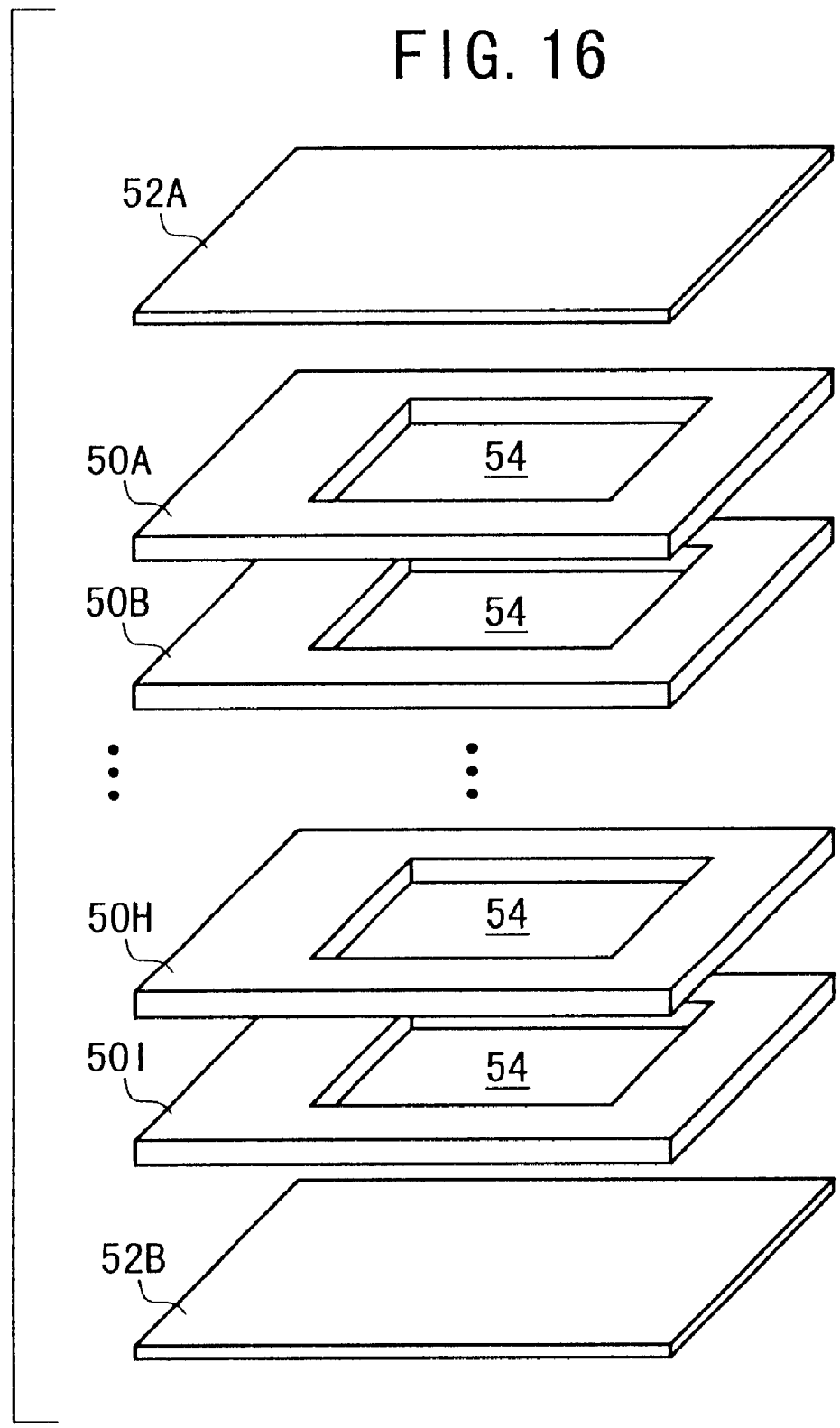
FIG. 16 illustrates a process for laminating ceramic green sheets required for a first production method.

Subsequently, the ceramic green sheet is processed into those having various shapes as shown in FIG. 16 in accordance with, for example, a method such as the punching out based on the mold and the laser machining to obtain a plurality of ceramic green sheets 50A to 50I, 52A, 52B for forming the substrate.

The ceramic green sheets 50A to 50I, 52A, 52B include the plurality (for example, nine) of ceramic green sheets 50A to 50I each of which is formed with at least a window 54 for forming the space between the thin plate sections 12a, 12b, and the plurality (for example, two) of ceramic green sheets 52A, 52B to be formed into the thin plate sections 12a, 12b thereafter. The numbers of ceramic green sheets referred to above are persistently by way of example.

Figure 17:
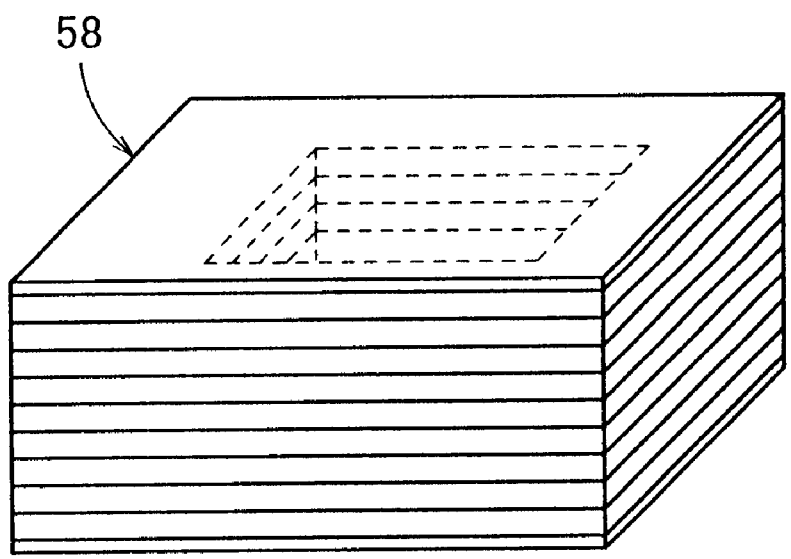
FIG. 17 illustrates a state in the first production method in which a ceramic green laminate is formed.

After that, as shown in FIG. 17, the ceramic green sheets 50A to 50I, 52A, 52B are laminated and secured under pressure so that the ceramic green sheets 50A to 50I are interposed between the ceramic green sheets 52A, 52B to form a ceramic green laminate 58. Subsequently, the ceramic green laminate 58 is sintered to obtain a ceramic laminate 60 (see FIG. 18).

It is noted that there is no limitation for the number of pressure-securing process or processes and the sequence for the purpose of the lamination and integration into one unit. These factors can be appropriately determined depending on the structure, for example, so that the desired structure is obtained on the basis of, for example, the shape of the window 54 and the number of ceramic green sheets.

It is unnecessary that the shape of the window 54 is identical in all cases. The shape of the window 54 can be determined depending on the desired function. There is also no limitation for the number of ceramic green sheets and the thickness of each of the ceramic green sheets.

In the pressure-securing process, it is possible to further improve the laminating performance by applying the heat. The laminating performance at the boundary of the ceramic green sheet can be improved by providing an auxiliary joining layer, for example, by applying and printing, onto the ceramic green sheet, a paste or a slurry principally containing a ceramic powder (it is preferable to use a composition which is the same as or similar to that of the ceramics used for the ceramic green sheet in order to ensure the reliability), and a binder. When the ceramic green sheets 52A, 52B are thin, it is preferable to handle them with a plastic film, especially with a polyethylene terephthalate film coated with a releasing agent based on silicone on the surface.

Figure 18:
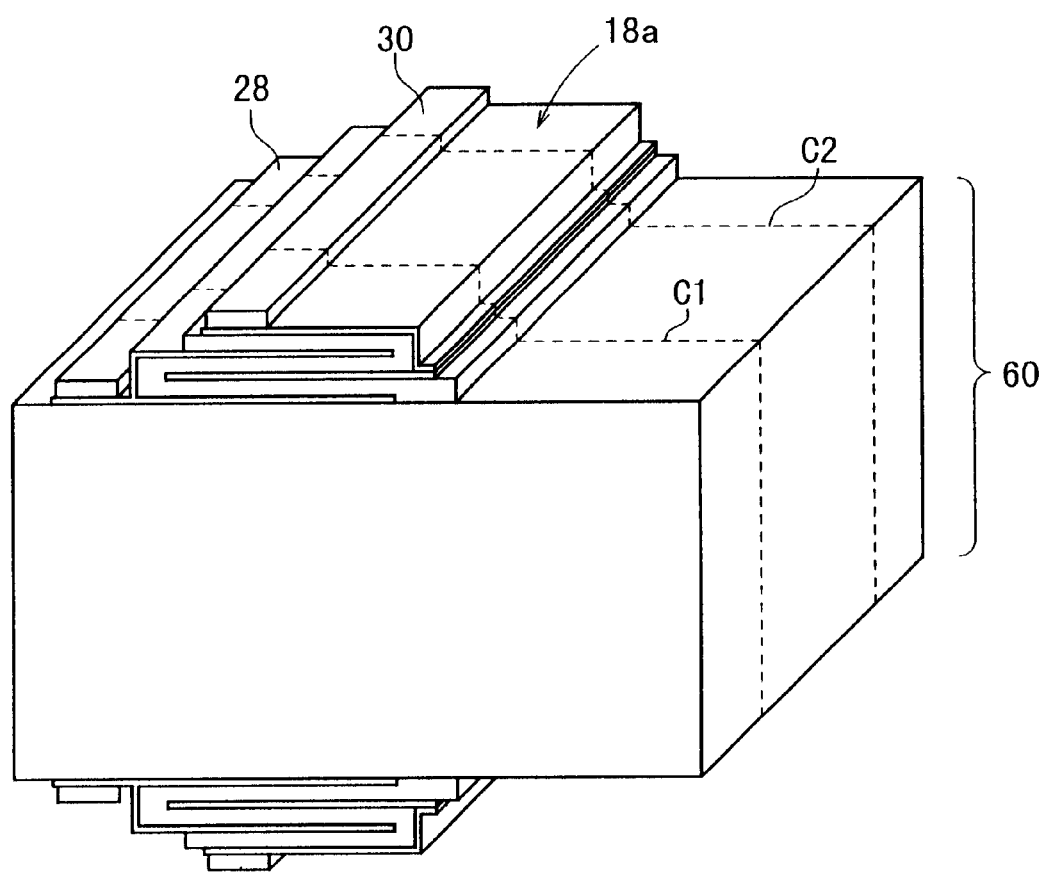
FIG. 18 illustrates a state in the first production method in which the ceramic green laminate is converted into a sintered ceramic laminate, and then a piezoelectric/electrostrictive element is formed on the ceramic laminate.

Subsequently, as shown in FIG. 18, the piezoelectric/electrostrictive elements 18a, 18b are formed respectively on the both surfaces of the ceramic laminate 60, i.e., on the surfaces corresponding to the surfaces at which the ceramic green sheets 52A, 52B are laminated. Those usable as the method for forming the piezoelectric/electrostrictive elements 18a, 18b include the thick film formation method such as the screen printing method, the dipping method, the coating method, and the electrophoresis method, and the thin film formation method such as the ion beam method, the sputtering method, the vacuum vapor deposition, the ion plating method, the chemical vapor deposition method (CVD), and the plating.

When the piezoelectric/electrostrictive elements 18a, 18b are formed by using the film formation method as described above, the piezoelectric/electrostrictive elements 18a, 18b and the thin plate sections 12a, 12b can be integrally joined and arranged without using any adhesive. It is possible to ensure the reliability and the reproducibility, and it is easy to form the stack.

In this case, it is preferable that the piezoelectric/electrostrictive elements 18a, 18b are formed by means of the thick film formation method, because of the following reason. That is, especially, when the piezoelectric/electrostrictive layer 22 is formed by using the thick film formation method, the film can be formed by using, for example, a paste, a slurry, a suspension, an emulsion, or a sol containing a major component of particles or powder of piezoelectric ceramics having an average particle size of 0.01 to 5 $\mu$m, preferably 0.05 to 3 $\mu$m. It is possible to obtain good piezoelectric/electrostrictive characteristics by sintering the formed film.

The electrophoresis method is advantageous in that the film can be formed at a high density with a high shape accuracy. The screen printing method is advantageous to simplify the production step, because it is possible to simultaneously perform the film formation and the pattern formation.

Explanation will be specifically made for the formation of the piezoelectric/electrostrictive elements 18a, 18b. At first, the ceramic green laminate 58 is sintered and integrated into one unit at a temperature of 1200° C. to 1600° C. to obtain the ceramic laminate 60. After that, the first ones of the first electrodes 24 for the thin plate sections 12a, 12b are printed and sintered at predetermined positions on the both surfaces of the ceramic laminate 60. Subsequently, the piezoelectric/electrostrictive layers 22 are printed and sintered. Further, the second electrodes 26, which form the pairs with the first ones of the first electrodes 24, are printed and sintered to form the piezoelectric/electrostrictive elements 18a, 18b by repeating the foregoing steps in a predetermined number of times (when the piezoelectric/electrostrictive element 18a, 18b is composed of the multilayered piezoelectric/electrostrictive layer 22). After that, the terminals 28, 30 are printed and sintered in order to electrically connect the respective electrodes 24, 26 to the driving circuit.

Alternatively, the following process may be available. That is, the first one of the first electrode 24 at the lowermost layer is printed and sintered. The piezoelectric/electrostrictive layer 22 and the first one of the second electrode 26 which forms the pair with the first one of the first electrode 24 are printed and sintered. The printing and the sintering are repeated a predetermined number of times with the foregoing process unit to form the piezoelectric/electrostrictive element 18a, 18b.

In this process, when the materials are selected so that the sintering temperature for each of the members is lowered in accordance with the stacking sequence, for example, when platinum (Pt) is used for the first electrode 24, lead zirconate titanate (PZT) is used for the piezoelectric/electrostrictive layer 22, gold (Au) is used for the second electrode 26, and silver (Ag) is used for the terminals 28, 30, then the material, which has been already sintered beforehand, is not sintered again at a certain sintering stage. Thus, it is possible to avoid the occurrence of inconvenience such as peeling off and aggregation of the electrode material or the like.

When appropriate materials are selected, it is also possible to successively print the respective members of the piezoelectric/electrostrictive elements 18a, 18b and the terminals 28, 30, followed by the sintering one time. Further, it is also possible to provide, for example, the electrode 26 at the outermost layer at a low temperature after forming the piezoelectric/electrostrictive layer 22 at the outermost layer.

Alternatively, the respective members of the piezoelectric/electrostrictive elements 18a, 18b and the terminals 28, 30 may be formed by means of the thin film formation method such as the sputtering method and the vapor deposition method. In this case, it is not necessarily indispensable to perform the heat treatment.

When the piezoelectric/electrostrictive elements 18a, 18b are formed, it is also preferable that the piezoelectric/electrostrictive elements 18a, 18b are previously formed on the both surfaces of the ceramic green laminate 58, i.e., on the respective surfaces of the ceramic green sheets 52A, 52B, and the ceramic green laminate 58 and the piezoelectric/electrostrictive elements 18a, 18b are simultaneously sintered or co-fired. For example, the following methods are available to perform the co-firing. That is, the sintering may be performed for all of the constitutive films of the ceramic green laminate 58 and the piezoelectric/electrostrictive elements 18a, 18b. The first electrodes 24 and the ceramic green laminate 58 may be co-fired, or the other constitutive films except for the second electrodes 26 and the ceramic green laminate 58 may be co-fired.

The following method is available to co-fire the piezoelectric/electrostrictive elements 18a, 18b and the ceramic green laminate 58. That is, precursors of the piezoelectric/electrostrictive layers 22 are formed, for example, in accordance with the tape formation method based on the use of a slurry material. The precursors of the piezoelectric/electrostrictive layers 22 before the sintering are laminated on the surfaces of the ceramic green laminate 58, for example, by means of the thermal securing process under pressure, followed by the co-firing to simultaneously produce the movable sections 20a, 20b, the thin plate sections 12a, 12b, the piezoelectric/electrostrictive layers 22, and the fixation section 14. However, in this method, it is necessary to form the electrodes 24 beforehand on the surfaces of the ceramic green laminate 58 and/or on the piezoelectric/electrostrictive layers 22 by using the film formation method described above.

Another method is also available. That is, the electrodes 24, 26 and the piezoelectric/electrostrictive layers 22, which are the respective constitutive layers of the piezoelectric/electrostrictive elements 18a, 18b, are formed by means of the screen printing on portions to be finally formed into at least the thin plate sections 12a, 12b of the ceramic green laminate 58, followed by the co-firing.

The sintering temperature for the constitutive film of the piezoelectric/electrostrictive element 18a, 18b is appropriately determined depending on the material for constructing the same. However, the sintering temperature is generally 500° C. to 1500° C. The sintering temperature is preferably 1000° C. to 1400° C. for the piezoelectric/electrostrictive layer 22. In this case, in order to control the composition of the piezoelectric/electrostrictive layer 22, the sintering is preferably performed in the presence of an evaporation source of the material of the piezoelectric/electrostrictive layer 22. When the piezoelectric/electrostrictive layers 22 and the ceramic green laminate 58 are co-fired, it is necessary to conform the sintering conditions of the both. The piezoelectric/electrostrictive element 18a, 18b is not necessarily formed on the both surfaces of the ceramic laminate 60 or the ceramic green laminate 58. It is of course allowable to form the piezoelectric/electrostrictive element 18a, 18b on only one surface.

Subsequently, unnecessary portions are cut off from the ceramic laminate 60 formed with the piezoelectric/electrostrictive elements 18a, 18b as described above. The cutoff positions are located at side portions of the ceramic laminate 60, especially at portions at which the hole 42 based on the window 54 is formed on the side surfaces of the ceramic laminate 60 by means of the cutoff (see cutting lines C1 and C2).

Figure 19:
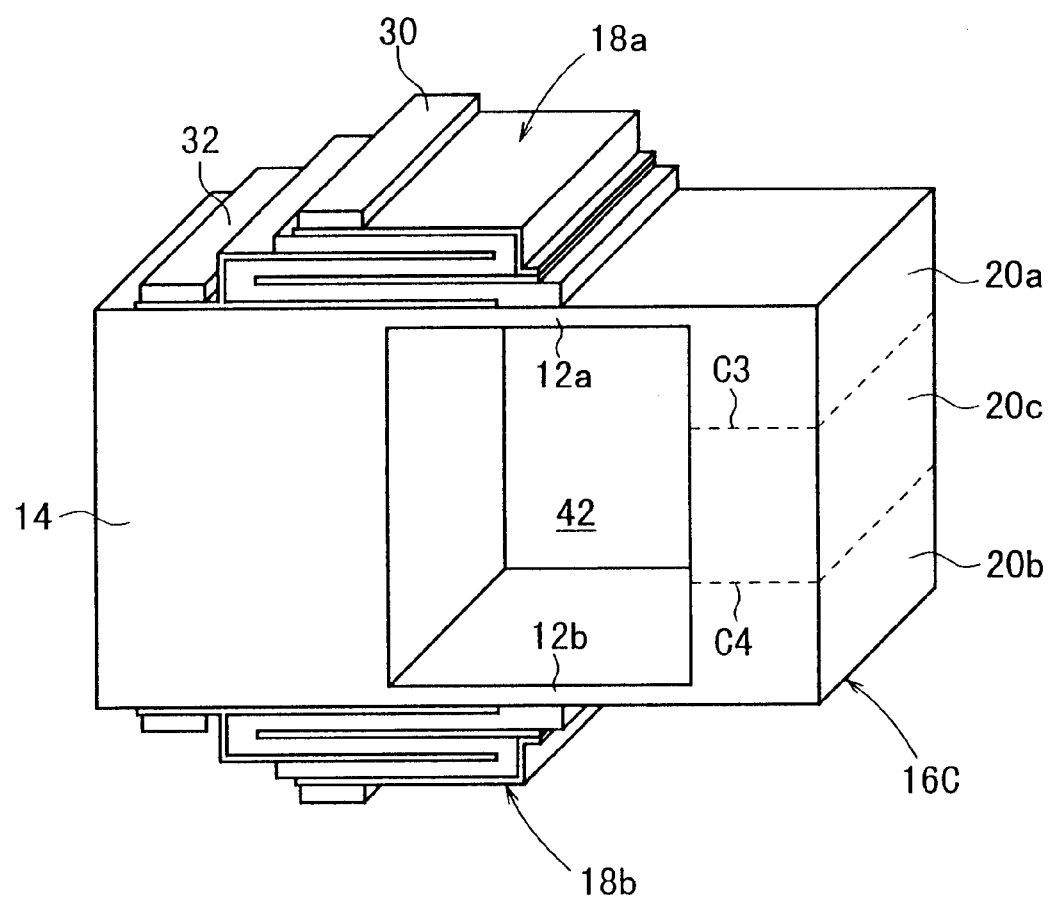
FIG. 19 illustrates an intermediate process in the first production method in which the ceramic laminate is cut along predetermined cutting lines to provide the piezoelectric/electrostrictive device according to the embodiment of the present invention.

Subsequently, as shown in FIG. 19, a central portion 20c of the portion to be formed into the movable sections 20a, 20b is cut and removed along cutting lines C3 and C4 to produce the piezoelectric/electrostrictive device 10 comprising the piezoelectric/electrostrictive elements 18a, 18b formed on the ceramic substrate 16C integrated with the movable sections 20a, 20b, the thin plate sections 12a, 12b, and the fixation section 14. Those applicable as the cutoff method include the mechanical machining such as the dicing machining and the wire saw machining as well as the electron beam machining and the laser machining based on the use of, for example, the YAG laser and the excimer laser.

When the ceramic substrate 16C is cut off, the machining may be performed by combining the machining methods described above. For example, the wire saw machining is preferably performed for the cutting lines C1 and C2 (see FIG. 18). The dicing machining is preferably performed for the end surfaces 34a, 34b of the movable sections 20a, 20b and the fixation section 14 perpendicular to the cutting lines C1 and C2.

Figure 20A:
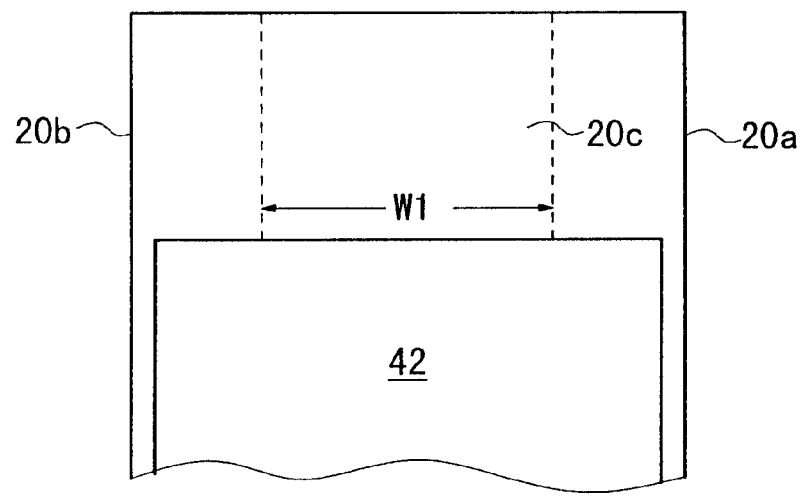
FIG. 20A illustrates a state in which the internal residual stress is generated in the thin plate section and the piezoelectric/electrostrictive layer.

In the first production method for the piezoelectric/electrostrictive device 10 described above, the piezoelectric/electrostrictive elements 18a, 18b are formed on the thin plate sections 12a, 12b by means of the integrated sintering. Therefore, as shown in FIG. 20A, for example, the thin plate sections 12a, 12b and the piezoelectric/electrostrictive elements 18a, 18b are slightly displaced to be convex toward the hole 42, giving a state in which the strain is generated in shape, for example, due to the shrinkage of the piezoelectric/electrostrictive layers 22 caused during the sintering and the difference in coefficient of thermal expansion among the pair of electrodes 24, 26, the piezoelectric/electrostrictive layers 22, and the thin plate sections 12a, 12b. As a result, the internal residual stress tends to arise in the piezoelectric/electrostrictive elements 18a, 18b (especially in the piezoelectric/electrostrictive layers 22) and in the thin plate sections 12a, 12b.

The internal residual stress in the thin plate sections 12a, 12b and the piezoelectric/electrostrictive layers 22 is generated when the integrated sintering is performed as described above as well as when separate members of the piezoelectric/electrostrictive elements 18a, 18b are bonded to the thin plate sections 12a, 12b, for example, with an adhesive. That is, the internal residual stress is generated in the thin plate sections 12a, 12b and the piezoelectric/electrostrictive layers 22 due to the curing and shrinkage of the adhesive or the like when the adhesive is immobilized or cured. When the heating is required for the immobilization or the curing, the internal residual stress is increased.

If the piezoelectric/electrostrictive device 10 is used in this state, the movable sections 20a, 20b do not exhibit any desired displacement in some cases, even when the predetermined electric field is applied to the piezoelectric/electrostrictive layers 22, because of the following reason. That is, the material characteristic of the piezoelectric/electrostrictive layers 22 and the displacement action of the movable sections 20a, 20b are inhibited by the internal residual stress generated in the thin plate sections 12a, 12b and the piezoelectric/electrostrictive layers 22.

In the first production method, as shown in FIG. 20A, the central portion 20c of the movable section 20a, 20b is cut off by a predetermined width W1 (for example, 100 μm).

Figure 20B:
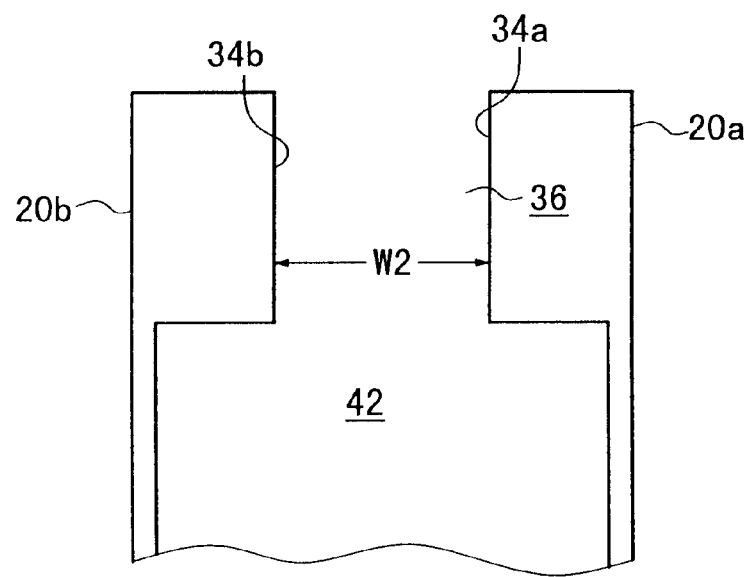
FIG. 20B illustrates a state in which a central portion of a movable section is cut off.

When the central portion 20c is cut off, the mutually opposing end surfaces 34a, 34b are formed for the movable sections 20a, 20b as shown in FIG. 20B. The end surfaces 34a, 34b are moved to make approach to one another by the internal residual stress having been generated in the thin plate sections 12a, 12b and the piezoelectric/electrostrictive layers 22. The width between the respective end surfaces 34a, 34b after the movement is, for example, a second predetermined width W2 (for example, 30 μm) which is shorter than the predetermined width W1.

More specifically, the second predetermined width W2 is shorter at forward end portions.

Figure 11:
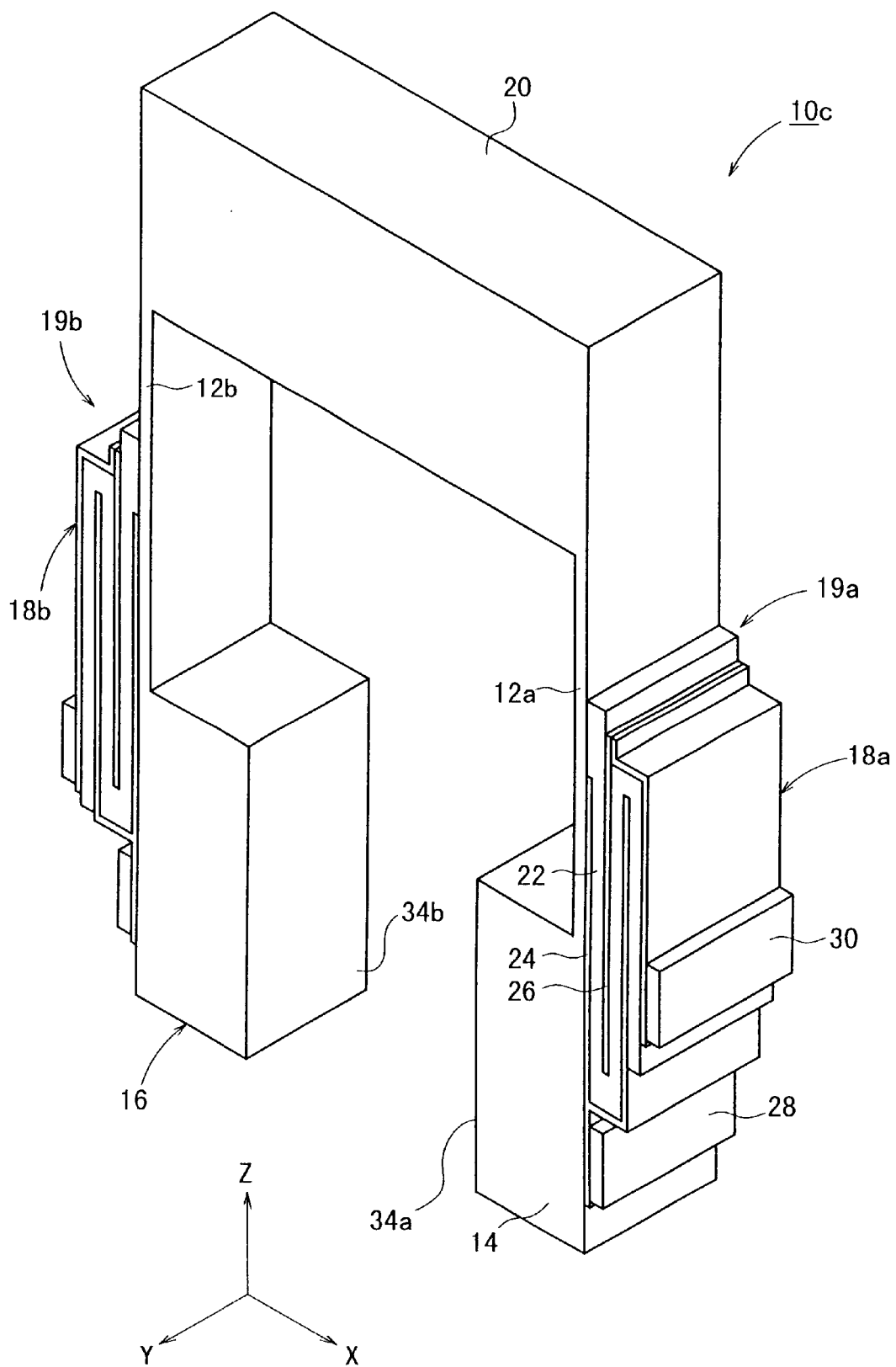
FIG. 11 shows a perspective view illustrating a third modified embodiment of the piezoelectric/electrostrictive device according to the embodiment of the present invention.
Figure 12:
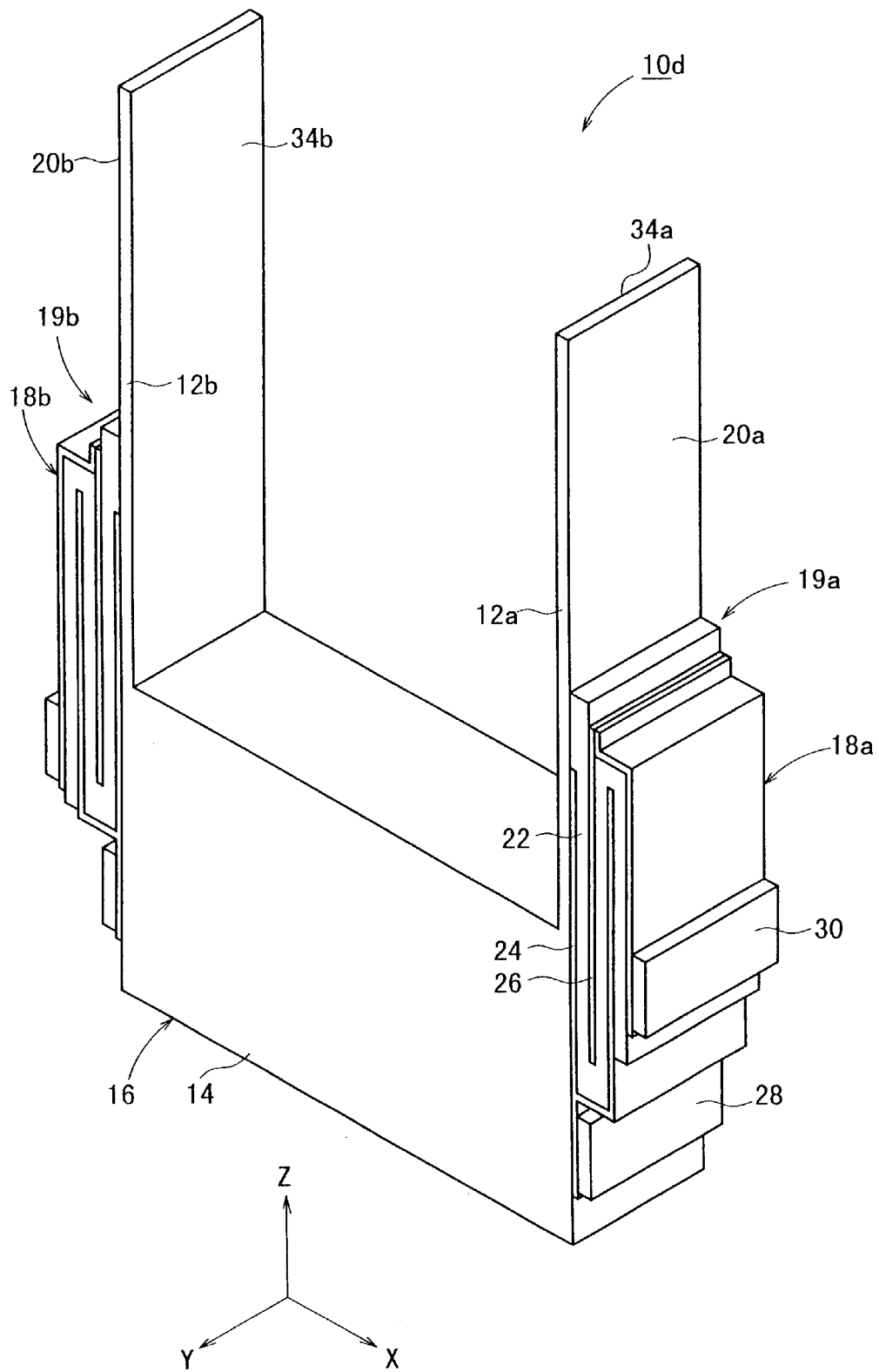
FIG. 12 shows a perspective view illustrating a fourth modified embodiment of the piezoelectric/electrostrictive device according to the embodiment of the present invention.

The movement of the end surfaces 34a, 34b results from the release of the internal residual stress having been generated in the thin plate sections 12a, 12b and the piezoelectric/electrostrictive layers 22. When the piezoelectric/electrostrictive device 10 is used in a state in which the internal residual stress is released, then the movable sections 20a, 20b exhibit the displacement action as approximately designed, and the good device characteristic is exhibited. This effect is equivalently obtained when a part of the portion to be formed into the fixation section 14 is cut off to form the mutually opposing end surfaces 34a, 34b for the fixation section 14, for example, as shown in FIG. 11. In this case, the internal residual stress, which has been generated in the thin plate sections 12a, 12b and the piezoelectric/electrostrictive layers 22, is released by the movement of the mutually opposing end surfaces 34a, 34b formed for the fixation section 14. The mutually opposing end surfaces 34a, 34b are not necessarily formed by cutting off the central portion of the movable section 20a, 20b or the fixation section 14. An equivalent effect is also obtained even when the mutually opposing end surfaces 34a, 34b are formed by cutting a portion deviated from the center.

When the cutoff as shown in FIG. 18 and the cutoff as shown in FIG. 19 are performed, it is preferable that the heat treatment is performed at 300° C. to 800° C. after the cutoff, because of the following reason. That is, any defect such as microcrack tends to occur in the piezoelectric/electrostrictive device 10 as a result of the machining, while the defect can be removed by means of the heat treatment described above, and the reliability is improved. Further, it is preferable to apply the aging treatment by being left to stand for at least about 10 hours at a temperature of about 80° C. after the heat treatment, because of the following reason. That is, when the aging treatment is performed, for example, the various stresses, which have been exerted during the production process, can be further mitigated to contribute to the improvement in characteristic.

Figure 21:
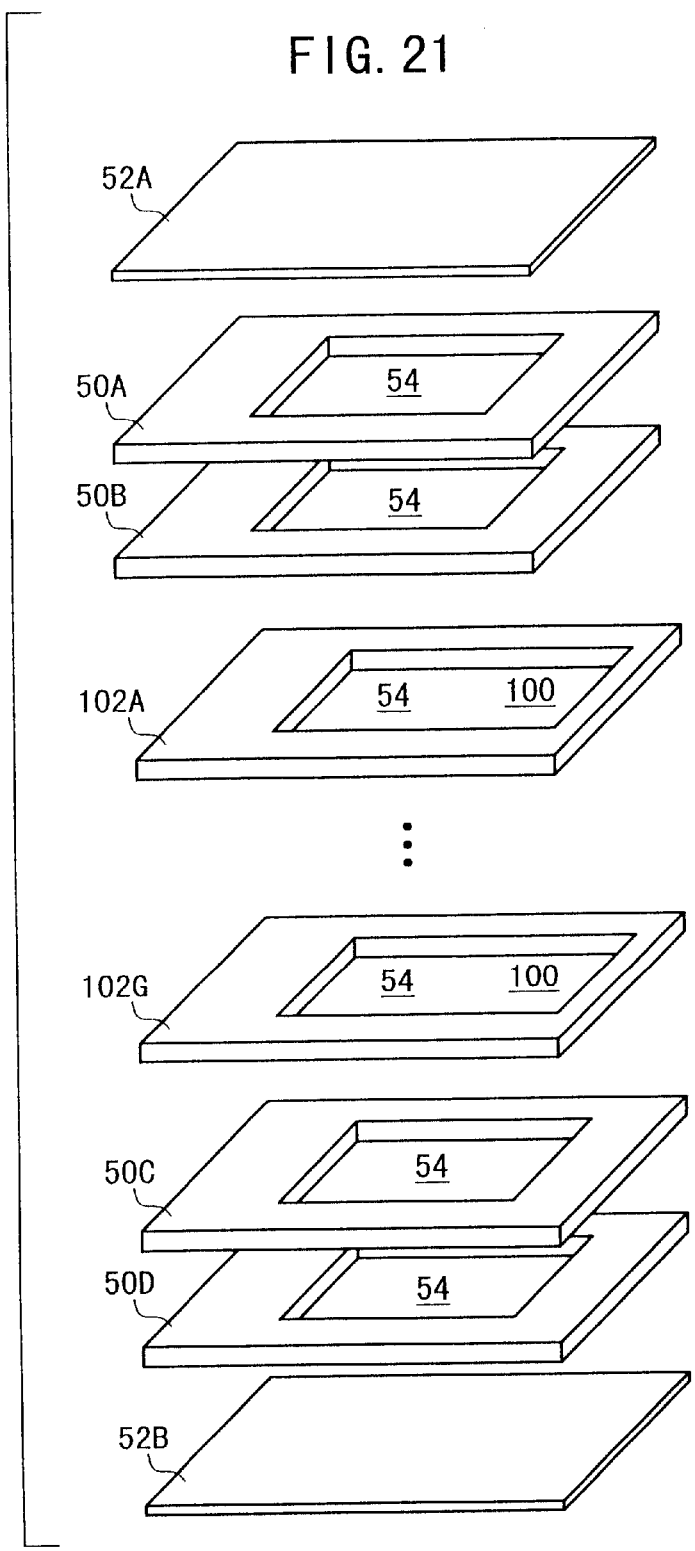
FIG. 21 illustrates a process for laminating ceramic green sheets required for a second production method.

Next, a second production method will be explained with reference to FIGS. 21 to 24. At first, as shown in FIG. 21, a plurality (for example, four) of ceramic green sheets 50A to 50D each of which is formed with a window 54 for forming at least the space between the thin plate sections 12a, 12b, a plurality (for example, seven) of ceramic green sheets 102A to 102G each of which is continuously formed with a window 54 for forming the space between the thin plate sections 12a, 12b and a window 100 for forming the movable sections 20a, 20b having the mutually opposing end surfaces 34a, 34b, and a plurality (for example, two) of ceramic green sheets 52A, 52B to be formed into the thin plate sections 12a, 12b thereafter are prepared.

Figure 22:
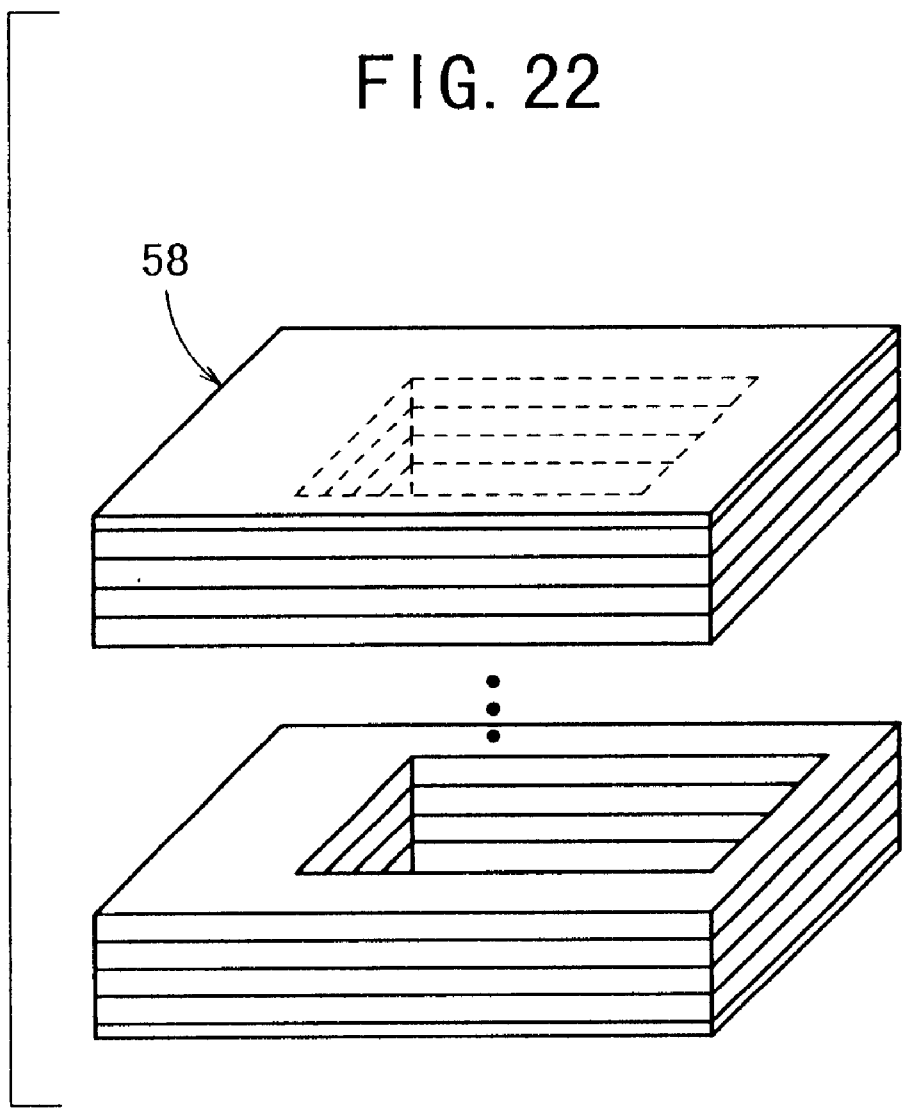
FIG. 22 illustrates a state in the second production method in which a ceramic green laminate is formed.

After that, as shown in FIG. 22, the ceramic green sheets 50A to 50D, 52A, 52B,. 102A to 102G are laminated and secured under pressure so that the ceramic green sheets 50A to 50D, 102A to 102G are interposed between the ceramic green sheets 52A, 52B to form a ceramic green laminate 58. The lamination is performed while the ceramic green sheets 102A to 102G are positioned at the center. During this process, there may be portions on which no pressure is applied during the securing under pressure, due to the presence of the window 100. Therefore, for example, it is necessary that the order of the lamination and the pressure-securing is changed so that such portions do not appear. This procedure is also significant in third and fourth production methods described later on. After that, the ceramic green laminate 58 is sintered to obtain a ceramic laminate 60 (see FIG. 23).

Figure 23:
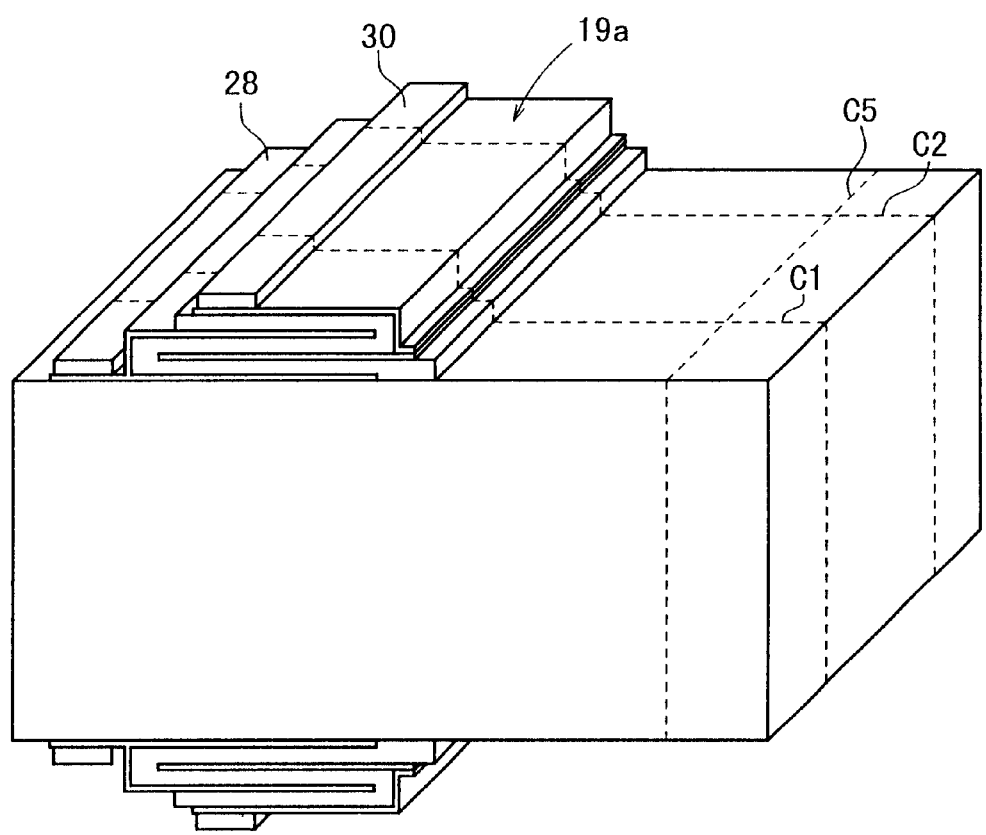
FIG. 23 illustrates a state in the second production method in which the ceramic green laminate is converted into a sintered ceramic laminate, and then a piezoelectric/electrostrictive element is formed on the ceramic laminate.

Subsequently, as shown in FIG. 23, the piezoelectric/electrostrictive elements 18a, 18b having the multilayered structure are formed respectively on the both surfaces of the ceramic laminate 60, i.e., on the surfaces corresponding to the surfaces at which the ceramic green sheets 52A, 52B are laminated respectively. The piezoelectric/electrostrictive elements 18a, 18b are integrated into the ceramic laminate 60 by means of the sintering. Of course, it is allowable to form the piezoelectric/electrostrictive element 18 on only one side surface. This fact also holds for the third and fourth production methods described later on.

Figure 24:
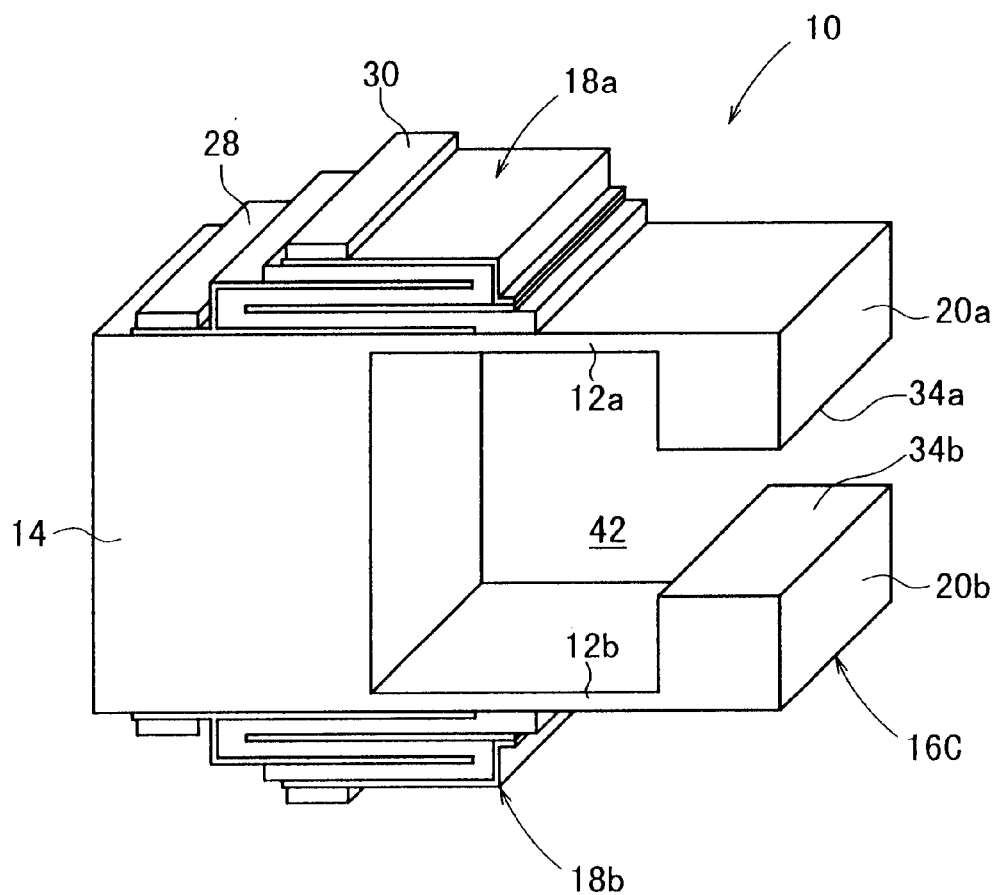
FIG. 24 illustrates a state in the second production method in which the ceramic laminate is cut along predetermined cutting lines to provide the piezoelectric/electrostrictive device according to the embodiment of the present invention.

Subsequently, the ceramic laminate 60, which is formed with the piezoelectric/electrostrictive elements 18a, 18b, is cut along cutting lines C1, C2, C5 to thereby cut off side portions and forward end portions of the ceramic laminate 60. As a result of the cutoff, as shown in FIG. 24, the piezoelectric/electrostrictive device 10 is obtained, which is formed with the movable sections 20a, 20b having the mutually opposing end surfaces 34a, 34b in which the piezoelectric/electrostrictive elements 18a, 18b are formed on the ceramic substrate 16C. The following cutting sequence is given as an example. That is, the ceramic laminate 60 may be cut along the cutting lines C1 and C2, and then it may be cut along the cutting line C5. Alternatively, the ceramic laminate 60 may be cut along the cutting line C5, and then it may be cut along the cutting lines C1 and C2. Of course, it is also preferable to perform the foregoing cutting procedures at the same time. The end of the fixation section 14, which is opposed to the cutting line C5, may be appropriately cut.

In the second production method, the piezoelectric/electrostrictive elements 18a, 18b are formed on the ceramic substrate 16C simultaneously with the cutoff of the unnecessary portions from the ceramic laminate 60, making it possible to obtain the piezoelectric/electrostrictive device 10 formed with the movable sections 20a, 20b having the mutually opposing end surfaces 34a, 34b. Accordingly, it is possible to simplify the production steps. Further., it is possible to improve the yield of the piezoelectric/electrostrictive device 10. In this procedure, it is especially preferable that a plurality of piezoelectric/electrostrictive devices 10 are arranged in the vertical direction and in the lateral direction respectively on an identical substrate to produce a large number of piezoelectric/electrostrictive devices 10 in accordance with identical steps, because of the following reason. That is, a large number of individuals are easily dealt with in the identical step concerning the formation of the end surfaces 34a, 34b as compared with the first production method.

Figure 25:
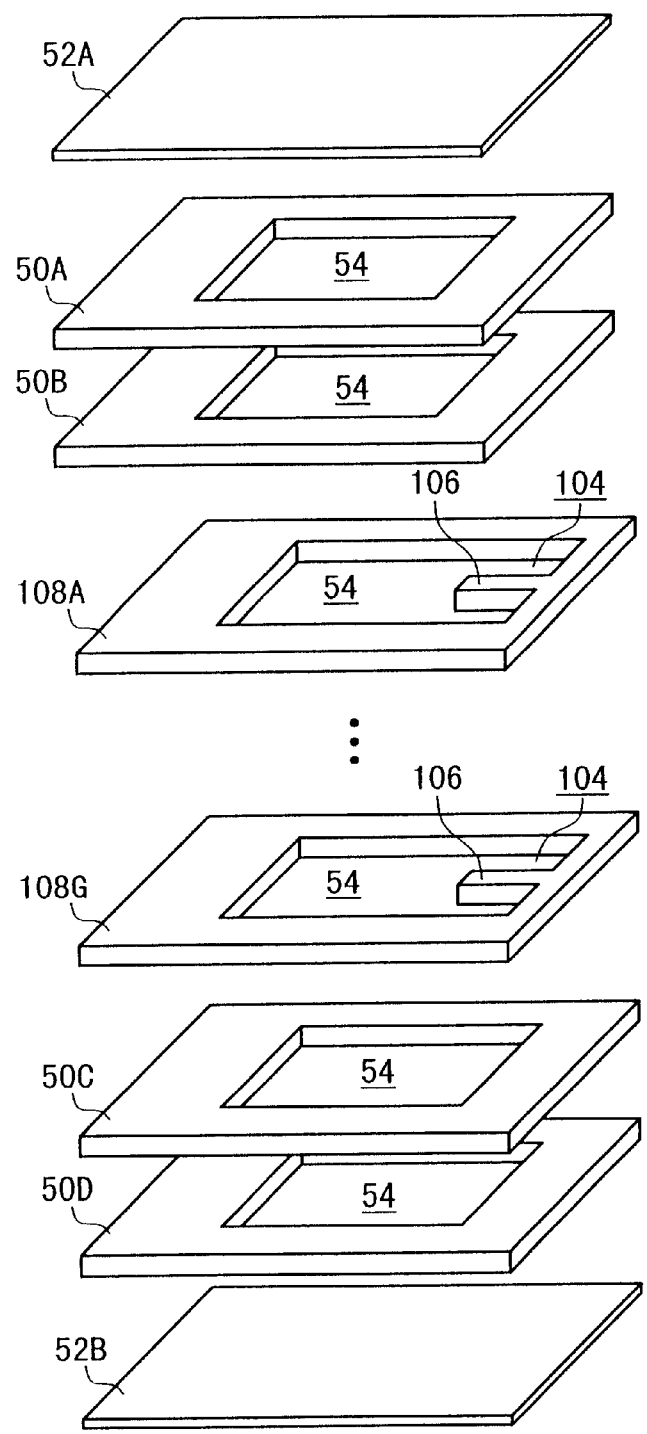
FIG. 25 illustrates a process for laminating ceramic green sheets required for a third production method.

Next, a third production method will be explained with reference to FIGS. 25 to 28. At first, as shown in FIG. 25, a plurality (for example, four) of ceramic green sheets 50A to 50D each of which is formed with a window 54 for forming at least the space between the thin plate sections 12a, 12b, a plurality (for example, seven) of ceramic green sheets 108A to 108G each of which is continuously formed with a window 54 for forming the space between the thin plate sections 12a, 12b and a window 104 for forming a portion 20D (see FIG. 28) to be formed into the movable sections 20a, 20b with the mutually opposing end surfaces 34a, 34b partially connected to one another and which is formed with a projection 106 partially protruding toward the window 54, and a plurality (for example, two) of ceramic green sheets 52A, 52B to be formed into the thin plate sections 12a, 12b thereafter are prepared.

Figure 26:
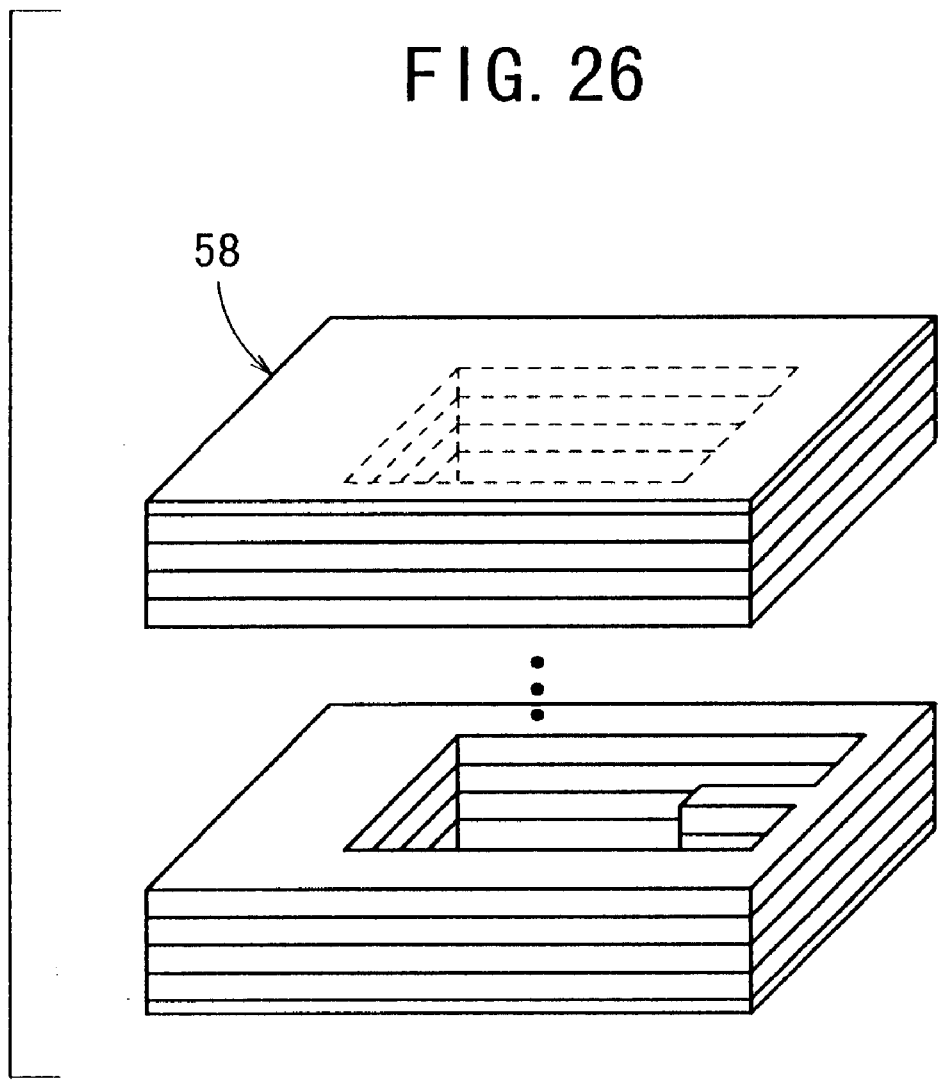
FIG. 26 illustrates a state in the third production method in which a ceramic green laminate is formed.

After that, as shown in FIG. 26, the ceramic green sheets 50A to 50D, 52A, 52B, 108A to 108G are laminated and secured under pressure so that the ceramic green sheets 50A to 50D, 108A to 108G are interposed between the ceramic green sheets 52A, 52B to form a ceramic green laminate 58. The lamination is performed while the ceramic green sheets 108A to 108G are positioned at the center. After that, the ceramic green laminate 58 is sintered to obtain a ceramic laminate 60 (see FIG. 27).

Figure 27:
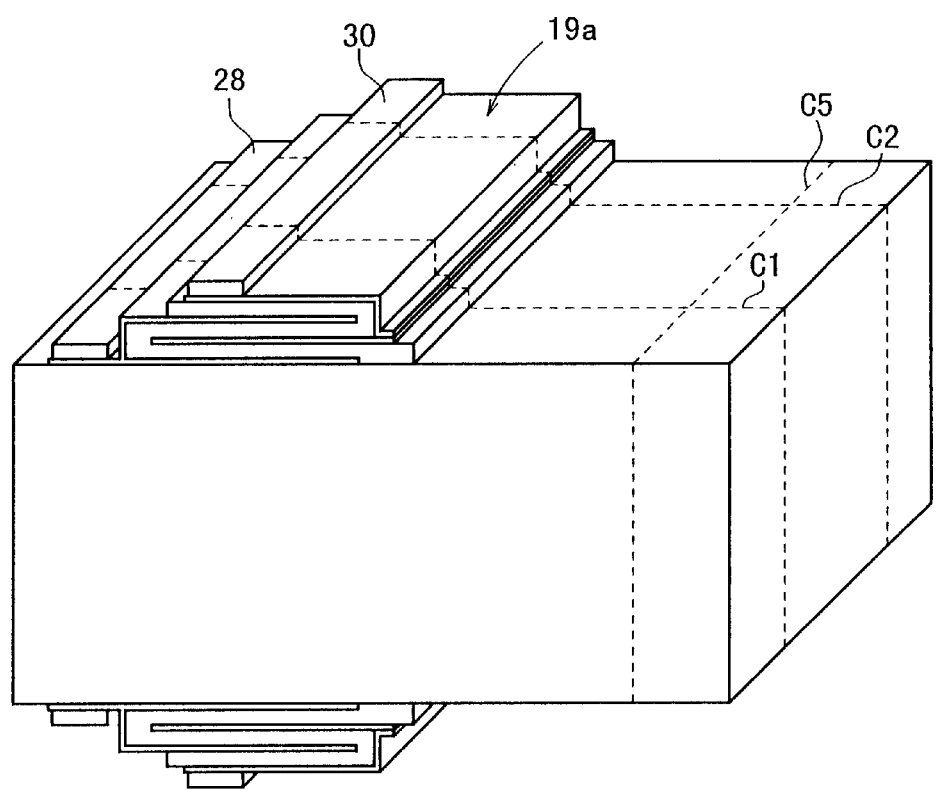
FIG. 27 illustrates a state in the third production method in which the ceramic green laminate is converted into a sintered ceramic laminate, and then a piezoelectric/electrostrictive element is formed on the ceramic laminate.

Subsequently, as shown in FIG. 27, the piezoelectric/electrostrictive elements 18a, 18b having the multilayered structure are formed respectively on the both surfaces of the ceramic laminate 60, i.e., on the surfaces corresponding to the surfaces at which the ceramic green sheets 52A, 52B are laminated. The piezoelectric/electrostrictive elements 18a, 18b are integrated into the ceramic laminate 60 by means of the sintering.

Figure 28:
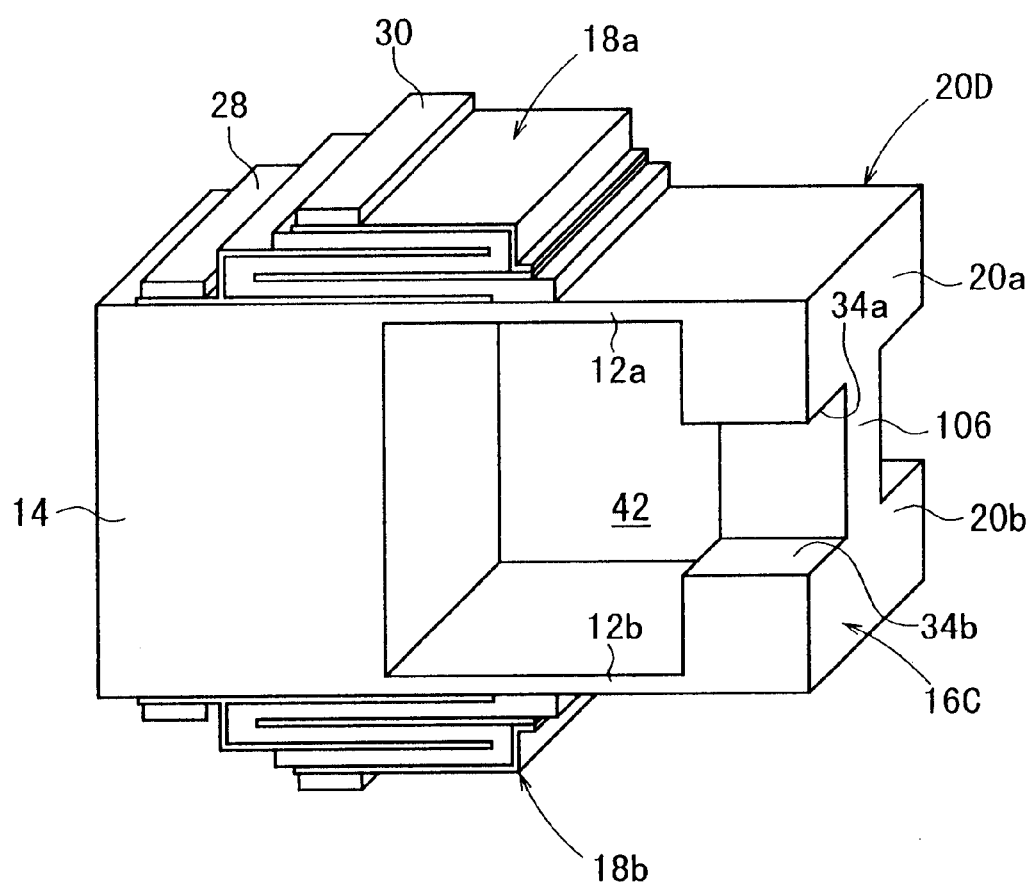
FIG. 28 illustrates an intermediate process in the third production method in which the ceramic laminate is cut along predetermined cutting lines to provide the piezoelectric/electrostrictive device according to the embodiment of the present invention.

Subsequently, the ceramic laminate 60, which is formed with the piezoelectric/electrostrictive elements 18a, 18b, is cut along cutting lines C1, C2, C5 to thereby cut off side portions and forward end portions of the ceramic laminate 60. As a result of the cutoff, as shown in FIG. 28, the fixation section 14, the thin plate sections 12a, 12b, and the piezoelectric/electrostrictive elements 18a, 18b are formed. However, the portion 20D to be formed into the movable sections 20a, 20b is in a state in which the mutually opposing end surfaces 34a, 34b are partially connected to one another by the projection 106.

Subsequently, the projection 106, which partially connects the mutually opposing end surfaces 34a, 34b, is cut off to produce the piezoelectric/electrostrictive device 10 in which the piezoelectric/electrostrictive elements 18a, 18b are formed on the ceramic substrate 16C integrated with the movable sections 20a, 20b, the thin plate sections 12a, 12b, and the fixation section 14.

In the third production method, it is enough that the slender projection 106, which partially connects the mutually opposing end surfaces 34a, 34b, is cut off at the final stage. Accordingly, the cutoff procedure can be performed easily and reliably, and thus it is possible to simplify the production steps. Further, it is possible to improve the yield of the piezoelectric/electrostrictive device 10.

Figure 29:
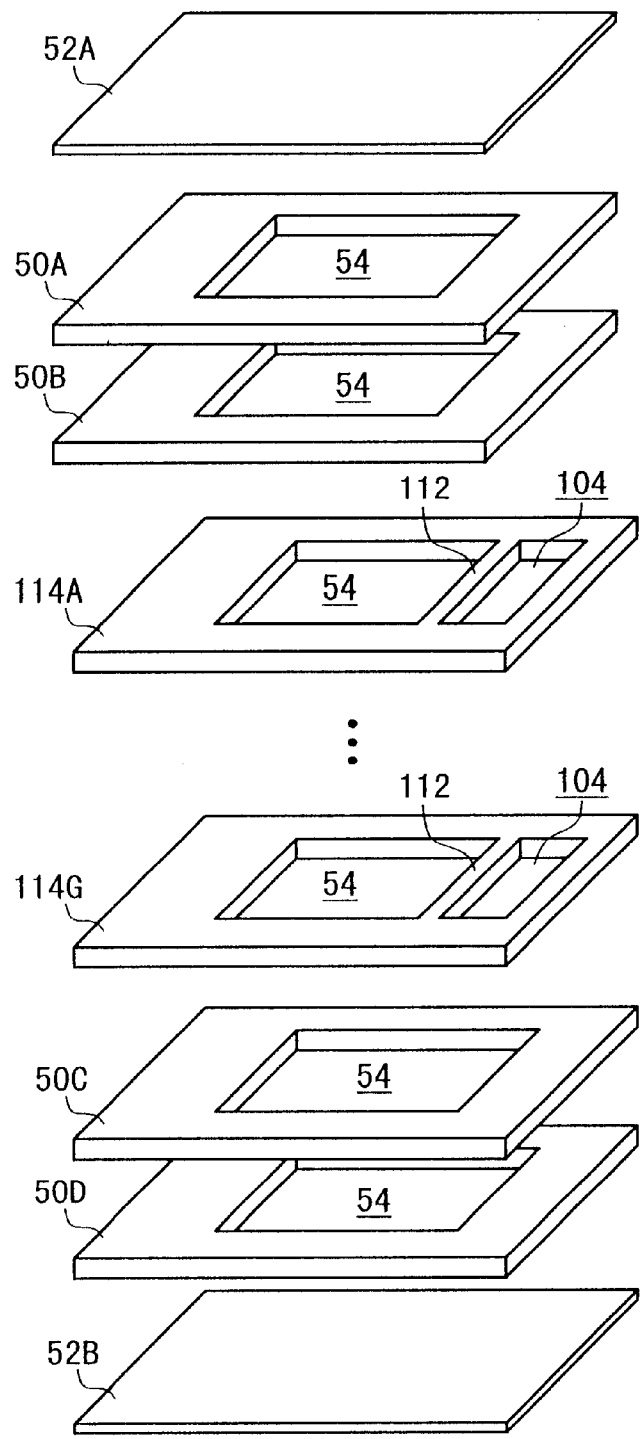
FIG. 29 illustrates a process for laminating ceramic green sheets required for a fourth production method.

Next, a fourth production method will be explained with reference to FIGS. 29 to 32. At first, as shown in FIG. 29, a plurality (for example, four) of ceramic green sheets 50A to 50D each of which is formed with a window 54 for forming at least the space between the thin plate sections 12a, 12b, a plurality (for example, seven) ceramic green sheets 114A to 114G each of which is formed with a window 54 for forming the space between the thin plate sections 12a, 12b and a window 104 for forming a portion 20D (see FIG. 32) to be formed into the movable sections 20a, 20b with the mutually opposing end surfaces 34a, 34b partially connected to one another and which is formed with a crosspiece 112 to separate the window 54 and the window 104 from each other, and a plurality (for example, two) of ceramic green sheets 52A, 52B to be formed into the thin plate sections 12a, 12b thereafter are prepared.

Figure 30:
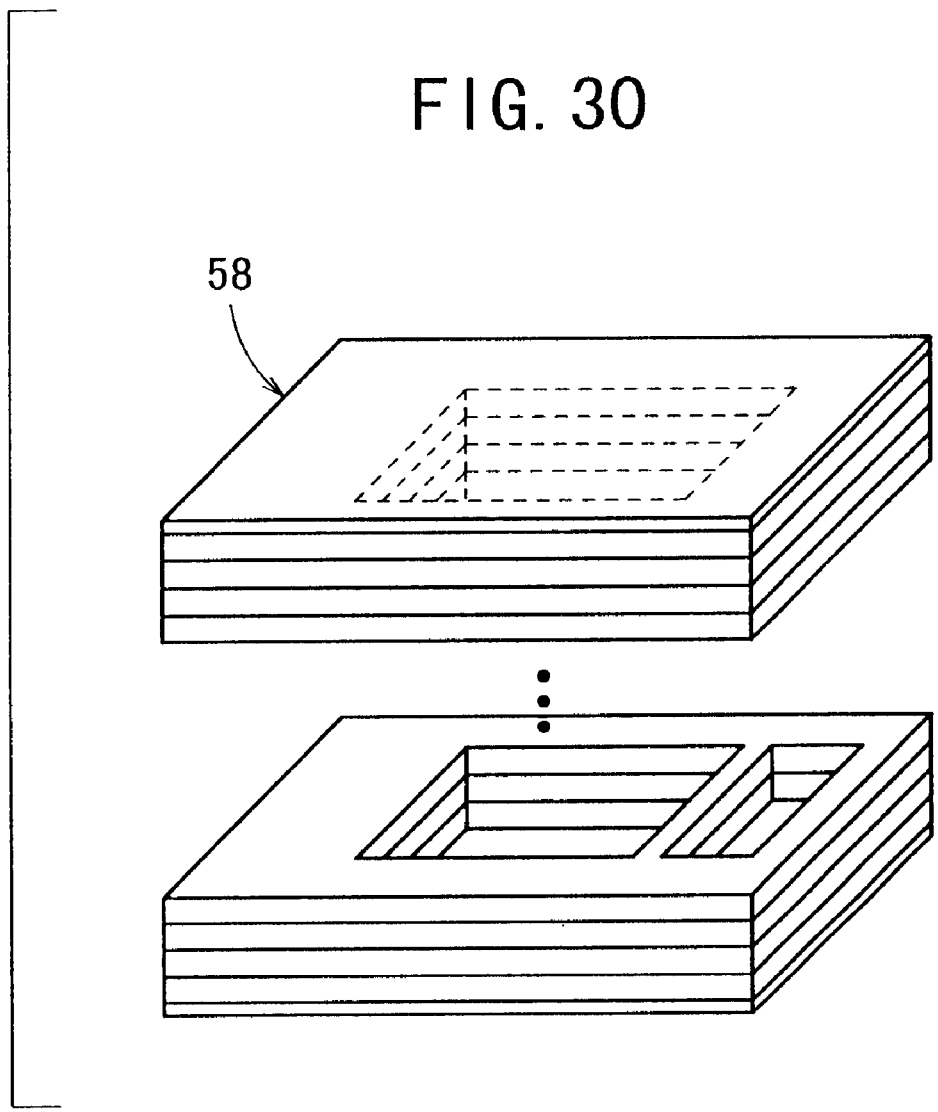
FIG. 30 illustrates a state in the fourth production method in which a ceramic green laminate is formed.

After that, as shown in FIG. 30, the ceramic green sheets 50A to 50D, 52A, 52B, 114A to 114G are laminated and secured under pressure so that the ceramic green sheets 50A to 50D, 114A to 114G are interposed between the ceramic green sheets 52A, 52B to form a ceramic green laminate 58. The lamination is performed while the ceramic green sheets 114A to 114G are positioned at the center. After that, the ceramic green laminate 58 is sintered to obtain a ceramic laminate 60 (see FIG. 31).

Figure 31:
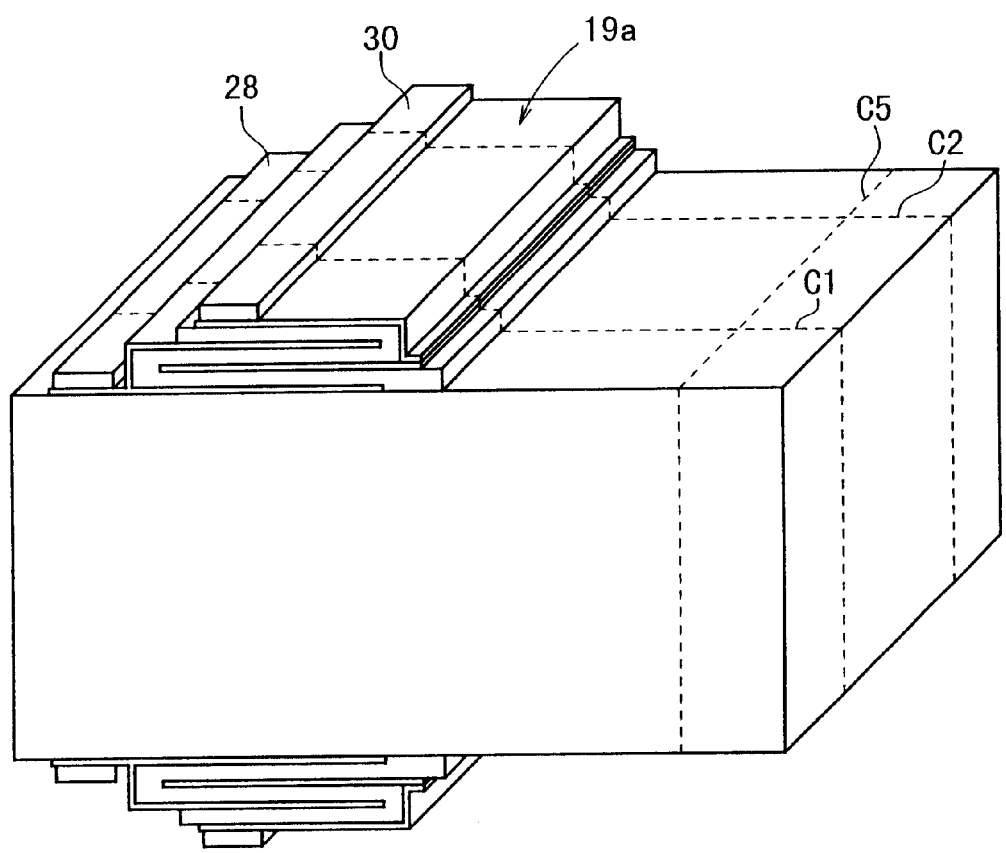
FIG. 31 illustrates a state in the fourth production method in which the ceramic green laminate is converted into a sintered ceramic laminate, and then a piezoelectric/electrostrictive element is formed on the ceramic laminate.

Subsequently, as shown in FIG. 31, the piezoelectric/electrostrictive elements 18a, 18b having the multilayered structure are formed respectively on the both surfaces of the ceramic laminate 60, i.e., on the surfaces corresponding to the surfaces at which the ceramic green sheets 52A, 52B are laminated. The piezoelectric/electrostrictive elements 18a, 18b are integrated into the ceramic laminate 60 by means of the sintering.

Figure 32:
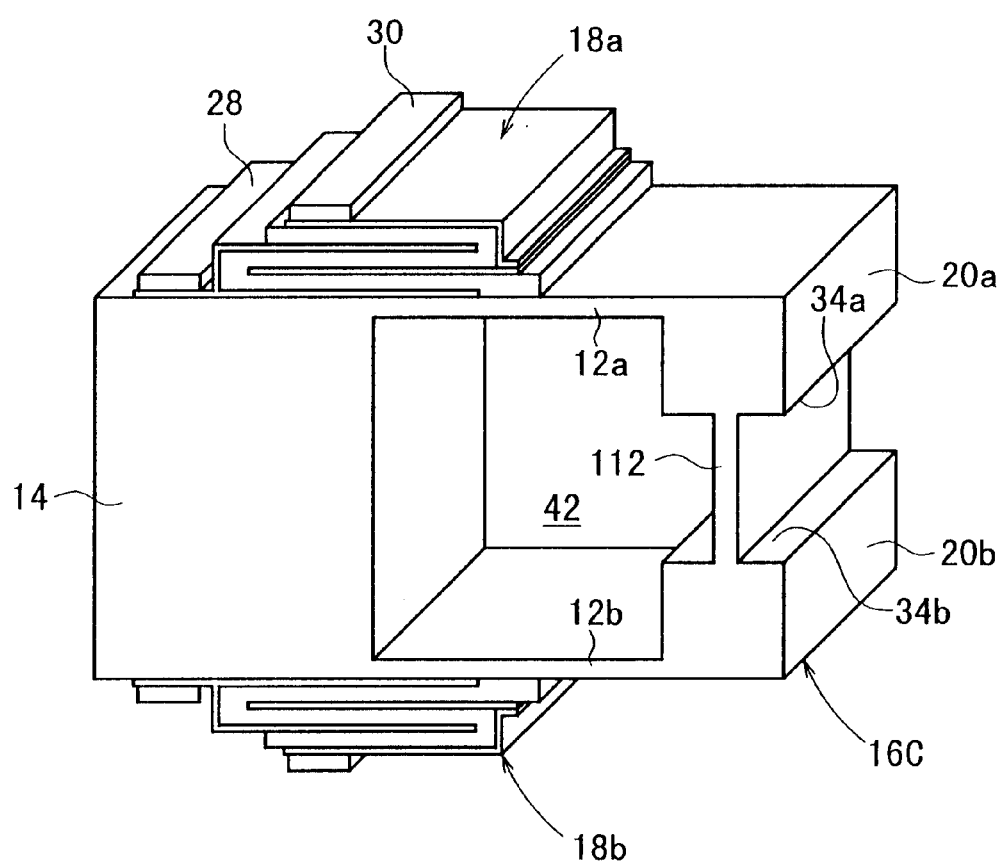
FIG. 32 illustrates an intermediate process in the fourth production method in which the ceramic laminate is cut along predetermined cutting lines to provide the piezoelectric/electrostrictive device according to the embodiment of the present invention.

Subsequently, the ceramic laminate 60, which is formed with the piezoelectric/electrostrictive elements 18a, 18b, is cut along cutting lines C1, C2, C5 to thereby cut off side portions and forward end portions of the ceramic laminate 60. As a result of the cutoff, as shown in FIG. 32, the fixation section 14, the thin plate sections 12a, 12b, and the piezoelectric/electrostrictive elements 18a, 18b are formed. However, the portion 20D to be formed into the movable sections 20a, 20b is in a state in which the mutually opposing end surfaces 34a, 34b are partially connected to one another by the crosspiece 112.

Subsequently, the crosspiece 112, which partially connects the mutually opposing end surfaces 34a, 34b, is cut off to produce the piezoelectric/electrostrictive device 10 in which piezoelectric/electrostrictive elements 18a, 18b are formed on the ceramic substrate 16C integrated with the movable sections 20a 20b, thin plate sections 12a, 12b, and the fixation section 14.

In the fourth production method, it is enough that the crosspiece 112, which partially connects the mutually opposing end surfaces 34a, 34b, is cut off at the final stage. Accordingly, the cutoff procedure can be performed easily and reliably, and thus it is possible to simplify the production steps. Further, it is possible to improve the yield of the piezoelectric/electrostrictive device 10.

The embodiments described above are illustrative of the case in which the movable sections 20a, 20b, the fixation section 14, and the thin plate sections 12a, 12b are constructed by the ceramic substrate 16C. Alternatively, each of the parts may be made of a metal material. Further alternatively, each of the parts may be made to provide a hybrid structure obtain ed by combining those produced with materials of ceramics and metal. In this case in order to join the metal materials to one another and/or join the ceramic and metal materials to one another, it is possible to use adhesion with organic resin or glass, brazing, soldering, eutectic bonding, or welding.

Explanation will be made with reference to FIGS. 33 to 40, for example, for production methods (fifth and sixth production methods) for a piezoelectric/electrostrictive device (piezoelectric/electrostrictive device 10h according to an eighth modified embodiment) having the hybrid structure in which the movable sections 20a, 20b and the fixation section 14 are made of ceramics, and the thin plate sections 12a, 12b are made of metal. Therefore, the substrate containing metal and ceramics, which is produced by the fifth and sixth production methods, is referred to as the substrate 16D.

Figure 33:
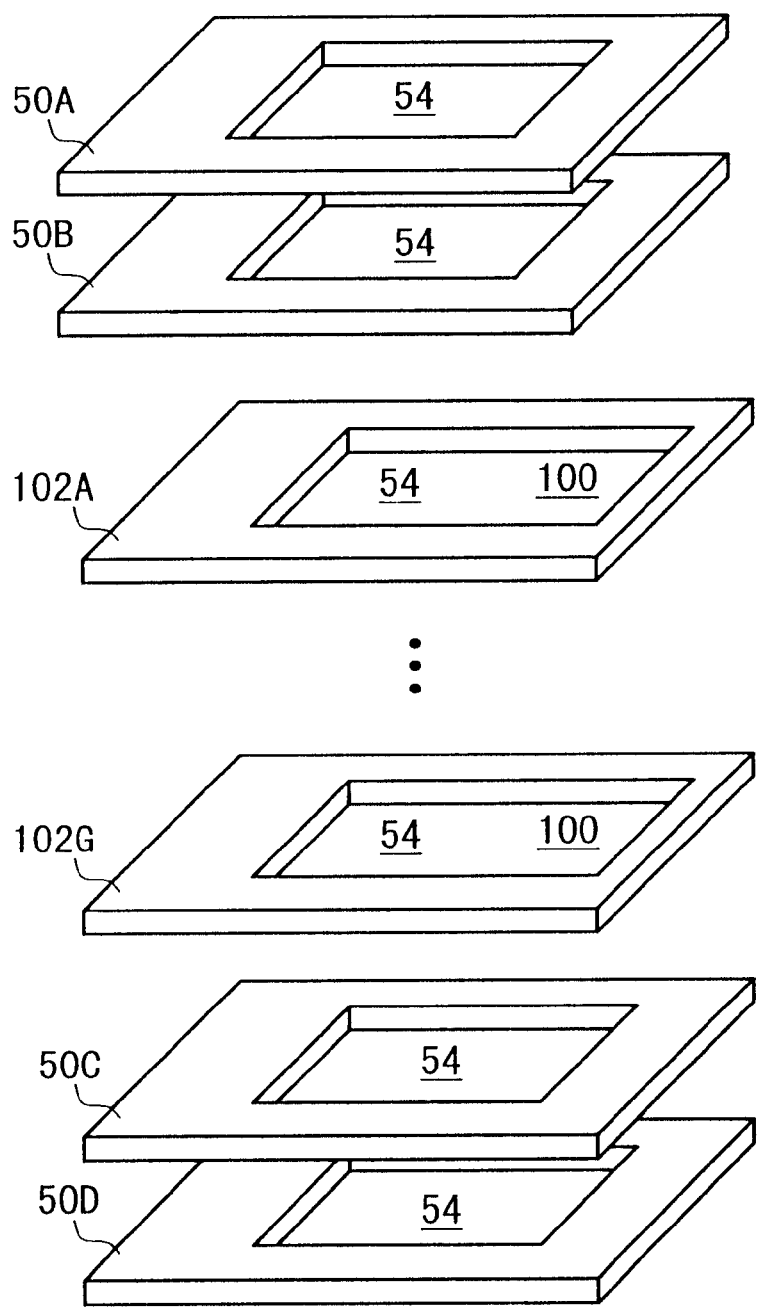
FIG. 33 illustrates a process for laminating ceramic green sheets required for a fifth production method.

In the fifth production method, at first, as shown in FIG. 33, a plurality (for example, four) of ceramic green sheets 50A to 50D each of which is formed with a window 54 for forming at least the space between the thin plate sections 12a, 12b, and a plurality (for example, seven) ceramic green sheets 102A to 102G each of which is continuously formed with a window 54 for forming the space between the thin plate sections 12a, 12b and a window 100 for forming the movable sections 20a, 20b having the mutually opposing end surfaces 34a, 34b are prepared.

Figure 34:
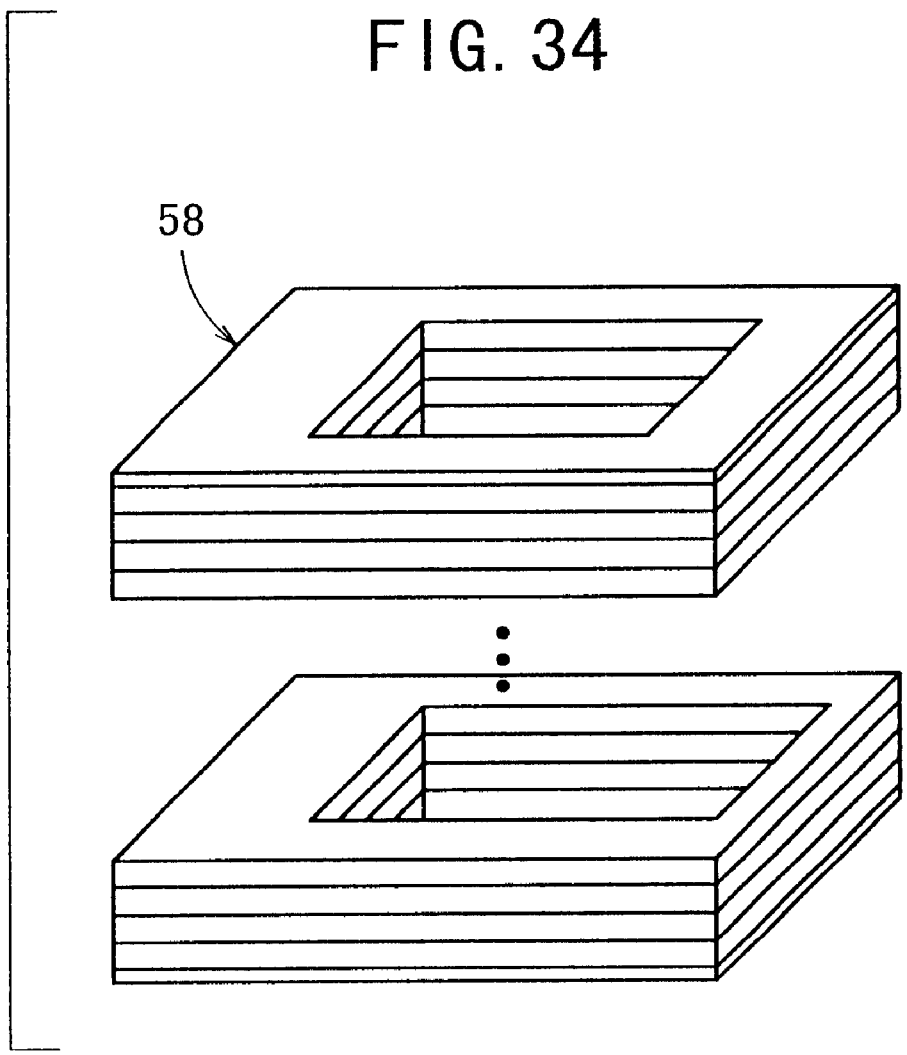
FIG. 34 illustrates a state in the fifth production method in which a ceramic green laminate is formed.
Figure 35:
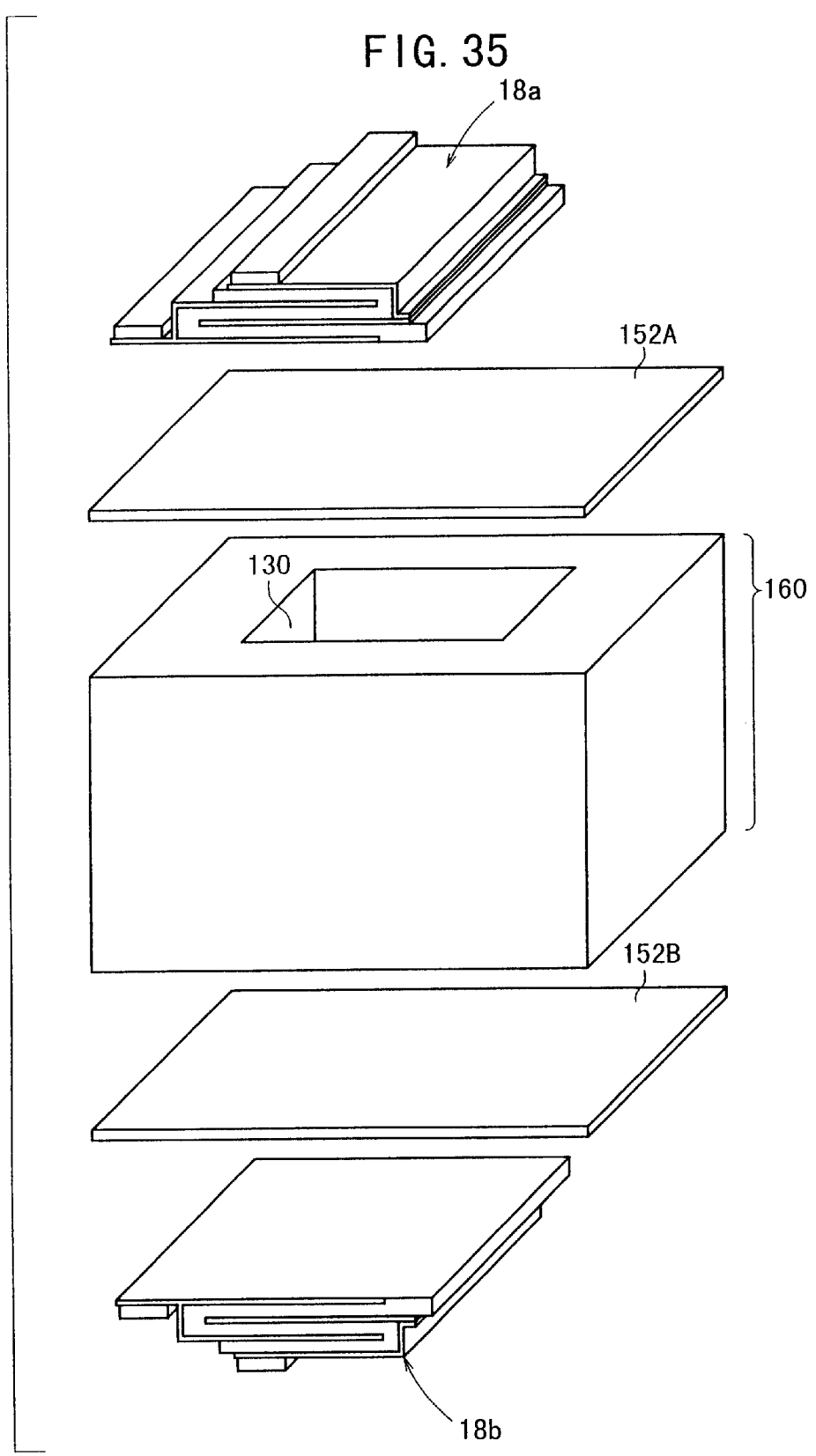
FIG. 35 illustrates a state in the fifth production method in which the ceramic green laminate is sintered into a ceramic laminate.

After that, as shown in FIG. 34, the ceramic green sheets 50A to 50D, 102A to 102G are laminated and secured under pressure to form a ceramic green laminate 158. The lamination is performed while the ceramic green sheets 102A to 102G are positioned at the center. After that, as shown in FIG. 35, the ceramic green laminate 158 is sintered to obtain a ceramic laminate 160. At this stage, the ceramic laminate 160 is formed such that the hole 130 is formed by the windows 54, 100.

Figure 36:
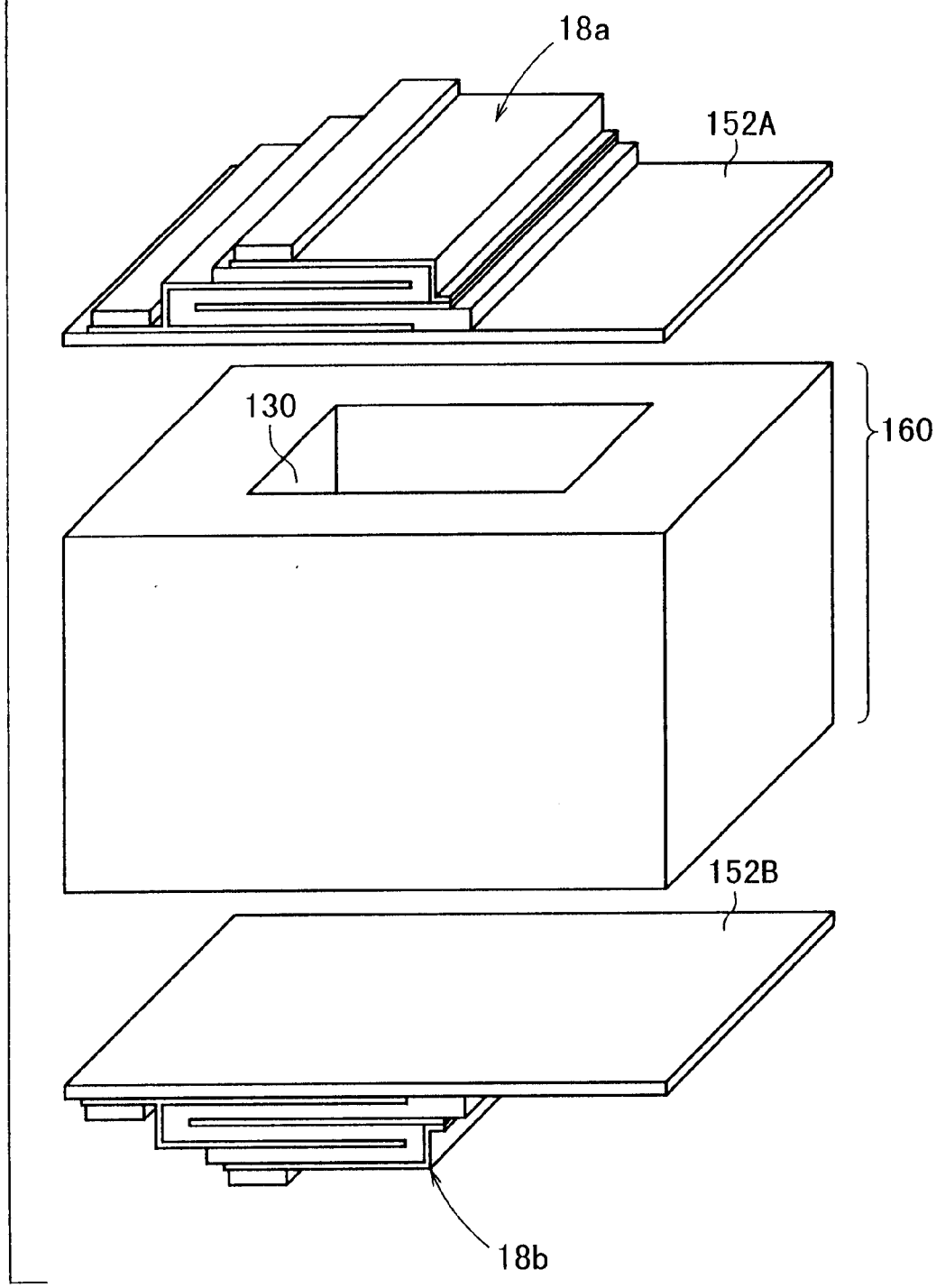
FIG. 36 illustrates a state in the fifth production method in which piezoelectric/electrostrictive elements, which are constructed as separate members, are bonded to surfaces of metal plates to serve as thin plate sections respectively.

Subsequently, as shown in FIG. 36, the piezoelectric/electrostrictive elements 18a, 18b, which are constructed as separate members, are respectively bonded with an epoxy adhesive to the surfaces of metal plates 152A, 152B to serve as the thin plate sections 12a, 12b. The separate members of the piezoelectric/electrostrictive elements 18a, 18b can be formed, for example, in accordance with the ceramic green sheet-laminating method.

Subsequently, the metal plates 152A, 152B are bonded to the ceramic laminate 160 with the epoxy adhesive so that the ceramic laminate 160 is interposed between the metal plates 152A, 152B and the hole 130 is closed thereby to provide a hybrid laminate 162 (see FIG. 37).

Figure 37:
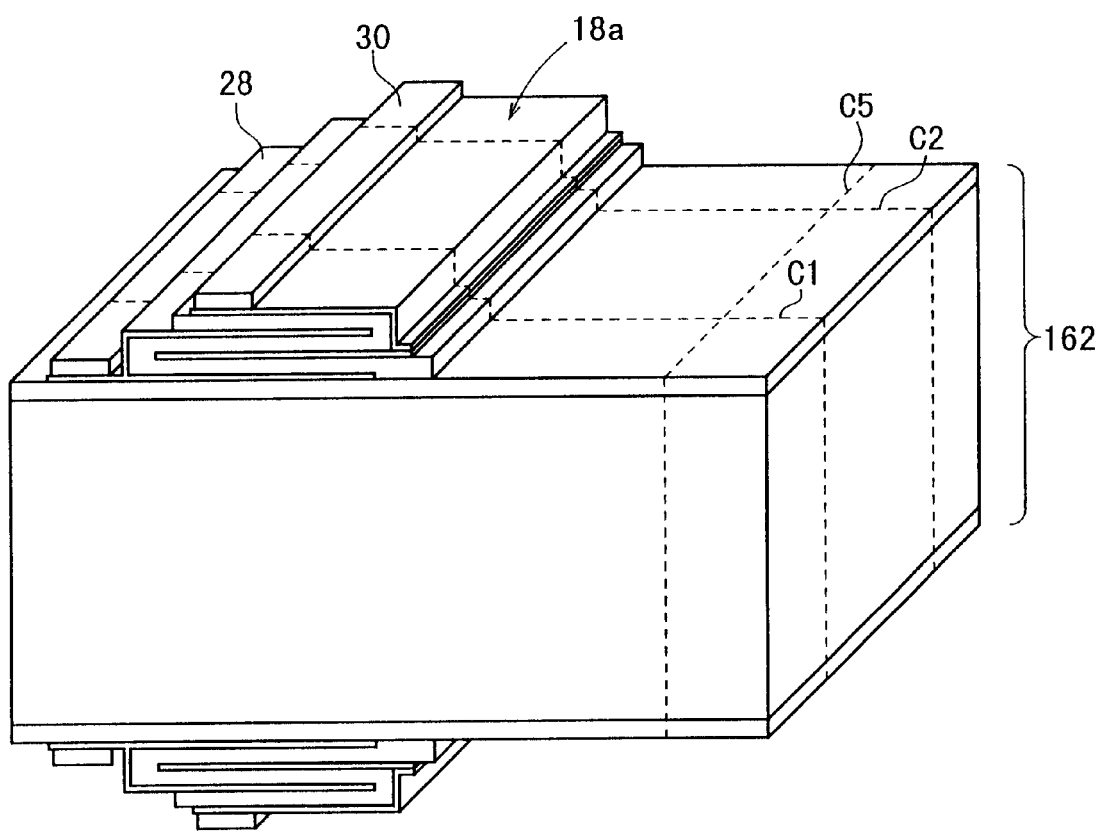
FIG. 37 illustrates a state in the fifth production method in which the metal plate is bonded to the ceramic laminate to provide a hybrid laminate.
Figure 38:
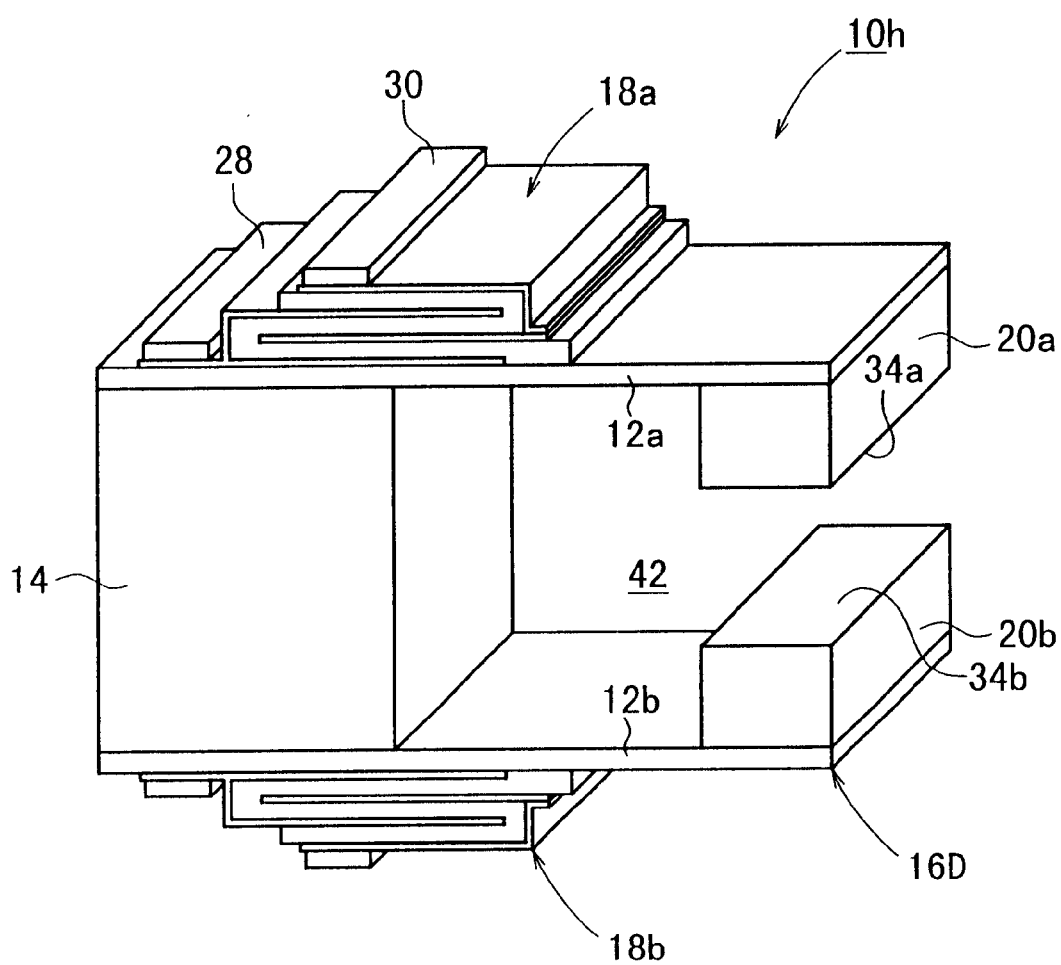
FIG. 38 illustrates a state in the fifth production method in which the hybrid laminate is cut along predetermined cutting lines to provide a piezoelectric/electrostrictive device according to an eighth modified embodiment.

Subsequently, as shown in FIG. 37, the hybrid laminate 162, which is formed with the piezoelectric/electrostrictive elements 18a, 18b, is cut along cutting lines C1, C2, C5 to thereby cut off side portions and forward end portions of the hybrid laminate 162. As a result of the cutoff, as shown in FIG. 38, the piezoelectric/electrostrictive device 10h according to the eighth modified embodiment is obtained, in which the piezoelectric/electrostrictive elements 18a, 18b are formed on the thin plate sections 12a, 12b constituted by the metal plates, of the substrate 16D, and the movable sections 20a, 20b having the mutually opposing end surfaces 34a, 34b are formed.

Figure 39:
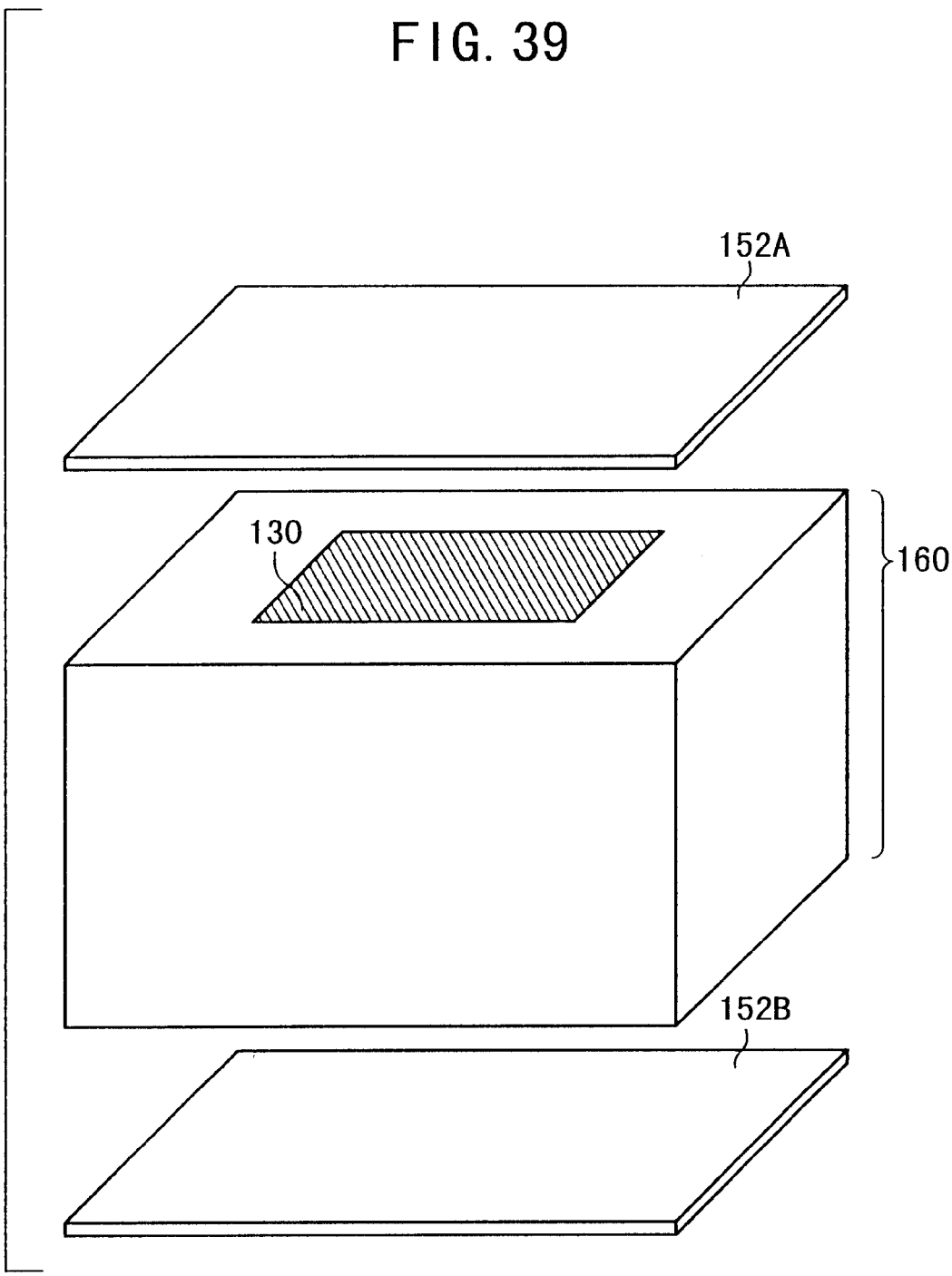
FIG. 39 illustrates a state in a sixth production method in which a ceramic green laminate is sintered into a ceramic laminate, and then a hole is filled with a filler material.

On the other hand, in the sixth production method, at first, as shown in FIG. 34, ceramic green sheets 50A to 50D, 102A to 102G are laminated and secured under pressure to form a ceramic green laminate 158. After that, the ceramic green laminate 158 is sintered to obtain a ceramic laminate 160 as shown in FIG. 39. At this stage, the ceramic laminate 160 is formed such that the hole 130 is formed by the windows 54, 100.

Figure 40:
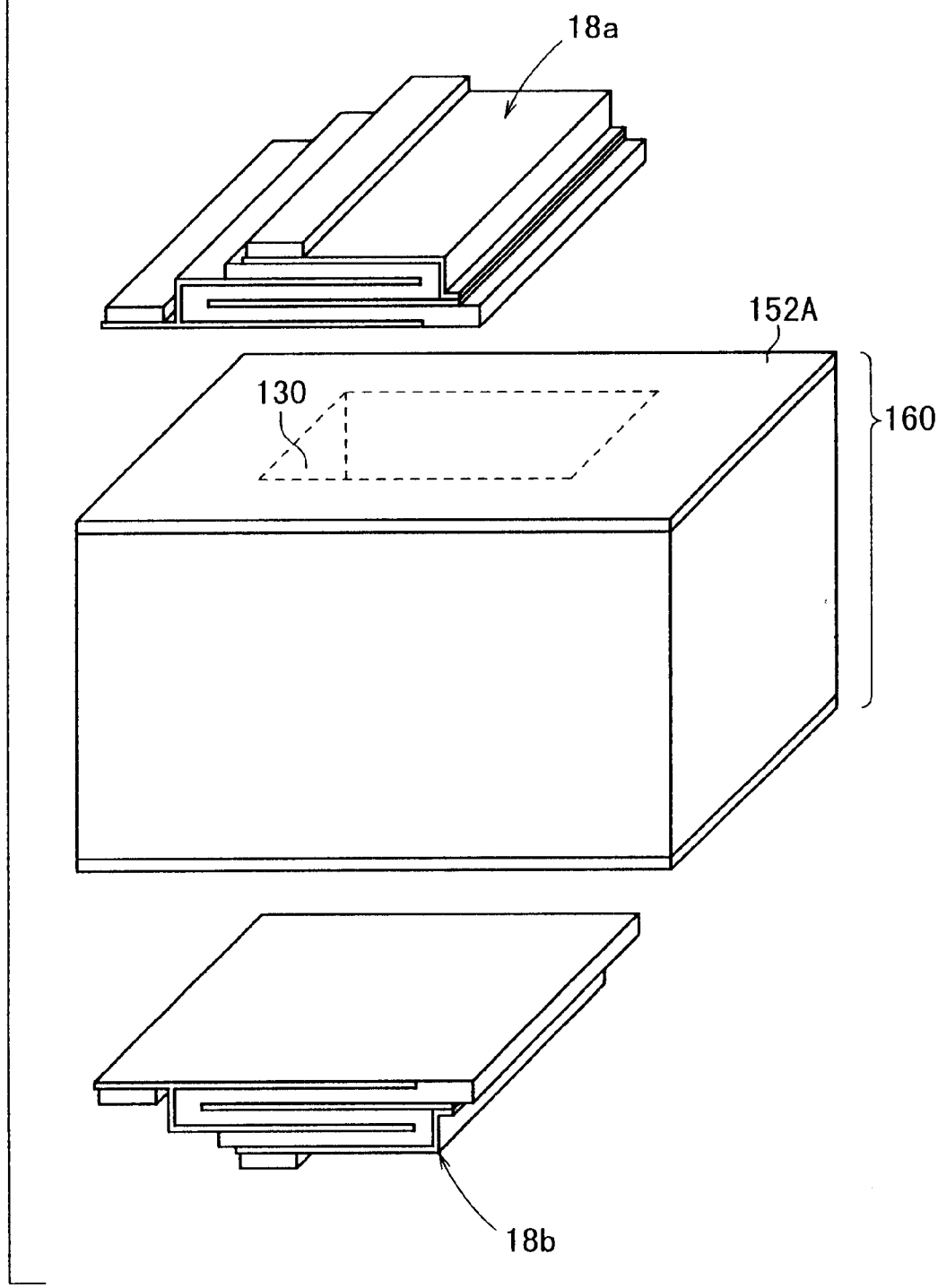
FIG. 40 illustrates a state in the sixth production method in which the metal plates to serve as thin plate sections respectively are bonded to the ceramic laminate to provide a hybrid laminate.

Subsequently, as shown in FIG. 40, the metal plates 152A, 152B are bonded to the ceramic laminate 160 with an epoxy adhesive so that the ceramic laminate 160 is interposed between the metal plates 152A, 152B and the hole 130 is closed thereby to provide a hybrid laminate 162. In this procedure, when the piezoelectric/electrostrictive elements 18a, 18b are stuck to the surfaces of the bonded metal plates 152A, 152B, the hole 130 is optionally filled with a filler material 164 as shown in FIG. 39 so that a sufficient bonding pressure may be applied.

It is necessary to finally remove the filler material 164. Therefore, it is preferable to use a hard material which is easily dissolved in a solvent or the like. The material includes, for example, organic resin, wax, and brazing filler material. It is also possible to adopt a material obtained by mixing ceramic powder as a filler with organic resin such as acrylic.

Subsequently, as shown in FIG. 40, the piezoelectric/electrostrictive elements 18a, 18b, which are constructed as separate members, are bonded with an epoxy adhesive to the surfaces of the metal plates 152A, 152B of the hybrid laminate 162. The separate members of the piezoelectric/electrostrictive elements 18a, 18b can be formed, for example, in accordance with the ceramic green sheet-laminating method.

Subsequently, the same steps as those illustrated in FIGS. 37 and 38 are performed as described above to obtain the piezoelectric/electrostrictive device 10h according to the eighth modified embodiment in which the piezoelectric/electrostrictive elements 18a, 18b are formed on the thin plate sections 12a, 12b constituted by the metal plates 152A, 152B, of the substrate 16D, and the movable sections 20a, 20b having the mutually opposing end surfaces 34a, 34b are formed.

When all of the substrate 16D is made of metal, for example, the portions corresponding to the ceramic laminate 160 shown in FIG. 35 are formed by means of molding. Further, thin metal materials may be laminated to form the substrate 16D in accordance with the cladding method.

The piezoelectric/electrostrictive device described above can be utilized as the active device including, for example, various transducers, various actuators, frequency region functional parts (filters), transformers, vibrators, resonators, oscillators, and discriminators for the communication and the power generation, as well as the sensor element for various sensors including, for example, ultrasonic sensors, acceleration sensors, angular velocity sensors, shock sensors, and mass sensors. Especially, the piezoelectric/electrostrictive device described above can be preferably utilized for various actuators to be used for the mechanism for adjusting the displacement and the positioning and for adjusting the angle for various precision parts such as those of optical instruments and precision mechanical equipments.

It is a matter of course that the piezoelectric/electrostrictive device and the method for producing the same according to the present invention are not limited to the embodiments described above, which may be embodied in other various forms without deviating from the gist or essential characteristics of the present invention.

What is claimed is:

1. A piezoelectric/electrostrictive device comprising:

a pair of mutually opposing thin plate sections and a fixation section for supporting said thin plate sections;

movable sections provided at first end portions of said pair of thin plate sections; and one or more piezoelectric/electrostrictive elements arranged on at least one thin plate section of said pair of thin plate sections, wherein:

any one of said movable sections and said fixation section has mutually opposing end surfaces; and a distance between said end surfaces is not less than a length of said movable sections.

2. The piezoelectric/electrostrictive device according to claim 1, wherein:

any one of said movable sections and said fixation section has a cutoff section; and a part of said cutoff section constitutes said mutually opposing end surfaces.

3. The piezoelectric/electrostrictive device according to claim 1, wherein said thin plate sections, said movable sections, and said fixation section are composed of a ceramic substrate integrated into one unit by co-firing a ceramic green laminate and cutting off unnecessary portions.

4. The piezoelectric/electrostrictive device according to claim 3, wherein said piezoelectric/electrostrictive element has a film-shaped configuration, and is integrated with said ceramic substrate by means of sintering.

5. The piezoelectric/electrostrictive device according to claim 1, wherein a gap is formed between said mutually opposing end surfaces.

6. The piezoelectric/electrostrictive device according to claim 1, wherein:

a member which has substantially the same composition as a constitutive member of any one of said movable sections and said fixation section, or a plurality of members which are compositionally different therefrom are interposed between said mutually opposing end surfaces; and an area of a surface of said member opposed to said end surface is substantially the same as an area of said end surface.

7. The piezoelectric/electrostrictive device according to claim 1, wherein said device has such a structure that internal residual stress, which has been generated in at least one of said thin plate sections and said piezoelectric/electrostrictive element during production, is released by forming said mutually opposing end surfaces.

8. The piezoelectric/electrostrictive device according to claim 1, wherein said piezoelectric/electrostrictive element has a piezoelectric/electrostrictive layer and a pair of electrodes formed on said piezoelectric/electrostrictive layer.

9. The piezoelectric/electrostrictive device according to claim 8, wherein said piezoelectric/electrostrictive element is constructed in a stacked form comprising a plurality of units each including said piezoelectric/electrostrictive layer and said pair of electrodes.

10. A piezoelectric/electrostrictive device comprising:

a pair of mutually opposing thin plate sections and a fixation section for supporting said thin plate sections;

movable sections provided at first end portions of said pair of thin plate sections; and one or more piezoelectric/electrostrictive elements arranged on at least one thin plate section of said pair of thin plate sections, wherein:

any one of said movable sections and said fixation section has mutually opposing end surfaces;

a distance between said end surfaces is not less than a length of said movable sections;

a plurality of members which are compositionally different from a constitutive member of any one of said movable sections and said fixation section are interposed between said mutually opposing end surfaces, at least one of said plurality of members being organic resin; and an area of a surface of said member opposed to said end surface is substantially the same as an area of said end surface.

11. A piezoelectric/electrostrictive device comprising:

a pair of mutually opposing thin plate sections and a fixation section for supporting said thin plate sections;

movable sections provided at first end portions of said pair of thin plate sections; and one or more piezoelectric/electrostrictive elements arranged on at least one thin plate section of said pair of thin plate sections, wherein:

any one of said movable sections and said fixation section has mutually opposing end surfaces;

a distance between said end surfaces is not less than a length of said movable sections;

a member which has substantially the same composition as a constitutive member of any one of said movable sections and said fixation section, or a plurality of members which are compositionally different therefrom are interposed between said mutually opposing end surfaces;

an area of a surface of said member opposed to said end surface is substantially the same as an area of said end surface; and a hole, which is formed by both inner walls of said pair of thin plate sections, inner walls of said movable sections, inner walls of said plurality of members, and an inner wall of said fixation section, is filled with a gel material.

12. A piezoelectric/electrostrictive device comprising:

a pair of mutually opposing thin plate sections and a fixation section for supporting said thin plate sections;

movable sections provided at first end portions of said pair of thin plate sections; and one or more piezoelectric/electrostrictive elements arranged on at least one thin plate section of said pair of thin plate sections, wherein:

any one of said movable sections and said fixation section has mutually opposing end surfaces;

a distance between said end surfaces is not less than a length of each of said movable sections; and at least a portion of said one or more piezoelectric/electrostrictive elements is arranged on only one of said fixation section and said movable sections.

* * * * *

UNITED STATES PATENT AND TRADEMARK OFFICE
CERTIFICATE OF CORRECTION

PATENT NO. : 6,534,898 B1
DATED : March 18, 2003
INVENTOR(S) : Yukihisa Takeuchi et al.

It is certified that error appears in the above-identified patent and that said Letters Patent is hereby corrected as shown below:

<u>Title page, Item [54] and Column 1, lines 1-3,</u>
Please change "PIEZOELECTRIC/ELECTROSTRICTIVE DEVICE HAVING MUTUALLY OPPOSING THIN PLATE SECTION" to
-- PIEZOELECTRIC/ELECTROSTRICTIVE DEVICE HAVING MUTUALLY OPPOSING THIN PLATE SECTIONS --

Item [75], please change "Yukihisa Takeuchi, Nishikano-gun..." to
-- Yukihisa Takeuchi, Hishikamo-gun... --

Signed and Sealed this

Nineteenth Day of August, 2003

JAMES E. ROGAN
*Director of the United States Patent and Trademark Office*

UNITED STATES PATENT AND TRADEMARK OFFICE
CERTIFICATE OF CORRECTION

PATENT NO.     : 6,534,898 B1
DATED          : March 18, 2003
INVENTOR(S)    : Yukihisa Takeuchi et al.

It is certified that error appears in the above-identified patent and that said Letters Patent is hereby corrected as shown below:

<u>Title page, Item [54] and Column 1, lines 1-3,</u>
Please change "PIEZOELECTRIC/ELECTROSTRICTIVE DEVICE HAVING MUTUALLY OPPOSING THIN PLATE SECTION" to
-- PIEZOELECTRIC/ELECTROSTRICTIVE DEVICE HAVING MUTUALLY OPPOSING THIN PLATE SECTIONS --

<u>Title page,</u>
Item [75], Inventors, please change "Yukihisa Takeuchi, Nishikano-gun..." to --
Yukihisa Takeuchi, Nishikamo-gun... --

This certificate supersedes Certificate of Correction issued August 19, 2003.

Signed and Sealed this

Twenty-seventh Day of July, 2004

JON W. DUDAS
*Acting Director of the United States Patent and Trademark Office*